(12) United States Patent
Shiota et al.

(10) Patent No.: US 9,244,346 B2
(45) Date of Patent: Jan. 26, 2016

(54) NEGATIVE-TYPE PHOTOSENSITIVE RESIN COMPOSITION, PATTERN FORMING METHOD, CURED FILM, INSULATING FILM, COLOR FILTER, AND DISPLAY DEVICE

(75) Inventors: Dai Shiota, Kawasaki (JP); Mayumi Kuroko, Kawasaki (JP); Kunihiro Noda, Kawasaki (JP); Yoshinori Tadokoro, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/127,868

(22) PCT Filed: Jun. 15, 2012

(86) PCT No.: PCT/JP2012/065307
§ 371 (c)(1),
(2), (4) Date: Apr. 3, 2014

(87) PCT Pub. No.: WO2012/176694
PCT Pub. Date: Dec. 27, 2012

(65) Prior Publication Data
US 2014/0231729 A1 Aug. 21, 2014

(30) Foreign Application Priority Data
Jun. 24, 2011 (JP) ................. 2011-141227

(51) Int. Cl.
*G02B 5/23* (2006.01)
*G03F 7/00* (2006.01)
*G03F 7/027* (2006.01)
*C09B 23/14* (2006.01)
*G03F 7/032* (2006.01)
*G03F 7/033* (2006.01)
*G03F 7/035* (2006.01)
*G03F 7/038* (2006.01)
*G03F 7/085* (2006.01)
*G03F 7/105* (2006.01)
*B82Y 10/00* (2011.01)
*B82Y 40/00* (2011.01)
*G03F 1/00* (2012.01)
*G02B 5/22* (2006.01)

(52) U.S. Cl.
CPC ............. *G03F 7/027* (2013.01); *B82Y 10/00* (2013.01); *B82Y 40/00* (2013.01); *C09B 23/143* (2013.01); *G03F 7/0002* (2013.01); *G03F 7/0007* (2013.01); *G03F 7/032* (2013.01); *G03F 7/033* (2013.01); *G03F 7/035* (2013.01); *G03F 7/038* (2013.01); *G03F 7/0388* (2013.01); *G03F 7/085* (2013.01); *G03F 7/105* (2013.01); *G02B 5/223* (2013.01)

(58) Field of Classification Search
USPC ............ 252/586; 430/9, 270.1, 280.1, 283.1, 430/311, 325, 330, 919, 920, 923, 7; 544/176; 546/14, 207, 214, 226, 314; 548/269, 270, 271, 272, 273, 334.1; 558/166, 170, 314; 564/334.1, 166, 564/170
See application file for complete search history.

(56) References Cited

U.S. PATENT DOCUMENTS

| 4,931,471 A | 6/1990 | Jung et al. |
| 8,476,444 B2 | 7/2013 | Katayama et al. |
| 8,697,332 B2 * | 4/2014 | Katayama et al. ......... 430/270.1 |

(Continued)

FOREIGN PATENT DOCUMENTS

| JP | H02-275453 | 11/1990 |
| JP | H08-127572 | 5/1996 |

(Continued)

OTHER PUBLICATIONS

Extended European Search Report in EP Application No. 12803395.8, mailed Feb. 4, 2015.

(Continued)

*Primary Examiner* — Bijan Ahvazi
(74) *Attorney, Agent, or Firm* — Knobbe Martens Olson & Bear LLP

(57) ABSTRACT

A negative-type photosensitive resin composition capable of forming a pattern having favorable adhesiveness at a low light exposure; a pattern forming method using the resin composition; a cured film, an insulating film, a color filter formed using resin composition; and a display device provided with the cured film, insulating film, or color filter. The resin composition contains a compound represented by the following formula (1). In the formula, $R^1$ and $R^2$ each independently indicate a hydrogen atom or an organic group, but at least one indicates an organic group. $R^1$ and $R^2$ may be bonded to form a ring structure and may contain a hetero atom bond. $R^3$ indicates a single bond or an organic group. $R^4$ to $R^9$ each independently indicate a hydrogen atom, an organic group, etc., but $R^6$ and $R^7$ are never hydroxyl groups. $R^{10}$ indicates a hydrogen atom or an organic group.

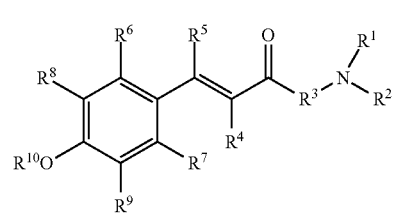

(1)

14 Claims, No Drawings

(56) References Cited

U.S. PATENT DOCUMENTS

| | | |
|---|---|---|
| 8,778,596 B2 | 7/2014 | Katayama et al. |
| 2010/0196824 A1* | 8/2010 | Kim et al. ............... 430/285.1 |
| 2011/0086311 A1 | 4/2011 | Katayama et al. |
| 2012/0070781 A1 | 3/2012 | Katayama et al. |
| 2013/0309607 A1 | 11/2013 | Katayama et al. |

FOREIGN PATENT DOCUMENTS

| | | | |
|---|---|---|---|
| JP | 2000-035670 | | 2/2000 |
| JP | 2009-080452 A | | 4/2009 |
| JP | 2010-106233 A | | 5/2010 |
| JP | 2011-052214 | | 3/2011 |
| JP | 2011-095635 | * | 5/2011 .............. G03F 7/004 |
| WO | WO 2010/113813 A1 | | 10/2010 |

OTHER PUBLICATIONS

Barton et al.; "Some Condensation Reactions between Aromatic Aldehydes and 1,1-Bisdialkylaminooalkenes and Related Compounds"; J. Chem. Soc., 1969, pp. 16-22.

Office Action in U.S. Appl. No. 14/127,907, mailed Aug. 18, 2015.

* cited by examiner

NEGATIVE-TYPE PHOTOSENSITIVE RESIN COMPOSITION, PATTERN FORMING METHOD, CURED FILM, INSULATING FILM, COLOR FILTER, AND DISPLAY DEVICE

This application is the U.S. National Phase under 35 U.S.C. §371 of International Application PCT/JP2012/065307, filed Jun. 15, 2012, designating the U.S., and published in Japanese as WO 2012/176694 on Dec. 27, 2012, which claims priority to Japanese Patent Application No. 2011-141227, filed Jun. 24, 2011, the entire contents of which are incorporated herein by reference.

TECHNICAL FIELD

The present invention relates to a negative-type photosensitive resin composition; a pattern forming method using the negative-type photosensitive resin composition; a cured film, an insulating film, and a color filter formed using the negative-type photosensitive resin composition; and a display device provided with the cured film, insulating film or color filter.

BACKGROUND ART

A negative-type photosensitive resin composition has a property of being cured by irradiation of an electromagnetic wave such as an ultraviolet ray. Since it is possible to obtain a pattern having a desired shape by curing a part of the negative-type photosensitive resin composition through irradiation of the part with an electromagnetic wave, the negative-type photosensitive resin composition has been widely used for various usages such as display devices, semiconductor devices, electronic devices, micro-electromechanical systems (MEMS). For example, in the display device, it is used as a material for a flattened film, an insulating film, a color filter, a black matrix, a spacer, a partition, and the like of a liquid crystal display, an organic EL display, and the like.

In order to ensure reliability of the products, the negative-type photosensitive resin composition is required to have high adhesiveness which enables attaining close contact with a substrate in the case of forming a minute pattern. Accordingly, a negative-type photosensitive resin composition which contains an amine-based silane coupling agent as an adhesion enhancer has been proposed (see Patent Document 1).

[Patent Document 1] Japanese Unexamined Patent Application, Publication No. 2000-035670

[Patent Document 2] Japanese Unexamined Patent Application, Publication No. 2011-052214

DISCLOSURE OF THE INVENTION

Problems to be Solved by the Invention

By the way, from the viewpoint of further improvements in productivity, there has recently been a demand for a negative-type photosensitive resin composition which is capable of forming a pattern having a favorable shape at a low light exposure.

However, in the case where the amine-based silane coupling agent is contained as an adhesion enhancer as in Patent Document 1, there has been a problem that it is necessary to increase light exposure for pattern formation despite the improvement in adhesiveness to the substrate.

The present invention was accomplished in view of the above problem, and an object thereof is to provide a negative-type photosensitive resin composition capable of forming a pattern having favorable adhesiveness at a low light exposure; a pattern forming method using the negative-type photosensitive resin composition; a cured film, an insulating film, and a color filter formed using the negative-type photosensitive resin composition; and a display device provided with the cured film, insulating film, or color filter.

Means for Solving the Problems

The inventors had conducted extensive researches to attain the above-described object. As a result, they had found that it is possible to solve the problem by incorporating a specific compound into a negative-type photosensitive resin composition and thus accomplished the present invention. Specifically, the present invention provides the following.

The first aspect of the present invention is a negative-type photosensitive resin composition comprising a compound represented by the following formula (1).

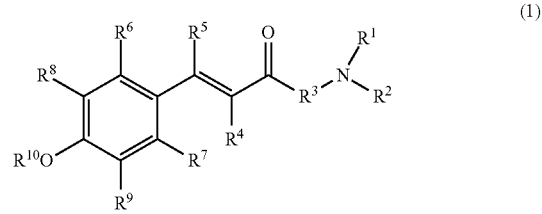

(wherein $R^1$ and $R^2$ each independently indicate a hydrogen atom or an organic group, provided that at least one of $R^1$ and $R^2$ indicates an organic group; $R^1$ and $R^2$ may be bonded to form a ring structure and may contain a hetero atom bond; $R^3$ indicates a single bond or an organic group; $R^4$ and $R^5$ each independently indicate a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group; $R^6$, $R^7$, $R^8$, and $R^9$ each independently indicate a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group, provided that $R^6$ and $R^7$ are never hydroxyl groups; two or more of $R^6$, $R^7$, $R^8$, and $R^9$ may be bonded to form a ring structure and may contain a hetero atom bond; and $R^{10}$ indicates a hydrogen atom or an organic group).

As a compound having a structure similar to that of the compound represented by the above formula (1), a base generator represented by the following formula is disclosed in Patent Document 2. The base generator is cyclized through electromagnetic wave irradiation and heating to form a base $(NHR^{21}R^{22})$.

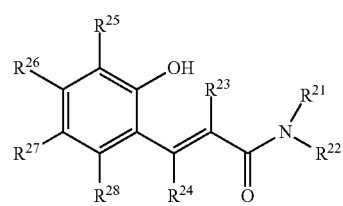

(wherein $R^{21}$ and $R^{22}$ each independently are a hydrogen atom or an organic group and may be the same or different; $R^{21}$ and $R^{22}$ may be bonded to form a ring structure and may contain a hetero atom bond, provided that at least one of $R^{21}$ and $R^{22}$ is an organic group; $R^{23}$ and $R^{24}$ each independently are a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group and may be the same or different, provided that at least one of $R^{23}$ and $R^{24}$ is a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group; $R^{25}$, $R^{26}$, $R^{27}$, and $R^{28}$ each are a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group and may be the same or different; and two or more of $R^{25}$, $R^{26}$, $R^{27}$, and $R^{28}$ may be bonded to form a ring structure and may contain a hetero atom bond.)

However, as a result of the inventors' confirmation, a favorable micropatterning property was not attained by incorporating the base generator described in Patent Document 2 into a negative-type photosensitive resin composition due to consumption of optical energy by the cyclization.

In contrast, the compound represented by the above formula (1) is free from the cyclization reaction since $R^6$ and $R^7$ are never hydroxyl groups and is capable of giving a favorable micropatterning property.

Since the compound represented by the above formula (1) generates a base by electromagnetic wave irradiation or heating, the compound functions also as a base generator. Further, since the compound represented by the above formula (1) attains the effect of enhancing adhesion to a substrate when incorporated into a negative-type photosensitive resin composition, the compound functions also as an adhesion enhancer.

The second aspect of the present invention is a pattern forming method comprising forming a coating film or molded body using the negative-type photosensitive resin composition according to the present invention, irradiating an electromagnetic wave in a predetermined pattern shape onto the coating film or molded body, and performing development.

The third aspect of the present invention is a cured film formed using the negative-type photosensitive resin composition according to the present invention; the fourth aspect of the present invention is an insulating film formed using the negative-type photosensitive resin composition according to the present invention; the fifth aspect of the present invention is a color filter formed using the negative-type photosensitive resin composition according to the present invention; and the sixth aspect of the present invention is a display device provided with the cured film, insulating film, or color filter according to the present invention.

Effects of the Invention

According to the present invention, it is possible to provide a negative-type photosensitive resin composition capable of forming a pattern having favorable adhesiveness at a low light exposure; a pattern forming method using the negative-type photosensitive resin composition; a cured film, an insulating film, and a color filter formed using the negative-type photosensitive resin composition; and a display device provided with the cured film, insulating film, or color filter.

PREFERRED MODE FOR CARRYING OUT THE INVENTION

Negative-Type Photosensitive Resin Composition
Composition represented by Formula (1)

The negative-type photosensitive resin composition according to the present invention comprises a compound represented by the following formula (1). Below, first, the compound represented by the formula (1) is explained, and next, the negative-type photosensitive resin composition is explained.

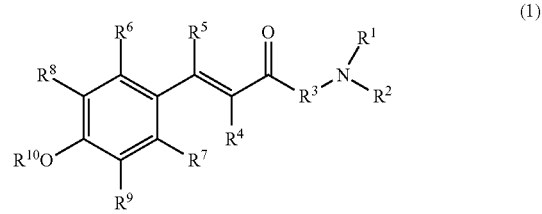

(1)

In the formula (1), $R^1$ and $R^2$ each independently indicate a hydrogen atom or an organic group, but at least one of $R^1$ and $R^2$ indicates an organic group.

Examples of the organic group in $R^1$ and $R^2$ include an alkyl group, an alkenyl group, a cycloalkyl group, a cycloalkenyl group, an aryl group, an aralkyl group, and the like. The organic group may contain in the organic group a bond or a substituent other than those of a hydrocarbon group, such as those of a hetero atom. Also, the organic group may be any one of straight chain, branched chain, and cyclic organic groups.

The organic group ordinarily is monovalent but can be a polyvalent of which a valence is 2 or more in the case of forming the ring structure or the like.

$R^1$ and $R^2$ may be bonded to form a ring structure and may further contain a hetero atom bond. Examples of the ring structure include a heterocycloalkyl group, a heteroaryl group, and the like, and the ring structure may be a condensed ring.

The bond other than hydrocarbon group bond in the organic group of $R^1$ and $R^2$ is not particularly limited insofar as the effects of the present invention are not impaired, and examples thereof include a bond including a hetero atom such as an oxygen atom, a nitrogen atom, and a silicon atom. Specific examples thereof include an ether bond, a thioether bond, a carbonyl bond, a thiocarbonyl bond, an ester bond, an amide bond, a urethane bond, an imino bond (—N=C(—R)—, —C(=NR)—; R indicates a hydrogen atom or an organic group), a carbonate bond, a sulfonyl bond, a sulfinyl bond, an azo bond, and the like.

From the viewpoint of heat resistance, preferred examples of the bond other than hydrocarbon group bond in the organic group of $R^1$ and $R^2$ include an ether bond, a thioether bond, a carbonyl bond, a thiocarbonyl bond, an ester bond, an amide bond, a urethane bond, an imino bond (—N=C(—R)—, —C(=NR)—; R indicates a hydrogen atom or a monovalent organic group), a carbonate bond, a sulfonyl bond, and a sulfinyl bond.

The substituent other than hydrocarbon group in the organic group of $R^1$ and $R^2$ is not particularly limited insofar as the effects of the present invention are not impaired, and examples thereof include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxyl group, a carboxylate group, an acyl group, an acyloxy group, a sulfino group, a sulfo group, a sulfonato group, a phosphino group, a phosphinyl group, a phosphono group, a phosphonato group, a hydroxyimino group, an alkylether group, an alkenylether group, an alkylthioether group, an alkenylthioether group, an arylether group, an arylthioether group, an amino group (—$NH_2$, —NHR, —NRR'; R and R' each independently indicate a hydrocarbon group), and the like. The hydrogen atom contained in the substituent may be substituted with a hydrocarbon group. Also, the hydrocarbon group contained in the substituent may be any one of straight chain, branched chain, and cyclic hydrocarbon groups.

Preferred examples of the substituent other than hydrocarbon group in the organic group of $R^1$ and $R^2$ include a halogen atom, a hydroxyl group, a mercapto group, a sulfide group, a cyano group, an isocyano group, a cyanato group, isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxyl group, a carboxylate group, an acyl group, an acyloxy group, a sulfino group, a sulfo group, a sulfonato group, a phosphino group, a phosphinyl group, a phosphono group, a phosphonato group, a hydroxyimino group, an alkylether group, an alkenylether group, an alkylthioether group, an alkenylthioether group, an arylether group, and an arylthioether group.

Among the above, as $R^1$ and $R^2$, at least one of $R^1$ and $R^2$ is preferably an alkyl group having 1 to 12 carbon atoms or an aryl group having 1 to 12 carbon atoms, or $R^1$ and $R^2$ are preferably bonded to form a heterocycloalkyl group or a heteroaryl group having 2 to 20 carbon atoms. Examples of the heterocycloalkyl group include a piperidino group, a morpholino group, and the like, and examples of the heteroaryl group include an imidazolyl group, a pyrazolyl group, and the like.

In the formula (1), $R^3$ indicates a single bond or an organic group.

Examples of the organic group in $R^3$ include groups each of which is obtainable by removing a hydrogen atom from an alkyl group, an alkenyl group, a cycloalkyl group, a cycloalkenyl group, an aryl group, an aralkyl group, or the like. The organic group may contain a substituent in the organic group. Examples of the substituent include those exemplified in $R^1$ and $R^2$. Also, the organic group may be either one of straight chain or branched chain organic groups.

Among the above, $R^3$ is preferably a single bond or a group obtainable by removing a hydrogen atom from an alkyl group having 1 to 12 carbon atoms or an aryl group having 1 to 12 carbon atoms.

In the formula (1), $R^4$ and $R^5$ each independently indicate a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group.

Examples of the organic group in $R^4$ and $R^5$ include those exemplified in $R^1$ and $R^2$. The organic group may contain in the organic group a bond or a substituent other than those of a hydrocarbon group, such as those of a hetero atom as is the case with $R^1$ and $R^2$. Also, the organic group may be any one of straight chain, branched chain, and cyclic organic groups.

Among the above, $R^4$ and $R^5$ each independently are preferably a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, an alkyl group containing a cyano group and having 2 to 11 carbon atoms, an alkyl group containing a hydroxyl group and having 1 to 10 carbon atoms, an alkoxy group having 1 to 10 carbon atoms, an amide group having 2 to 11 carbon atoms, an alkylthiol group having 1 to 10 carbon atoms, an acyl group having 1 to 10 carbon atoms, an ester group having 2 to 11 carbon atoms (—COOR, —OCOR; R indicates a hydrocarbon group), an aryl group having 6 to 20 carbon atoms, an aryl group substituted with an electron donating group and/or an electron withdrawing group and having 6 to 20 carbon atoms, a benzyl group substituted with an electron donating group and/or an electron withdrawing group, a cyano group, or a methylthio group. More preferably, both of $R^4$ and $R^5$ are hydrogen atoms, or $R^4$ is the methyl group and $R^5$ is the hydrogen atom.

In the formula (1), $R^6$, $R^7$, $R^8$, and $R^9$ each independently indicate a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonia group, or an organic group.

Examples of the organic group in $R^6$, $R^7$, $R^8$, and $R^9$ include those exemplified in $R^1$ and $R^2$. The organic group may contain in the organic group a bond or a substituent other than those of a hydrocarbon group, such as those of a hetero atom as is the case with $R^1$ and $R^2$. Also, the organic group may be any one of straight chain, branched chain, and cyclic organic groups.

In the formula (1), $R^6$ and $R^7$ are never hydroxyl groups. In the case where $R^6$ and $R^7$ are hydroxyl groups, the cyclization reaction occurs due to electromagnetic wave irradiation and heating as is described in Patent Document 2. Therefore, it is impossible to attain a favorable micropatterning property by incorporating such a compound into a negative-type photosensitive resin composition due to consumption of optical energy by the cyclization. In contrast, since $R^6$ and $R^7$ are never hydroxyl groups, the compound represented by the formula (1) is free from the cyclization reaction and enables attaining a favorable micropatterning property when incorporated into a negative-type photosensitive resin composition.

Two or more of $R^6$, $R^7$, $R^8$, and $R^9$ may be bonded to form a ring structure and may contain a hetero atom bond. Examples of the ring structure include a heterocycloalkyl group, a heteroaryl group, and the like, and the ring structure may be a condensed ring. For example, two or more of $R^6$, $R^7$, $R^8$, and $R^9$ may be bonded to form a condensed ring such as naphthalene, anthracene, phenanthrene, indene, or the like by sharing an atom of a benzene ring to which $R^6$, $R^7$, $R^8$, and $R^9$ are bonded.

Among the above, $R^6$, $R^7$, $R^8$, and $R^9$ each independently are preferably a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, an alkyl group containing a cyano group and having 2 to 11 carbon atoms, an alkyl group containing a hydroxyl group and having 1 to 10 carbon atoms, an alkoxy group having 1 to 10 carbon atoms, an amide group having 2 to 11 carbon atoms, an alkylthiol group having 1 to 10 carbon atoms, an acyl group having 1 to 10 carbon atoms, an ester group having 2 to 11 carbon atoms, an aryl group having 6 to 20 carbon atoms, an aryl group substituted with an electron donating group and/or an electron withdrawing group and having 6 to 20 carbon atoms, a benzyl group substituted with an electron donating group and/or an electron withdrawing group, a cyano group, a methylthio group, or a nitro group.

Also, as $R^6$, $R^7$, $R^8$, and $R^9$, it is preferable that two or more of $R^6$, $R^7$, $R^8$, and $R^9$ are bonded to form a condensed ring such as naphthalene, anthracene, phenanthrene, and indene by sharing an atom of a benzene ring to which $R^6$, $R^7$, $R^8$, and $R^9$ are bonded from the viewpoint of the absorption wavelength becoming a long wavelength.

More preferably, all of $R^6$, $R^7$, $R^8$, and $R^9$ are hydrogen atoms, or any one of $R^6$, $R^7$, $R^8$, and $R^9$ is the nitro group with the rest being hydrogen atoms.

In the formula (1), $R^{10}$ indicates a hydrogen atom or an organic group.

Examples of the organic group in $R^{10}$ include those exemplified in $R^1$ and $R^2$. The organic group may contain in the organic group a bond or a substituent other than those of a hydrocarbon group, such as those of a hetero atom as is the case with $R^1$ and $R^2$. Also, the organic group may be any one of straight chain, branched chain, and cyclic organic groups.

Since the compound represented by the formula (1) has a —$OR^{10}$ group at a para position of a benzene ring, solubility thereof into an organic solvent is favorable.

Among the above, $R^{10}$ is preferably a hydrogen atom or an alkyl group having 1 to 12 carbon atoms, more preferably a methyl group.

Among the compounds represented by the formula (1), particularly preferred examples include those represented by the following formulas.

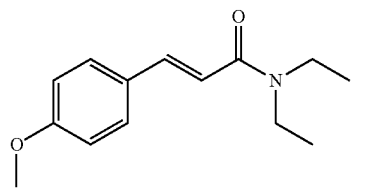

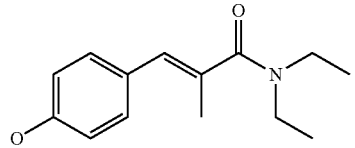

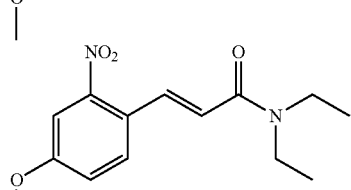

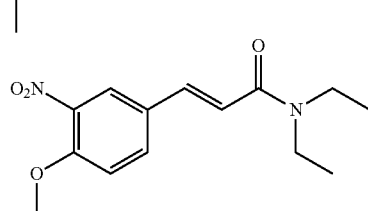

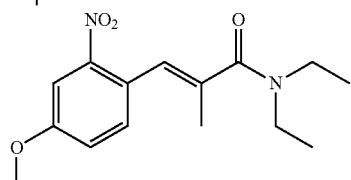

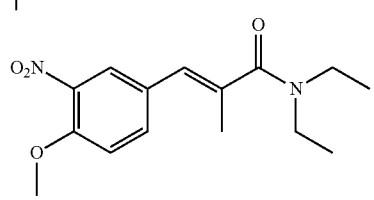

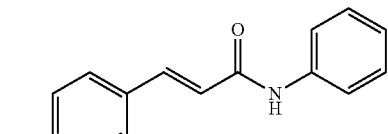

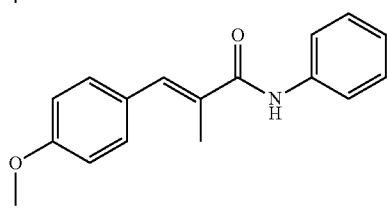

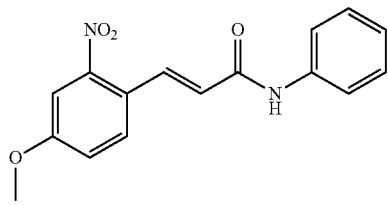

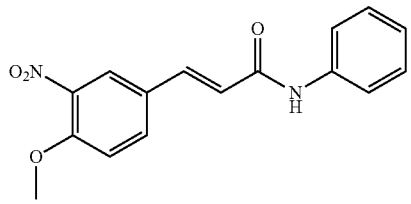

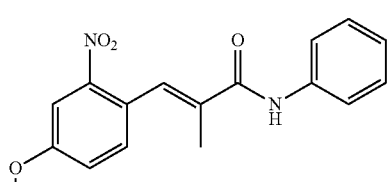

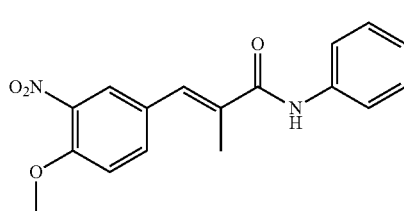

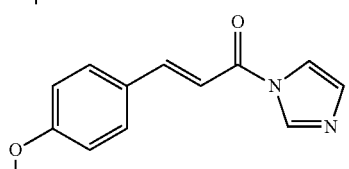

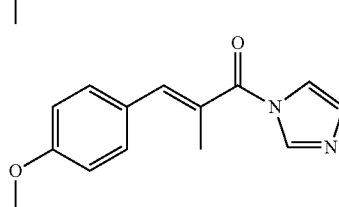

-continued

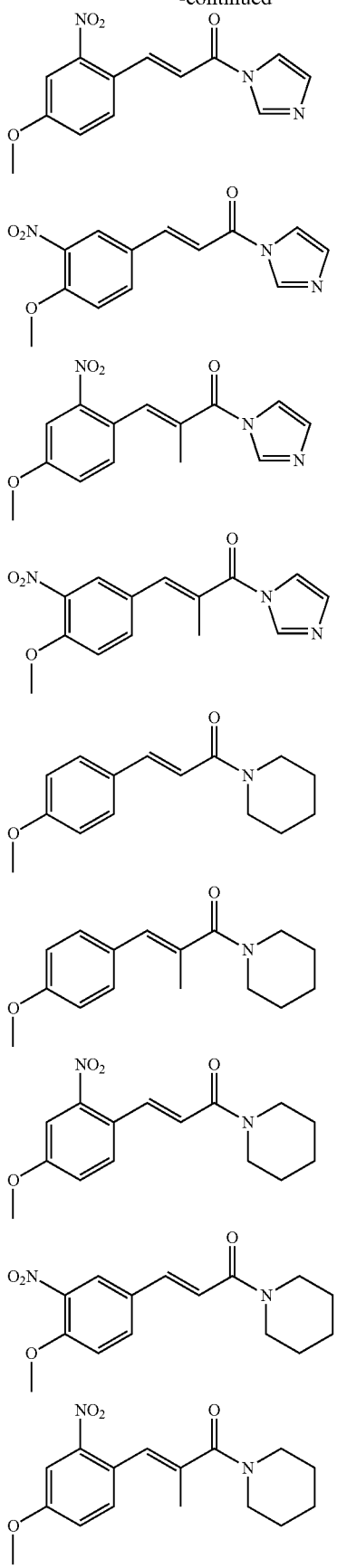

-continued

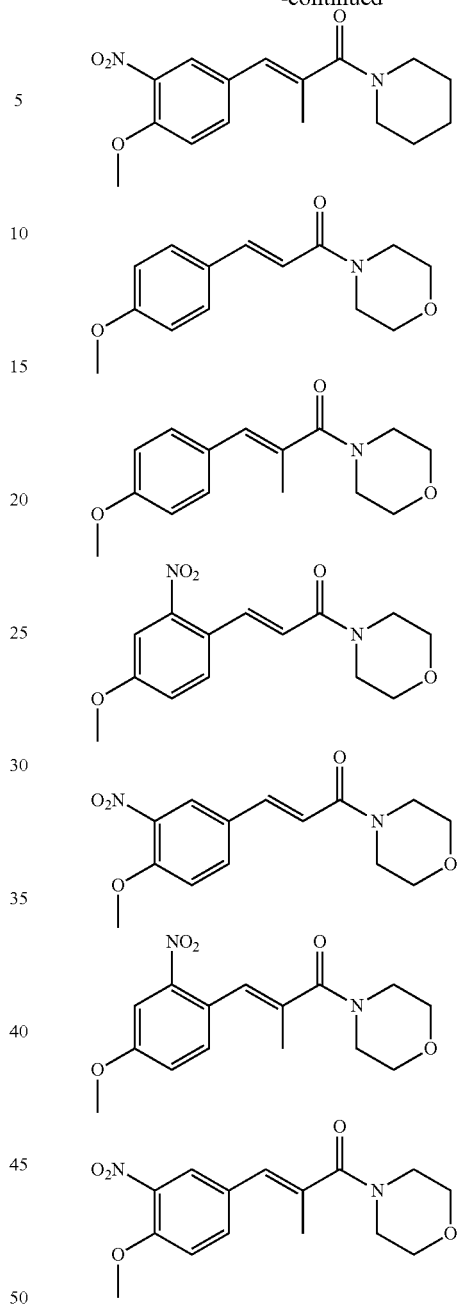

The compounds represented by the formula (1) have the favorable solubility into organic solvents and is capable of attaining a favorable micropatterning property when contained in the negative-type photosensitive resin composition.

Further, the compounds may be synthesized as in the Examples described later.

Negative-Type Photosensitive Resin Composition

As the negative-type photosensitive resin composition according to the present invention, that obtainable by adding a compound represented by the formula (1) to a conventionally known negative-type photosensitive resin composition can be used without particular limitations. Below, specific examples of the negative-type photosensitive resin composition according to the present invention are explained.

Further, while not limited to the following specific examples, the negative-type photosensitive resin composition preferably comprises the compound represented by the formula (1), an alkali-soluble resin, a photopolymerization initiator, and an organic solvent. If necessary, a photopolymerizable monomer may be used.

It is preferable that a resin selected from the group consisting of a resin having a cardo structure, a resin having a phenolic hydroxyl group, a polyimide resin, and an epoxy resin is contained as the alkali-soluble resin. The details of the photopolymerization initiator, organic solvent, and photopolymerizable monomer are also explained in the negative-type photosensitive resin compositions of the first to seventh embodiments described later.

(1) Negative-Type Photosensitive Resin Composition of the First Embodiment

The negative-type photosensitive resin composition of the first embodiment comprises an alkali-soluble resin, a photopolymerizable monomer, a photopolymerization initiator, a compound represented by the formula (1), and an organic solvent.

As the alkali-soluble resin in the negative-type photosensitive resin composition of the first embodiment, conventionally known alkali-soluble resins are usable without particular limitation. The alkali-soluble resin may be the one which has an ethylenic unsaturated group or the one which does not have any ethylenic unsaturated group.

In the present specification, the term "alkali-soluble resin" means that, in the case where a resin film having a film thickness of 1 μm is formed on a substrate by using a resin solution (solvent: propylene glycol monomethyl ether acetate) having a resin concentration of 20 mass %, a film thickness of 0.01 μm or more is dissolved when the substrate is immersed in a 2.38 mass % tetramethylammonium hydroxide (TMAH) aqueous solution for 1 minute.

As the alkali-soluble resin having ethylenic unsaturated group, for example, resins obtainable by causing a reaction of a reaction product of an epoxy compound and unsaturated carboxylic acid with a polybasic acid anhydride are usable.

Among them, the resin represented by the following formula (a-1) is preferred. The resin represented by the formula (a-1) is preferred since the resin itself has high photo-curability.

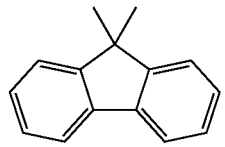

(a-3)

Also, in the formula (a-1), $Y^a$ indicates a residue obtainable by removing an acid anhydride group (—CO—O—CO—) from dicarboxylic anhydride. Examples of the dicarboxylic anhydride include maleic anhydride, succinic anhydride, itaconic anhydride, phthalic anhydride, tetrahydrophthalic anhydride, hexahydrophthalic anhydride, methylendomethylenetetrahydrophthalic anhydride, chlorendic anhydride, methyltetrahydrophthalic anhydride, anhydrous glutaric acid, and the like.

In the formula (a-1), $Z^a$ indicates a residue obtainable by removing 2 acid anhydride groups from tetracarboxylic acid dianhydride. Examples of the tetracarboxylic acid dianhydride include pyromellitic dianhydride, benzophenonetetracarboxylic dianhydride, biphenyltetracarboxylic dianhydride, biphenylethertetracarboxylic dianhydride, and the like.

In the formula (a-1), m indicates an integer of 0 to 20.

As the alkali-soluble resin having ethylenic unsaturated group, polyester(meth)acrylate obtainable by causing a reaction of a polyester prepolymer obtained by condensation of polyvalent alcohols with monobasic acid or polybasic acid with (meth)acrylic acid; polyurethane(meth)acrylate obtainable by causing a reaction of polyol with a compound having 2 isocyanate groups and then performing a reaction with (meth)acrylic acid; an epoxy(meth)acrylate resin obtainable by causing a reaction of an epoxy resin such as a bisphenol A-type epoxy resin, a bisphenol F-type epoxy resin, a bisphenol S-type epoxy resin, a phenol or cresol novolac-type epoxy resin, a resol-type epoxy resin, a triphenolmethane-type epoxy resin, polycarboxylic acid polyglycidyl ester, polyol polyglycidyl ester, an aliphatic or alicyclic epoxy resin, an

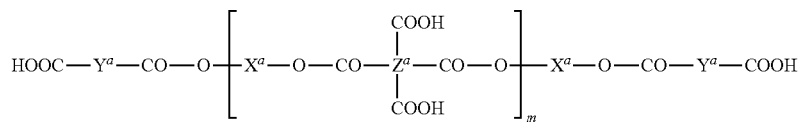

(a-1)

In the above formula (a-1), $X^a$ indicates a group represented by the following formula (a-2).

amine epoxy resin, and a dihydroxybenzene-type epoxy resin with (meth)acrylic acid may be used.

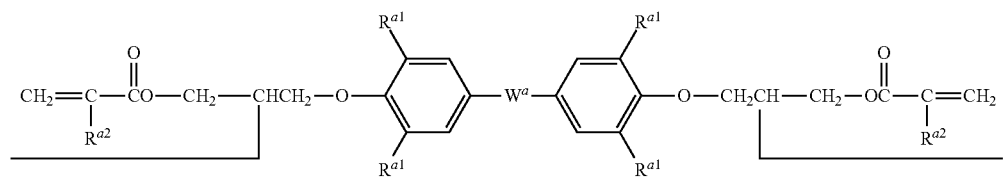

(a-2)

In the above formula (a-2), $R^{a1}$ each independently indicates a hydrogen atom, a hydrocarbon group having 1 to 6 carbon atoms, or a halogen atom; $R^{a2}$ each independently indicates a hydrogen atom or a methyl group; and $W^a$ indicates a single bond or a group represented by the following formula (a-3).

In the present specification, the term "(meth)acrylic acid" means both of acrylic acid and methacrylic acid. Likewise, the term "(meth)acrylate" means both of acrylate and methacrylate.

As the alkali-soluble resin which does not have any ethylenic unsaturated group, a resin which is obtainable by copolymerizing at least an unsaturated carboxylic acid, an epoxy group-containing unsaturated compound which does not have any alicyclic group, and an alicyclic group-containing unsaturated compound may be used.

Examples of the unsaturated carboxylic acid include monocarboxylic acid such as (meth)acrylic acid and crotonic acid; dicarboxylic acid such as maleic acid, fumaric acid, citraconic acid, mesaconic acid, and itaconic acid; anhydrides of these dicarboxylic acids; and the like. Among these, (meth) acrylic acid and maleic anhydride are preferred from the viewpoints of copolymerization reactivity, alkali solubility of the obtained resin, easy availability, and so forth. These unsaturated carboxylic acids may be used alone or in combination of two or more kinds thereof.

Examples of the epoxy group-containing unsaturated compound which does not have any alicyclic group include (meth) acrylic acid epoxyalkyl esters such as glycidyl (meth)acrylate, 2-methylglycidyl (meth)acrylate, 3,4-epoxybutyl (meth) acrylate, 6,7-epoxyheptyl (meth)acrylate, 3,4-epoxycyclohexyl (meth)acrylate; α-alkylacrylic acid epoxyalkyl esters such as glycidyl α-ethylacrylate, glycidyl α-n-propylacrylate, glycidyl α-n-butylacrylate, and 6,7-epoxyheptyl α-ethylacrylate; glycidyl ethers such as o-vinylbenzyl glycidyl ether, m-vinylbenzyl glycidyl ether, and p-vinylbenzyl glycidyl ether; and the like. Among these, glycidyl (meth)acrylate, 2-methylglycidyl (meth)acrylate, 6,7-epoxyheptyl (meth)acrylate, o-vinylbenzyl glycidyl ether, m-vinylbenzyl glycidyl ether and p-vinylbenzyl glycidyl ether are preferred from the viewpoints of copolymer reactivity, resin strength after curing and so forth. These epoxy group-containing unsaturated compounds may be used alone or in combination of two or more kinds thereof.

As the alicyclic group-containing unsaturated compound, an unsaturated compound may be used without particular limitation insofar as the unsaturated compound has an alicyclic group. The alicyclic group may be monocyclic or polycyclic. Examples of monocyclic alicyclic group include a cyclopentyl group, a cyclohexyl group, and the like. Examples of the polycyclic alicyclic group include an adamantyl group, a norbornyl group, an isobornyl group, a tricyclononyl group, a tricyclodecyl group, a tetracyclododecyl group, and the like. More specifically, examples of the alicyclic group-containing unsaturated compound include the compounds represented by the following formula.

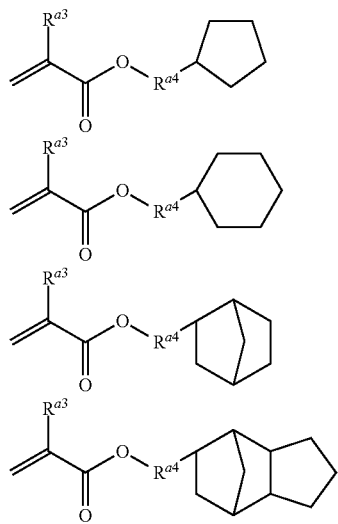

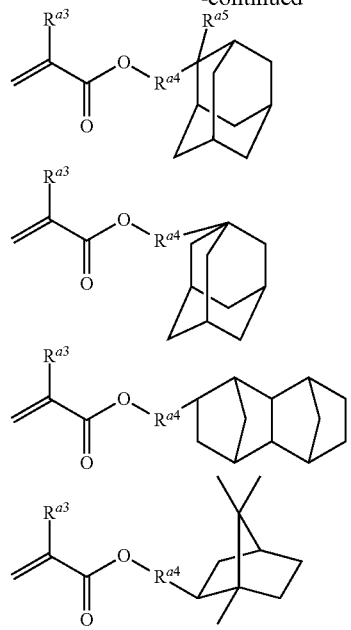

In the above formula, $R^{a3}$ indicates a hydrogen atom or a methyl group; $R^{a4}$ indicates a single bond or a divalent aliphatic saturated hydrocarbon group having 1 to 6 carbon atoms; and $R^{a5}$ indicates a hydrogen atom or an alkyl group having 1 to 5 carbon atoms. As the $R^{a4}$, a single bond and a straight chain or branched chain alkylene group such as a methylene group, an ethylene group, a propylene group, a tetramethylene group, an ethylethylene group, a pentamethylene group, and a hexamethylene group are preferred. As the $R^{a5}$, a methyl group and an ethyl group are preferred.

In the alkali-soluble resin, a ratio of a constitutional unit derived from the unsaturated carboxylic acid is preferably 3 to 25 mass %, more preferably 5 to 25 mass %. Also, a ratio of a constitutional unit derived from the epoxy group-containing unsaturated compound is preferably 71 to 95 mass %, more preferably 75 to 90 mass %. Also, a ratio of a constitutional unit derived from the alicyclic group-containing unsaturated compound is preferably 1 to 25 mass %, more preferably 3 to 20 mass %, further preferably 5 to 15 mass %. With the above-specified ranges, it is possible to enhance the adhesiveness of the negative-type photosensitive resin composition to substrates and the strength of the negative-type photosensitive resin composition after curing while maintaining alkali solubility of the obtained resin at an appropriate level.

A mass average molecular weight of the alkali-soluble resin is preferably 1000 to 40000, more preferably 2000 to 30000. With the above-specified range, it is possible to attain satisfactory heat resistance and film strength while attaining favorable developability.

A content of the alkali-soluble resin is preferably 5 to 80 mass %, more preferably 15 to 50 mass %, relative to a solid content of the negative-type photosensitive resin composition of the first embodiment. With the above-specified range, there is a tendency that developability is well-balanced.

The photopolymerizable monomer in the negative-type photosensitive resin composition of the first embodiment includes a monofunctional monomer and a multifunctional monomer.

Examples of the monofunctional monomer include (meth) acryl amide, methylol(meth)acrylamide, methoxymethyl (meth)acrylamide, ethoxymethyl(meth)acrylamide, propoxymethyl(meth)acrylamide, butoxymethoxymethyl(meth)acrylamide, N-methylol(meth)acrylamide, N-hydroxymethyl(meth)acrylamide, (meth)acrylic acid, fumaric acid, maleic acid, maleic anhydride, itaconic acid, itaconic anhydride, citraconic acid, citraconic anhydride, crotonic acid, 2-acrylamide-2-methylpropanesulfonic acid, tert-butylacrylamidesulfonic acid, methyl (meth)acrylate, ethyl (meth)acrylate, butyl (meth)acrylate, 2-ethylhexyl (meth)acrylate, cyclohexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, glycerin mono(meth)acrylate, tetrahydrofurfuryl (meth)acrylate, dimethylamino (meth)acrylate, glycidyl (meth)acrylate, 2,2,2-trifluoroethyl (meth)acrylate, 2,2,3,3-tetrafluoropropyl (meth)acrylate, half (meth)acrylate of a phthalic acid derivative, and the like. These monofunctional monomers may be used alone or in combination of two or more kinds thereof.

Meanwhile, examples of the multifunctional monomer include ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, glycerin triacrylate, glycerin polyglycidyl ether poly(meth)acrylate, urethane (meth)acrylate (i.e. tolylene diisocyanate), a reaction product of trimethylhexamethylene diisocyanate, hexamethylene diisocyanate, and 2-hydroxyethyl (meth)acrylate, methylene bis(meth)acrylamide, (meth)acrylamide methylene ether, a multifunctional monomer such as a condensate of a polyvalent alcohol and N-methylol(meth)acrylamide, triacryl formal, and the like. These multifunctional monomers may be used alone or in combination of two or more kinds thereof.

A content of the photopolymerizable monomer is preferably 1 to 30 mass %, more preferably 5 to 20 mass %, relative to the solid content of the negative-type photosensitive resin composition of the first embodiment. With the above-specified range, there is a tendency that sensitivity, developability, and resolution are well-balanced.

As the photopolymerization initiator in the negative-type photosensitive resin composition of the first embodiment, conventionally known photopolymerization initiators are usable without particular limitation.

Specific examples of the photopolymerization initiator include 1-hydroxy-cyclohexylphenylketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl)ketone, 2-methyl-1-[4-(methylthio)phenyl]-2-morpholinopropan-1-one, 2-benzyl-2-dimethylamino-1-(4-morpholinophenyl)-butan-1-one, ethanone, 1-[9-ethyl-6-(2-methylbenzoyl)-9H-carbozol-3-yl], 1-(o-acetyloxime), 2,4,6-trimethylbenzoyldiphenylphosphineoxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethylacetal, benzyldimethylketal, 1-phenyl-1,2-propanedione-2-(o-ethoxycarbonyl)oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidazole, 2-mercaptobenzoxazole, 2-mercaptobenzothiazole, 2-(o-chlorophenyl)-4,5-diphenylimidazole dimers, 2-(o-chlorophenyl)-4,5-di(methoxyphenyl)imidazole dimers, 2-(o-fluorophenyl)-4,5-diphenylimidazole dimers, 2-(o-methoxyphenyl)-4,5-diphenylimidazole dimers, 2-(p-methoxyphenyl)-4,5-diphenylimidazole dimers, 2,4,5-triarylimidazole dimers, benzophenone, 2-chlorobenzophenone, 4,4'-bisdiethylaminobenzophenone (i.e. Michler's ketone), 4,4'-bisdiethylaminobenzophenone (i.e. ethyl Michler's ketone), 4,4'-dichlorobenzophenone, 3,3-dimethyl-4-methoxybenzophenone, benzyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl-4-dimethylamino benzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, and the like. Among these, it is particularly preferable to use the oxime-based photopolymerization initiator from the viewpoint of sensitivity. These photopolymerization initiators may be used alone or in combination of two or more kinds thereof.

A content of the photopolymerization initiator is preferably 0.5 to 20 parts by mass relative to 100 parts by mass of the solid content of the negative-type photosensitive resin composition of the first embodiment. With the above-specified range, it is possible to attain satisfactory heat resistance and chemical resistance and to suppress a curing defect by improving coating film formation capability.

The negative-type photosensitive composition of the first embodiment contains the compound represented by the formula (1) as described above. The compound has favorable solubility to an organic solvent and enables attaining a favorable micropatterning property when contained in the negative-type photosensitive resin composition.

A content of the compound represented by the formula (1) is preferably 0.5 to 95 parts by mass, more preferably 1 to 50 parts by mass, relative to 100 parts by mass of the photopolymerization initiator. With the above-specified range, it is possible to attain a favorable micropatterning property while attaining favorable developability.

The negative-type photosensitive resin composition of the first embodiment may further comprise a coloring agent. When the coloring agent is contained, the negative-type photosensitive resin composition is favorably used for forming a color filter of liquid crystal displays, for example. Also, when the negative-type photosensitive resin composition of the first embodiment contains a light shielding agent as the coloring agent, it is favorably used for forming a black matrix in the color filter, for example.

The coloring agent is not particularly limited, but it is preferable to use, for example, compounds which are classified into Pigment in Color Index (C.I.; published by The Society of Dyers and Colorist), and specifically those having the following color index (C.I.) numbers.

C.I. pigment yellow 1 (hereinafter, "C.I. pigment yellow" is omitted, and only the numbers are listed), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, and 185;

C.I. pigment orange 1 (hereinafter, "C.I. pigment orange" is omitted, and only the numbers are listed), 5, 13, 14, 16, 17, 24, 34, 36, 38, 40, 43, 46, 49, 51, 55, 59, 61, 63, 64, 71, and 73;

C.I. pigment violet 1 (hereinafter, "C.I. pigment violet" is omitted, and only the numbers are listed), 19, 23, 29, 30, 32, 36, 37, 38, 39, 40, and 50;

C.I. pigment red 1 (hereinafter, "C.I. pigment red" is omitted, and only the numbers are listed), 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, and 265;

C.I. pigment blue 1 (hereinafter, "C.I. pigment blue" is omitted, and only the numbers are listed), 2, 15, 15:3, 15:4, 15:6, 16, 22, 60, 64, and 66;

C.I. pigment green 7, C.I. pigment green 36, and C.I. pigment green 37;

C.I. pigment brown 23, C.I. pigment brown 25, C.I. pigment brown 26, and C.I. pigment brown 28; and C.I. pigment black 1 and C.I. pigment black 7.

In the case where the light shielding agent is used as the coloring agent, it is preferable to use a black pigment as the light shielding agent. Examples of the black pigment include various types of pigments irrespective of whether it is an organic substance or an inorganic substance, such as carbon black, titanium black, and a metal oxide, a composite oxide, a metal sulfide, a metal sulfate, and a metal carbonate of copper, iron, manganese, cobalt, chromium, nickel, zinc, calcium, silver, or the like. Among these, it is preferable to use the carbon black, which has a high light shielding property.

As the carbon black, known carbon black such as channel black, furnace black, thermal black, and lamp black are usable, and it is preferable to use the channel black, which is excellent in light shielding property. Also, a resin-coated carbon black may be used.

Since the resin coated carbon black has lower conductivity than the carbon black without resin coating, it is less subject to electric current leakage when used for black matrixes of liquid crystal display devices and enables producing highly reliable displays with low power consumption.

Each of the above organic pigments may be added as an auxiliary pigment as required in order to adjust a color tone of the carbon black.

Further, a dispersant may be used for uniformly dispersing the coloring agent in the negative-type photosensitive resin composition. As the dispersant, polyethylene imine-based, urethane resin-based, acryl resin-based polymer dispersants is preferably used. Particularly, in the case where the carbon black is used as the coloring agent, it is preferable to use the acryl resin-based dispersant as the dispersant.

Also, the inorganic pigments and the organic pigments may be used alone or in combination, and, in the case of combined use, the organic pigment may be used within the range of 10 to 80 parts by mass, more preferably within the range of 20 to 40 parts by mass, relative to 100 parts by mass in total of the inorganic pigment and the organic pigment.

A content of the coloring agent may appropriately be determined depending on the usage of the negative-type photosensitive resin composition of the first embodiment, and, as one example, the content is preferably 5 to 70 parts by mass, more preferably 25 to 60 parts by mass, relative to 100 parts by mass of the solid content of the negative-type photosensitive resin composition of the first embodiment.

Particularly, in the case of forming a black matrix by using the negative-type photosensitive resin composition of the first embodiment, it is preferable to adjust the amount of the light shielding agent in the negative-type photosensitive resin composition so that an OD value per 1 μm of film thickness of the black matrix is 4 or more. With the OD value of 4 or more per 1 μm of film thickness in the black matrix, it is possible to attain satisfactory display contrast when the negative-type photosensitive resin composition is used for black matrixes of liquid crystal displays.

It is preferable to add to the negative-type photosensitive resin composition the coloring agent as a dispersion which is obtained by dispersing the coloring agent at an appropriate concentration by using the dispersant.

Examples of the organic solvent in the negative-type photosensitive resin composition of the first embodiment include (poly)alkylene glycol monoalkyl ethers such as ethylene glycol monomethyl ether, ethylene glycol monoethyl ether, ethylene glycol-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; alkyl lactates such as methyl 2-hydroxypropionate and ethyl 2-hydroxypropionate; other esters such as ethyl 2-hydroxy-2-methylpropionate, methyl 3-methoxypropionate, ethyl 3-methoxy propionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutylacetate, 3-methyl-3-methoxybutylpropionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; amides such as N-methylpyrrolidone, N,N-dimethylformamide, and N,N-dimethylacetamide; and the like.

The organic solvents may be used alone or in combination of two or more kinds thereof.

Among the above organic solvents, propylene glycol monomethyl ether, ethylene glycol monomethyl ether acetate, propylene glycol monomethyl ether acetate, propyleneglycol monoethyl ether acetate, diethylene glycol dimethyl ether, diethylene glycol methylethyl ether, cyclohexanone, 3-methoxybutyl acetate are preferred since they exhibit excellent solubility with respect to the alkali-soluble resin, the photopolymerizable monomer, the photopolymerization initiator, and the compound represented by the formula (1) and improve a dispersing property of the coloring agent, and it is particularly preferable to use propylene glycol monomethyl ether acetate or 3-methoxybutyl acetate.

A content of the organic solvent is preferably such that a solid content concentration of the negative-type photosensitive resin composition of the first embodiment is 1 to 50 mass %, more preferably 5 to 30 mass %.

The negative-type photosensitive resin composition of the first embodiment may contain various additives as required. Examples of the additives include a sensitizer, a curing accelerator, a filler, an adhesion accelerator, an antioxidant, an ultraviolet ray absorber, a flocculation inhibitor, thermal polymerization inhibitor, an anti-foaming agent, a surfactant, and the like.

Further, in the case that the alkali-soluble resin has a carboxyl group, a composition comprising the alkali-soluble resin, the compound represented by the formula (1), and the organic solvent and not comprising the photopolymerizable monomer and the photopolymerization initiator also functions as a negative-type photosensitive resin composition. Namely, when a base is generated from the compound represented by the formula (1) by electromagnetic wave irradiation or heat, the alkali-soluble resin undergoes dehydration condensation with this base as a catalyst. Thus, the solubility in the developing solution decreases.

In this case, further comprising a photopolymerization initiator is preferable because this promotes the generation of the base from the compound represented by the formula (1). Namely, upon generation of a radical from the photopolymerization initiator by electromagnetic wave irradiation, the compound represented by the formula (1) is attacked by this radical, and the generation of a base is promoted. Further, the base generated from the compound represented by the formula (1) captures the radical, whereby the equilibrium of the base generating reaction is shifted, and further base is generated. Moreover, the base generated from the compound represented by the formula (1) reacts with the compound after the radical generation, and the base generation is further promoted.

(2) Negative-Type Photosensitive Resin Composition of the Second Embodiment

The negative-type photosensitive resin composition of the second embodiment comprises an alkali-soluble resin having a phenolic hydroxyl group, an acid crosslinkable substance, a photoacid generator, the compound represented by the formula (1), and an organic solvent.

As the alkali-soluble resin having a phenolic hydroxyl group in the negative-type photosensitive resin composition of the second embodiment, for example, it is possible to use a polyhydroxystyrene resin.

A polyhydroxystyrene resin has at least a constituent unit derived from a hydroxystyrene.

Herein, "hydroxystyrene" is taken as a concept including hydroxystyrene, and hydroxystyrene derivatives where the hydrogen atom bonded at the α-position of the hydroxystyrene is substituted with another substituent group such as a halogen atom, an alkyl group, a halogenated alkyl group and the like, as well as their derivatives (monomers).

"Hydroxystyrene derivatives" encompasses those where at least a benzene ring and a hydroxyl group bonded thereto are maintained, for example those where the hydrogen atom bonded at the α-position of the hydroxystyrene is substituted with another substituent group such as a halogen atom, an alkyl group with a carbon number of 1 to 5, a halogenated alkyl group and the like, and those where at the benzene ring to which the hydroxyl group of the hydroxystyrene is bonded, an alkyl group with a carbon number of 1 to 5 is further bonded, or where at the benzene group to which this hydroxyl group is bonded, 1 to 2 hydroxyl groups are further bonded (when this is the case, the total number of hydroxyl groups is 2 to 3), or the like.

As the halogen atom, a chlorine atom, fluorine atom, bromine atom and the like may be mentioned, and a fluorine atom is preferable.

Further, the "α-position of the hydroxystyrene", unless otherwise noted, refers to the carbon atom bonded to the benzene ring.

These constituent units derived from hydroxystyrene are represented, for example, by the following formula (b-1).

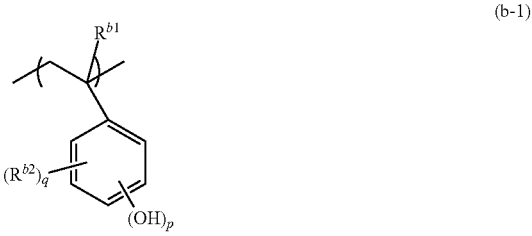

(b-1)

In the formula (b-1), $R^{b1}$ indicates a hydrogen atom, alkyl group, halogen atom, or halogenated alkyl group, $R^{b2}$ indicates an alkyl group with a carbon number of 1 to 5, p indicates an integer of 1 to 3, and q indicates an integer of 0 to 2.

The alkyl group of $R^{b1}$ preferably has a carbon number of 1 to 5. Further, a straight chain or branched chain alkyl group is preferable, and a methyl group, ethyl group, propyl group, isopropyl group, n-butyl group, tert-butyl group, pentyl group, isopentyl group, neopentyl group, and the like may be mentioned. Among these, a methyl group is industrially preferable.

As the halogen atom, a fluorine atom, chlorine atom, bromine atom, iodine atom and the like may be mentioned, and a fluorine atom is preferred.

The halogenated alkyl group is one where a portion or all of the hydrogen atoms of the above described alkyl group with a carbon number of 1 to 5 are substituted with a halogen atom. Among these, it is preferable for all of the hydrogen atoms to be substituted with fluorine atoms. Further, a straight chain or branched chain fluorinated alkyl group is preferable, and a trifluoromethyl group, hexafluoroethyl group, heptafluoropropyl group, nonafluorobutyl group and the like are preferable, and a trifluoromethyl group (—$CF_3$) is most preferable.

As the $R^{b1}$, a hydrogen atom or methyl group is preferable, and a hydrogen atom is more preferable.

As the alkyl group with a carbon number of 1 to 5 of $R^{b2}$, the same as for $R^{b1}$ may be mentioned.

The q is an integer of 0 to 2. Among these, 0 or 1 is preferable, and 0 is particularly preferable industrially.

The substitution position of $R^{b2}$ may be any of the ortho position, meta position, or para position in the case that q is 1, and further, may be any arbitrary combination of substitution positions when q is 2.

The p is an integer of 1 to 3, and is preferably 1.

The substitution position of the hydroxyl group may be any of the ortho position, meta position, or para position when p is 1, and the para position is preferable because it is readily available at low cost. Further, when p is 2 or 3, arbitrary substitution positions may be combined.

The constituent unit represented by the formula (b-1) may be used alone or in combinations of two or more kinds.

In the polyhydroxystyrene resin, the proportion of constituent units derived from hydroxystyrene is preferably 60 to 100 mol % with respect to all of the constituent units constituting the polyhydroxystyrene, more preferably 70 to 100 mol %, and even more preferably 80 to 100 mol %. With the above range, it is possible to obtain a proper alkali solubility when making the negative-type photosensitive resin composition.

The polyhydroxystyrene resin preferably further has constituent units derived from styrene.

Herein, "constituent units derived from styrene" encompasses constituent units wherein the ethylenic double bond of styrene or styrene derivatives (however, not including hydroxystyrene) is cleaved.

"Styrene derivatives" encompass those where a hydrogen atom bonded to the α-position of the styrene is substituted with another substituent group such as a halogen atom, alkyl group, halogenated alkyl group and the like, and those where the hydrogen atom of the phenyl group of the styrene is substituted with a substituent group such as an alkyl group with a carbon number of 1 to 5, and the like.

As the halogen atom, a chlorine atom, fluorine atom, bromine atom and the like may be mentioned, and a fluorine atom is preferable.

Further, the "α-position of the styrene", unless otherwise noted, refers to the carbon atom bonded to the benzene ring.

The constituent units derived from the styrene are represented, for example, by the following formula (b-2). In the formula, $R^{b1}$, $R^{b2}$, and q are the same as for the formula (b-1).

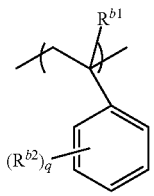

(b-2)

As $R^{b1}$ and $R^{b2}$, the same as the respective $R^{b1}$ and $R^{b2}$ of the formula (b-1) may be mentioned.

The q is an integer of 0 to 2. Among these, 0 or 1 is preferable, and 0 is especially preferable industrially.

The substitution position of $R^{b2}$ may be an ortho position, meta position, or para position when q is 1, and further, when q is 2, arbitrary substitution positions may be combined.

The constituent units represented by the formula (b-2) may be used alone or in combinations of two or more kinds.

In the polyhydroxystyrene resin, the proportion of constituent units derived from styrene is preferably 40 mol % or less with respect to all of the constituent units constituting the polyhydroxystyrene, more preferably 30 mol % or less, and even more preferably 20 mol % or less. With the above range, it is possible to obtain a proper alkali solubility when making the negative-type photosensitive resin composition, and the balance with the other constituent units also becomes favorable.

Further, the polyhydroxystyrene resin may have constituent units other than the constituent units derived from hydroxystyrene and the constituent units derived from styrene. More preferably, the above polyhydroxystyrene resin is a polymer consisting only of constituent units derived from hydroxystyrene, or a copolymer derived from constituent units derived from hydroxystyrene and constituent units derived from styrene.

The mass average molecular weight of the polyhydroxystyrene resin is not particularly limited, but is preferably 1500 to 40000, more preferably 2000 to 8000.

Further, as the alkali-soluble resin having a phenolic hydroxyl group, a novolak resin may be used. This novolak resin may be obtained by addition condensation of a phenol and an aldehyde under the presence of an acid catalyst.

As the phenol, cresols such as phenol, o-cresol, m-cresol, p-cresol and the like; xylenols such as 2,3-xylenol, 2,4-xylenol, 2,5-xylenol, 2,6-xylenol, 3,4-xylenol, 3,5-xylenol and the like; alkylphenols such as o-ethylphenol, m-ethylphenol, p-ethylphenol, 2-isopropylphenol, 3-isopropylphenol, 4-isopropylphenol, o-butylphenol, m-butylphenol, p-butylphenol, p-tert-butylphenol and the like; trialkylphenols such as 2,3,5-trimethylphenol, 3,4,5-trimethylphenol and the like; polyphenols such as resorcinol, catechol, hydroquinone, hydroquinone monomethyl ether, pyrogallol, phluoroglucinol and the like; alkyl polyphenols such as alkylresorcinol, alkyl catechol, alkyl hydroquinone and the like (where all alkyl groups have a carbon number of 1 to 4); α-naphthol, β-naphthol, hydroxydiphenyl, bisphenol A and the like, may be mentioned. These phenols may be used alone or in combinations of two or more kinds.

Even among these phenols, m-cresol and p-cresol are preferable, and the combined use of m-cresol and p-cresol is more preferable. In this case, by adjusting the mixing ratio of the two, it is possible to adjust various characteristics such as the sensitivity and the like.

As the aldehyde, formaldehyde, paraformaldehyde, furfural, benzaldehyde, nitrobenzaldehyde, acetaldehyde and the like. These aldehydes may be used alone or in combinations of two or more kinds.

As the acid catalyst, inorganic acids such as hydrochloric acid, sulfuric acid, nitric acid, phosphoric acid, phosphonic acid, and the like; and organic acids such as formic acid, oxalic acid, acetic acid, diethyl sulfate, paratoluenesulfonic acid and the like; metal salts such as zinc acetate and the like; and the like may be mentioned. These acid catalysts may be used alone or in combinations of two or more kinds.

As novolak resins which can be obtained in this way, specifically, phenol/formaldehyde condensation novolak resin, cresol/formaldehyde condensation novolak resin, phenol-naphthol/formaldehyde condensation novolak resin and the like may be mentioned.

The mass average molecular weight of the novolak resin is not particularly limited, but is preferably 1000 to 30,000, more preferably 3,000 to 25,000.

Further, as the alkali-soluble resin having a phenolic hydroxyl group, phenol-xylylene glycol condensation resin, cresol-xylylene glycol condensation resin, and phenol-dicyclopentadiene condensation resin and the like may be used.

The content of the alkali-soluble resin having a phenolic hydroxyl group is preferably 20 to 80 mass % with respect to the solid content of the negative-type photosensitive resin composition of the second embodiment, and more preferably 35 to 65 mass %. With the above range, there is tendency to readily obtain a balance of the developability.

The acid crosslinkable substance in the negative-type photosensitive resin composition of the second embodiment is not particularly limited, and it is possible to use a conventionally known acid crosslinkable substance.

As the acid crosslinkable substance, specifically, an amino resin having a hydroxyl group or an alkyoxy group, for example a melamine resin, a urea resin, a guanamine resin, an acetoguanamine resin, a benzoguanamine resin, a glycoluril-formaldehyde resin, a succinyl amide-formaldehyde resin, an ethylene urea-formaldehyde resin, and the like may be mentioned. These acid crosslinkable substances are readily obtained by reacting melamine, urea, guanamine, acetoguanamine, benzoguanamine, glycoluril, succinyl amide, ethylene urea with formalin in boiling water and methylolating, or further reacting these with a lower alcohol and alkoxylating. Practically, they may be obtained as a melamine resin such as Nikalac MX-750, Nikalac MW-30, Nikalac MW100LM and the like, or a urea resin such as Nikalac MX-290 and the like (all manufactured by Sanwa Chemical Co. Ltd.). Further, benzoguanamine resins may also be obtained as commercial products such as Cymel 1123 and Cymel 1128 (manufactured by Mitsui Cyanade Co., Ltd.).

Further, a benzene compound having an alkoxy group such as 1,3,5-tris(methoxymethoxy)benzene, 1,2,4-tris(isopropoxymethoxy)benzene, 1,4-bis(sec-butoxymethoxy)benzene and the like, and a phenol compound having a hydroxyl group or an alkoxy group such as 2,6-dihydroxymethyl-p-tert-butylphenol and the like may be used.

These acid crosslinkable substances may be used alone or in combinations of two or more kinds.

The content of these acid crosslinkable substances is preferably 5 to 50 parts by mass with respect to 100 parts by mass of the alkali-soluble resin having a phenolic hydroxyl group, and more preferably 10 to 30 parts by mass. With the above range, the curing properties and the patterning characteristics of the negative-type photosensitive resin composition become favorable.

The photoacid generator in the negative-type photosensitive resin composition of the second embodiment is not particularly limited, and it is possible to use a conventionally known photoacid generator.

As the photoacid generator, specifically, an onium salt acid generator such as iodonium salt or sulfonium salt or the like, an oxime sulfonate acid generator, a halogen-containing triazine compound, a diazomethane acid generator, a nitrobenzyl sulfonate acid generator (nitrobenzyl derivative), imino-sulfonate acid generator, disulfone acid generator, and the like may be mentioned.

As a preferable sulfonium salt acid generator, for example, a compound represented by the following formula (c-1) may be mentioned.

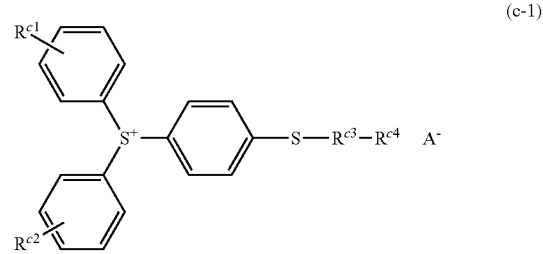

(c-1)

In the formula (c-1), $R^{c1}$ and $R^{c2}$ respectively and independently indicate a hydrogen atom, halogen atom, oxygen atom or a hydrocarbon group which may have a halogen atom, or an alkoxy group which may have a substituent group; $R^{c3}$ indicates a p-phenylene group which may have a halogen atom or an alkyl group; $R^{c4}$ indicates a halogen atom, oxygen atom or a hydrocarbon group which may have a halogen atom, a benzoyl group which may have a substituent group, or a polyphenyl group which may have a substituent group; and $A^-$ indicates a counterion to the onium ion.

As $A^-$, specifically, $SbF_6^-$, $PF_6^-$, $AsF_6^-$, $BF_4^-$, $SbCl_6^-$, $ClO_4^-$, $CF_3SO_3^-$, $CH_3SO_3^-$, $FSO_3^-$, $F_2PO_2^-$, p-toluene-sulfonate, nonafluorobutanesulfonate, adamantane carboxylate, tetraaryl borate, the fluorinated alkyl fluorophosphate anions represented by the following formula (c-2), and the like may be mentioned.

$[(Rf)_n PF_{6-n}]^-$ (c-2)

In the formula (c-2), Rf indicates an alkyl group where 80% or more of the hydrogen atoms have been substituted with a fluorine atom. The n is the counter thereof and indicates an integer of 1 to 5. The n units of Rf may each be the same, or may be different.

As the photoacid generator represented by the formula (c-1), 4-(2-chloro-4-benzoylphenylthio)phenyldiphenylsulfonium hexafluoroantimonate, 4-(2-chloro-4-benzoylphenylthio)phenylbis(4-fluorophenyl)sulfonium hexafluoroantimonate, 4-(2-chloro-4-benzoylphenylthio)phenylbis(4-chlorophenyl)sulfonium hexafluoroantimonate, 4-(2-chloro-4-benzoylphenylthio)phenylbis(4-methylphenyl)sulfonium hexafluoroantimonate, 4-(2-chloro-4-benzoylphenylthio)phenylbis(4-(β-hydroxyethoxy)phenyl)sulfonium hexafluoroantimonate, 4-(2-methyl-4-benzoylphenylthio)phenybis(4-fluorophenyl)sulfonium hexafluoroantimonate, 4-(3-methyl-4-benzoylphenylthio)phenylbis(4-fluorophenyl)sulfonium hexafluoroantimonate, 4-(2-fluoro-4-benzoylphenylthio)phenylbis(4-fluorophenyl)sulfonium hexafluoroantimonate, 4-(2-methyl-4-benzoylphenylthio)phenylbis(4-fluorophenyl)sulfonium hexafluoroantimonate, 4-(2,3,5,6-tetramethyl-4-benzoylphenylthio)phenylbis(4-fluorophenyl)sulfonium hexafluoroantimonate, 4-(2,6- dichloro-4-benzoylphenylthio)phenylbis(4-fluorophenyl) sulfonium hexafluoroantimonate, 4-(2,6-dimethyl-4-benzoylphenylthio)phenylbis(4-fluorophenyl)sulfonium hexafluoroantimonate, 4-(2,3-dimethyl-4-benzoylphenylthio)phenylbis(4-fluorophenyl)sulfonium hexafluoroantimonate, 4-(2-methyl-4-benzoylphenylthio)phenylbis(4-chlorophenyl)sulfonium hexafluoroantimonate, 4-(3-methyl-4-benzoylphenylthio)phenylbis(4-chlorophenyl) sulfonium hexafluoroantimonate, 4-(2-fluoro-4-benzoylphenylthio)phenylbis(4-chlorophenyl)sulfonium hexafluoroantimonate, 4-(2-methyl-4-benzoylphenylthio) phenylbis(4-chlorophenyl)sulfonium hexafluoroantimonate, 4-(2,3,5,6-tetramethyl-4-benzoylphenylthio)phenylbis(4-chlorophenyl)sulfonium hexafluoroantimonate, 4-(2,6-dichloro-4-benzoylphenylthio)phenylbis(4-chlorophenyl) sulfonium hexafluoroantimonate, 4-(2,6-dimethyl-4-benzoylphenylthio)phenylbis(4-chlorophenyl)sulfonium hexafluoroantimonate, 4-(2,3-dimethyl-4-benzoylphenylthio)phenylbis(4-chlorophenyl)sulfonium hexafluoroantimonate, 4-(2-chloro-4-acetylphenylthio)phenyldiphenylsulfonium hexafluoroantimonate, 4-(2-chloro-4-(4-methylbenzoyl)phenylthio)phenyldiphenylsulfonium hexafluoroantimonate, 4-(2-chloro-4-(4-fluorobenzoyl)phenylthio)phenyldiphenylsulfonium hexafluoroantimonate, 4-(2-chloro-4-(4-methoxybenzoyl)phenylthio)phenyldiphenylsulfonium hexafluoroantimonate, 4-(2-chloro-4-dodecanoylphenylthio)phenyldiphenylsulfonium hexafluoroantimonate, 4-(2-chloro-4-acetylphenylthio)phenylbis(4-fluorophenyl)sulfonium hexafluoroantimonate, 4-(2-chloro-4-(4-methylbenzoyl)phenylthio)phenylbis(4-fluorophenyl) sulfonium hexafluoroantimonate, 4-(2-chloro-4-(4-fluorobenzoyl)phenylthio)phenylbis(4-fluorophenyl) sulfonium hexafluoroantimonate, 4-(2-chloro-4-(4-methoxybenzoyl)phenylthio)phenylbis(4-fluorophenyl) sulfonium hexafluoroantimonate, 4-(2-chloro-4-dodecanoylphenylthio)phenylbis(4-fluorophenyl)sulfonium hexafluoroantimonate, 4-(2-chloro-4-acetylphenylthio)phenylbis(4-chlorophenyl)sulfonium hexafluoroantimonate, 4-(2-chloro-4-(4-methylbenzoyl)phenylthio)phenylbis(4-chlorophenyl)sulfonium hexafluoroantimonate, 4-(2-chloro-4-(4-fluorobenzoyl)phenylthio)phenylbis(4-chlorophenyl) sulfonium hexafluoroantimonate, 4-(2-chloro-4-(4-methoxybenzoyl)phenylthio)phenylbis(4-chlorophenyl) sulfonium hexafluoroantimonate, 4-(2-chloro-4-dodecanoylphenylthio)phenylbis(4-chlorophenyl)sulfonium hexafluoroantimonate, 4-(2-chloro-4-benzoylphenylthio) phenyldiphenylsulfonium hexafluorophosphate, 4-(2-chloro-4-benzoylphenylthio)phenyldiphenylsulfonium tetrafluoroborate, 4-(2-chloro-4-benzoylphenylthio) phenyldiphenylsulfonium perchlorate, 4-(2-chloro-4-benzoylphenylthio)phenyldiphenylsulfonium trifluoromethanesulfonate, 4-(2-chloro-4-benzoylphenylthio)phenylbis(4-fluorophenyl)sulfonium hexafluorophosphate, 4-(2-chloro-4-benzoylphenylthio)phenylbis(4-fluorophenyl)sulfonium tetrafluoroborate, 4-(2-chloro-4-benzoylphenylthio)phenylbis(4-fluorophenyl)sulfonium perchlorate, 4-(2-chloro-4-benzoylphenylthio)phenylbis(4-fluorophenyl)sulfonium trifluoromethanesulfonate, 4-(2-chloro-4-benzoylphenylthio)phenylbis(4-fluorophenyl)sulfonium p-toluenesulfonate, 4-(2-chloro-4-benzoylphenylthio)phenylbis(4-fluorophenyl)sulfonium camphorsulfonate, 4-(2-chloro-4-benzoylphenylthio)phenylbis(4-fluorophenyl)sulfonium nonafluorobutanesulfonate, 4-(2-chloro-4-benzoylphenylthio)phenylbis(4-chlorophenyl)sulfonium hexafluorophosphate, 4-(2-chloro-4-benzoylphenylthio)phenylbis(4-chlorophenyl)sulfonium tetrafluoroborate, 4-(2-chloro-4-benzoylphenylthio)phenylbis(4-chlorophenyl)sulfonium perchlorate, 4-(2-chloro-4-benzoylphenylthio)phenylbis(4-chlorophenyl)sulfonium trifluoromethanesulfonate, diphenyl[4-(phenylthio)phenyl] sulfonium trifluorotrispentafluoroethylphosphate, diphenyl [4-(p-terphenylthio)phenyl]sulfonium hexafluoroantimonate, diphenyl[4-(p-terphenylthio)phenyl]sulfonium trifluorotrispentafluoroethylphosphate and the like may be mentioned.

As other onium salt acid generators, for example, the cation portion of the formula (c-1) may be replaced with, for example, sulfonium cations such as triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl) diphenylsulfonium, bis(3-tert-butoxyphenyl)phenylsulfonium, tris(3-tert-butoxyphenyl) sulfonium, (3,4-ditert-butoxyphenyl)diphenylsulfonium, bis (3,4-ditert-butoxyphenyl)phenylsulfonium, tris(3,4-ditert-butoxyphenyl) sulfonium, diphenyl(4-thiophenoxyphenyl) sulfonium, (4-tert-butoxycarbonylmethyloxyphenyl) diphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium and the like; or iodinium cations such as aryl iodinium cations such as diphenyl iodinium, bis(4-tert-butylphenyl) iodinium, (4-tert-butoxyphenyl)phenyl iodinium, (4-methoxyphenyl)phenyl iodinium and the like may be mentioned.

As the oxime sulfonate acid generator, [2-(propylsulfonyloxyimino)-2,3-dihydrothiophene-3-ylidene](o-tolyl)acetonitrile, α-(p-toluenesulfonyloxyimino)-phenylacetonitrile, α-(benzenesulfoniumoxyimino)-2,4-dichlorophenylacetonitrile, α-(benznenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and the like may be mentioned.

Further, besides the above, the compounds represented by the following formula (c-3) may be mentioned.

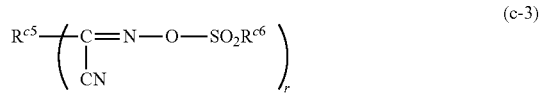

In the formula (c-3), $R^{c5}$ indicates a monovalent, divalent or trivalent organic group, $R^{c6}$ indicates a substituted or unsubstituted saturated hydrocarbon group, unsaturated hydrocarbon group, or aromatic compound group, and r is an integer of 1 to 6.

As $R^{c5}$ an aromatic compound group is particularly preferable, and as such an aromatic compound group, an aromatic hydrocarbon group such as a phenyl group, naphthyl group and the like; or a heterocyclic group such as a furyl group, thienyl group or the like may be mentioned. These may have one or more suitable substituent group on the ring, for example, a halogen atom, alkyl group, alkoxy group, nitro group and the like. As $R^{c6}$ an alkyl group with a carbon number of 1 to 6 is particularly preferable, and a methyl group, ethyl group, propyl group, and butyl group may be mentioned. Further, r is preferably an integer of 1 to 3, and 1 or 2 is more preferable.

As the photoacid generator represented by the formula (c-3), when r=1, compounds where $R^{c5}$ is any one of a phenyl group, methylphenyl group, and methoxyphenyl group, and where $R^{c6}$ is a methyl group may be mentioned. More specifically, as the photoacid generator represented by the formula (c-3), α-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl)acetonitrile may be mentioned.

As the photoacid generator represented by the formula (c-3), when r=2, the photoacid generators represented by the following formula may be mentioned.

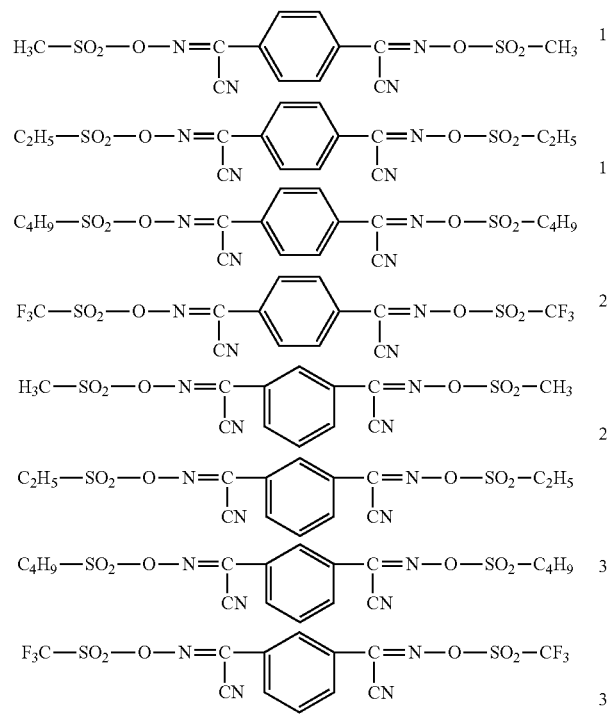

As the halogen group-containing triazine compound, halogen-containing compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine and the like; and halogen-containing triazine compounds represented by the following formula (c-4) such as tris(2,3-dibromopropyl)isocyanurate and the like, may be mentioned.

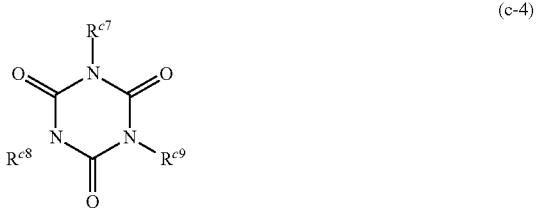

(c-4)

In the formula (c-4), $R^{c7}$, $R^{c8}$, and $R^{c9}$ respectively and independently indicate halogenated alkyl groups with a carbon number of 1 to 6.

Further, as other photoacid generators, bissulfonyldiazomethanes such as bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane, and bis(4-tert-butylphenylsulfonyl)diazomethane; sulfonylcarbonylalkanes such as 2-methyl-2-(p-toluenesulfonyl)propiophenone, 2-(cyclohexylcarbonyl)-2-(p-toluenesulfonyl)propane, 2-methanesulfonyl-2-methyl-(p-methylthio)propiophenone, and 2,4-dimethyl-2-(p-toluenesulfonyl)pentane-3-one; sulfonylcarbonyldiazomethanes such as 1-p-toluenesulfonyl-1-cyclohexylcarbonyldiazomethane, 1-diazo-1-methylsulfonyl-4-phenyl-2-butanone, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl 2-diazo-2-methanesulfonylacetate, cyclohexyl 2-diazo-2-benznesulfonylacetate, and tert-butyl 2-diazo-2-(p-toluenesulfonyl)acetate; nitrobenzyl derivatives such as 2-nitrobenzyl p-toluenesulfonate, 2,6-dinitrobenzyl p-toluenesulfonate, and 2,4-dinitrobenzyl p-trifluoromethylbenzenesulfonate; esters of polyhydroxy compounds and aliphatic or aromatic sulfonic acids such as methanesulfonic acid ester of pyrogallol, benzenesulfonic acid ester of pyrogallol, p-toluenesulfonic acid ester of pyrogallol, p-methoxybenznesulfonic acid ester of pyrogallol, mesitylenesulfonic acid ester of pyrogallol, benzylsulfonic acid ester of pyrogallol, methanesulfonic acid ester of alkyl gallate, benzenesulfonic acid ester of alkyl gallate, p-toluenesulfonic acid ester of alkyl gallate, p-methoxybenzenesulfonic acid ester of alkyl gallate (the alkyl group has 1 to 15 carbon atoms), mesitylenesulfonic acid ester of alkyl gallate, and benzylsulfonic acid ester of alkyl gallate; and the like may be mentioned.

These photoacid generators may be used alone or in combinations of two or more kinds.

The content of the photoacid generator is preferably from 0.05 to 30 parts by mass with respect to 100 parts by mass of the alkali-soluble resin having a phenolic hydroxyl group, and more preferably 0.1 to 10 parts by mass. With the above range, the curing properties of the negative-type photosensitive resin composition become favorable.

The negative-type photosensitive resin composition of the second embodiment, as described above, comprises a compound represented by the formula (1). This compound has favorable solubility in an organic solvent, and further, when included in a negative-type photosensitive resin composition, can provide favorable micropatterning property.

The content of the compound represented by the formula (1) is preferably from 1 to 200 parts by mass with respect to 100 parts by mass of the above described photoacid generator, and more preferably 10 to 80 parts by mass. With the above range, it is possible to obtain favorable developability, while also obtaining favorable micropatterning property.

The negative-type photosensitive resin composition of the second embodiment may also further comprise a compound with a molecular weight of less than 2000 and having 4 or more phenolic hydroxyl groups.

As such compounds, specifically, in addition to benzophenone compounds such as various types of tetrahydroxybenzophenones, pentahydroxybenzophenones, hexahydroxybenzophenones, heptahydroxybenzophenones and the like; hydroxyaryl compounds such as bis[2-hydroxy-3-(2'-hydroxy-5'-methylbenzyl)-5-methylphenyl]methane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(3-cyclohexyl-4-hydroxy-6-methylphenyl)-3,4-dihydroxyphenylmethane, bis(3-cyclohexyl-6-hydroxy-4-methylphenyl)-3,4-dihydroxyphenylmethane, bis(4-hydroxy-2,3,5-trimethylphenyl)-3,4-dihydroxyphenylmethane and the like; bis(hydroxyphenyl)alkane compounds such as 2-(2,3,4-trihydroxyphenyl)-2-(2',3',4'-trihydroxyphenyl)propane, 2-(2,4-dihydroxyphenyl)-2-(2',4'-dihydroxyphenyl)propane and the like; polyhydroxystyrene compounds with a molecular weight less than 2000 such as poly(o-hydroxystyrene), poly(m-hydroxystyrene), poly(p-hydroxystyrene), poly(α-methyl-p-hydroxystyrene), poly(4-hydroxy-3-methylstyrene) and the like; and the like may be mentioned. These benzophenone compounds, hydroxyaryl compounds, bis(hydroxyphenyl)alkane compounds, and polyhydroxystearene compounds may have a substituent group other than a hydroxyl group.

These compounds may be used alone or in combinations of two or more kinds.

The content of the compound having a molecular weight of less than 2000 and having 4 or more phenolic hydroxyl groups is preferably 0.5 to 5 parts by mass with respect to 100 parts by mass of the alkali-soluble resin having a phenolic hydroxyl group. With the above range, it is possible to inhibit the phenomenon of tapering when patterning the negative-type photosensitive resin composition.

As the organic solvent in the negative-type photosensitive resin composition of the second embodiment, the organic solvents listed as examples in the negative-type photosensitive resin composition of the first embodiment may be mentioned.

The content of the organic solvent is preferably an amount such that the solid content concentration of the negative-type photosensitive resin composition of the second embodiment is 1 to 50 mass %, and more preferably an amount such that the solid content concentration is 5 to 30 mass %.

(3) Negative-Type Photosensitive Resin Composition of the Third Embodiment

The negative-type photosensitive resin composition of the third embodiment comprises a photosensitive polyimide precursor, a photopolymerizable monomer, a photopolymerization initiator, a compound represented by the formula (1), and an organic solvent.

As the photosensitive polyimide precursor of the negative-type photosensitive resin composition of the third embodiment, for example, one having the constituent units represented by the following formula (d-1) and further having an acid functional group and a photosensitive group on the molecule may be used.

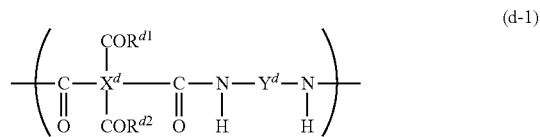

In the formula (d-1), $X^d$ indicates a tetravalent organic group not having an atom having an unshared electron pair in the skeleton binding the two amide groups bonded to $X^d$, $Y^d$ indicates a divalent organic group not having an atom having an unshared electron pair in the skeleton binding the two amide groups bonding to $Y^d$, and $R^{d1}$ and $R^{d2}$ respectively and independently indicate hydroxyl groups or monovalent organic groups.

In the definitions of $X^d$ and $Y^d$, the "skeleton binding the two amide groups" means the skeleton consisting only of atoms constituting the chain of bonds binding the two amide bonds. Accordingly, atoms which are present as terminals such as hydrogen atoms and fluorine atoms and the like, which do not form the chain of bonds binding the two amide bonds, are not included in the above "skeleton". However, in the case of including atoms which constitute a ring (aromatic ring or aliphatic ring) in this skeleton, all of the atoms constituting this ring are considered to be included in the above "skeleton". For example, in the case of including a benzene ring or a cyclohexyl ring, the six carbon atoms constituting the benzene ring or cyclohexyl ring itself are considered to be included in the above "skeleton". Further, substituent groups or hydrogen atoms bonded onto the benzene ring or cyclohexyl ring are not included in the "skeleton".

Accordingly, in the case that a carbonyl bond is present on the skeleton, what constitutes the chain binding the above two amide groups is only the carbon atom of the carbonyl group, thus the oxygen atom of the carbonyl group is not considered to be a constituent of the above "skeleton". Further, concerning a 2,2-propylidene bond or a hexafluoro-2,2-propylidene bond, only the carbon atom present in the center (2-position) is considered to constitute the skeleton, and the carbon atoms at both ends (the 1- and 3-positions) are not considered to constitute the skeleton. As an example of an "atom having an unshared electron pair", an oxygen atom, nitrogen atom, sulfur atom and the like may be mentioned, on the other hand, as an "atom not having an unshared electron pair", a carbon atom and a silicon atom and the like may be mentioned.

In the photosensitive polyimide precursor, when $X^d$ does not contain an atom having an unshared electron pair in the skeleton as described above, the swelling when alkali-developing is small and thus is preferable. For the same reason, it is preferable that $Y^d$ does not contain an atom having an unshared electron pair in the skeleton.

Further, in the photosensitive polyimide precursor, instead of having $Y^d$ in the constituent units, one having $Y^{d2}$ which has silicon atoms as a part thereof, for example, one having a siloxane bond, is preferable because a higher substrate adhesion can be imparted. In this case, the proportion thereof is preferably 1 to 20 mol % among all of the diamine residues forming the photosensitive polyimide precursor.

As the $X^d$ and $Y^d$ in the formula (d-1), an alkyl group or cycloalkyl group with a carbon number of 4 to 20, or an aromatic ring such as a benzene ring, a naphthyl ring with a carbon number of 4 to 20 or the like, or ones where 2 to 10 of these rings are bonded via a single bond, alkylene group, fluorinated alkylene group, carbonyl group or the like may be mentioned as preferable. Further, these may have a substituent group such as a hydrocarbon group, halogenated hydrocarbon group, halogen atom or the like on the aromatic ring. Further, among the $X^d$ and $Y^d$, those where the atoms directly bonded to the atoms constituting the above described skeleton are also "atoms not having unshared electron pairs" have a higher effect and are preferable. Further, in this definition, those where a carbon atom constituting the skeleton is directly bonded to an oxygen atom, such as a carbonyl group, or those where a fluorine atom is bonded to a carbon atom constituting the skeleton, are excluded. Furthermore, $X^d$ and $Y^d$ preferably do not include a fluorine atom.

As the acid functional group included in the molecule of the photosensitive polyimide precursor, a carboxyl group, phenolic hydroxyl group, sulfonic acid group and the like may be mentioned, and among these a carboxyl group is preferable. Further, as the photosensitive group, a vinyl group, aryl group, acrylolyl group, methacrylolyl group, acryloxy group, methacryloxy group and the like comprising an ethylenic unsaturated bond are preferable, and among these, an acrylolyl group, methacrylolyl group, acryloxy group, and methacryloxy group are preferable.

In the photosensitive polyimide precursor, the acid functional group is preferably present such that the $R^{d1}$ or $R^{d1}$ in the constituent units of the formula (d-1) is a hydroxyl group (namely, forming a carboxyl group), or present in the diamino residue group represented by $Y^d$. Further, the photosensitive group is preferably present in the side chain indicated by the $R^{d1}$ or $R^{d2}$ in the formula (d-1), or in the diamine residue group indicated by $Y^d$, for example as a group bonded to an aromatic ring of the diamine residue group having an aromatic ring.

In the $R^{d1}$ and $R^{d2}$, as a monovalent organic group having a photosensitive group, those represented by the following formula may be mentioned.

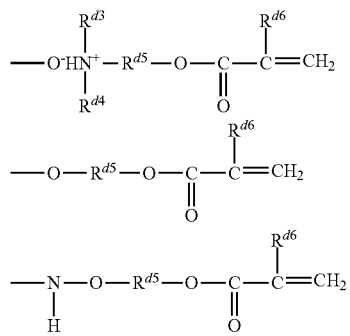

In the formula, $R^{d3}$ and $R^{d4}$ respectively and independently indicate a monovalent hydrocarbon group with a carbon number of 1 to 6, $R^{d5}$ indicates a divalent hydrocarbon group with a carbon number of 1 to 10, and $R^{d6}$ indicates a hydrogen atom or a methyl group.

Further, in $R^{d1}$ and $R^{d2}$, as a monovalent organic group not having a photosensitive group, an alkoxy group or an alkylamino group with a carbon number of 1 to 15 or the like may be mentioned.

As the photosensitive polyimide precursor, one having 50 to 100 mol % of the constituent units represented by the formula (d-1) is preferable, and one having only the constituent units represented by the formula (d-1) or one having constituent units represented by the formula (d-1) and constituent units where the $Y^d$ in the formula (d-1) is a divalent organic group containing a silicon atom are more preferable.

For the photosensitive polyimide precursor, it is possible to obtain as ingredients a tetracarboxylic dianhydride, a diamine, and a compound having a photosensitive group, and various known production methods may be applied.

As a tetracarboxylic dianhydride, as one providing $X^d$, for example, pyromellitic dianhydride, 3,3',4,4'-biphenyltetracarboxylic dianhydride, 1,2,5,6-naphthalenetetracaroxylic dianhydride, 2,3,6,7-naphthalenetetracaroxylic dianhydride, 1,4,5,8-naphthalenetetracaroxylic dianhydride, 3,4,9,10-perylenetetracarboxylic dianhydride, m-terphenyl-3,3',4,4'-tetracaroxylic dianhydride, p-terphenyl-3,3',4,4'-tetracaroxylic dianhydride, 4,4'-hexafluoroisopropylidenediphthalic dianhydride, 3,3',4,4'-benzophenonetetracaroxylic dianhydride and the like may be mentioned. These tetracarboxylic dianhydrides may be used alone or in combinations of two or more kinds.

As the diamine, as one for providing $Y^d$, for example, 2,2'-dimethyl-4,4'-diaminobiphenyl, 3,3'-dimethyl-4,4'-diaminobiphenyl, 2,2',6,6'-tetramethyl-4,4'diaminobiphenyl, 3,3',5,5'-tetramethyl-4,4'diaminobiphenyl, 4,4'-(or 3,4-, 3,3'-, 2,4-, 2,2'-)diaminodiphenylmethane, p-xylylenediamine, m-xylylenediamine, 4,4'-methylene-bis-(2,6-diethylaniline), 4,4'-methylene-bis-(2,6-diisopropylaniline), 1,5-diaminonaphthalene, 3,3'-dimethyl-4,4'-diaminodiphenylmethane, 3,3',5,5'-tetramethyl-4,4'-diaminodiphenylmethane, 2,2-bis (4-aminophenyl)propane, 2,2'-hexafluorodimethyl-4,4'-diaminophenyl, 3,3'-hexafluorodimethyl-4,4'-diaminobiphenyl, 4,4'-hexafluoroisopropylidenedianiline, 1,1,1,3,3,3-hexafluoro-2,2-bis(4-aminophenyl)propane, 2,3,5,6-tetramethyl-1,4-phenylenediamine, 2,5-dimethyl-1,4-phenylenediamine, 2,4-diaminotoluene, 2,6-diaminotoluene, 2,4,6-trimethyl-1,3-phenylenediamine, 2,7-diaminofluorene, 4,4-diaminooctafluorobiphenyl, 2,2-hexafluorodimethyl-4,4'-diaminobiphenyl and the may be mentioned as preferable, and these diamines may be used alone or in combinations of two or more kinds.

Further, for a binfunctional amine not including an atom having an unshared electron pair at the skeleton binding to the amino group, $Y^d$ may have at least one phenolic hydroxyl group or carboxyl group as an acid functional group. For example, 2,5-diaminobenzoic acid, 3,4-diaminobenzoic acid, 3,5-diaminobenzoic acid, 2,5-diaminoterephthalic acid, bis (4-amino-3-carboxyphenol)methylene, 4,4'-diamino-3,3'-dicarboxybiphenyl, 4,4'-diamino-5,5'-dicarboxy-2,2'-dimethylbiphenyl, 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, bis(3-amino-4-hydroxyphenyl)hexafluororpopane, bis(4-amino-3-hydroxyphenyl) hexafluoropropane, bis(4-amino-3-carboxyphenyl)methane, 4,4'-diamino-2,2'- dicarboxybiphenyl and the like may be mentioned as being preferable. These may be used alone or in combinations of two or more kinds.

Further, as one providing a $Y^{2d}$ including a silicon atom, an aliphatic diamine such as the diaminopolysiloxanes represented by the following formula (d-2) may be mentioned.

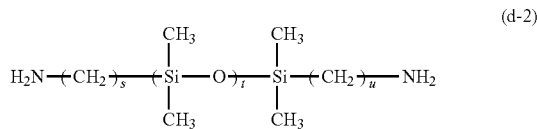
(d-2)

In the formula (d-2), s, t, and u respectively and independently indicate integers from 1 to 10.

In the case of using such an aliphatic diamine, from the viewpoint that swelling when developing is low, and the heat resistance of the formed film and the like, it is preferable that its content is 20 mol % or less of the whole diamine.

For making the polyimide precursor having the photosensitive group, for example, a method of making the polyimide precursor wherein a compound having an ethylenically unsaturated bond and an amino group or a quaternary salt group thereof, is provided in a form where a part of the amino group or quaternary salt group thereof is ionically bonded with a carboxylic group of a polyamic acid, or a method of introducing an ethylenically unsaturated bond at a side chain via a shared bond such as an ester bond, amide bond or the like may be mentioned.

Among these, in particular, a photosensitive polyimide precursor (polyamic ester) of a form where an ethylenically unsaturated bond is introduced by an ester bond, is suitable for alkali developing. In the case of introducing the ethylenically unsaturated bond by an ester bond, the introduced amount of the compound having the ethylenically unsaturated bond, from the viewpoint making the alkali solubility, curing properties, heat resistance and the like, compatible with the reactivity, is preferably an amount of 85 to 25 mol % with respect to the total amount of the carboxyl groups belonging to the polyamic acid, and the remainder are left as carboxyl groups (namely, a polyamic partial ester).

As examples of the compound introducing ethylenically unsaturated bonds by an ester bond, 2-hydroxyethyl acrylate, 3-hydroxypropyl acrylate, 2-hydroxyethyl methacrylate, 3-hydroxypropyl acrylate, 4-hydroxybutyl acrylate, 4-hydroxybutyl methacrylate, pentaerythritol diacrylate monostearate, pentaerythritol triacrylate, pentaerythritol trimethacrylate, caprolactone 2-(methacryloyloxy)ethyl ester, dicaprolactone 2-(methacryloyloxy)ethyl ester, caprolactone 2-(acryloyloxy)ethyl ester, dicaprolactone 2-(acryloyloxy)ethyl ester and the like may be mentioned.

The mass average molecular weight of the photosensitive polyimide precursor is preferably 5000 to 80000.

The content of the photosensitive polyimide precursor is preferably 40 to 95 mass % with respect to the solid content of the negative-type photosensitive resin composition of the third embodiment, and more preferably 55 to 90 mass %. With the above range, a balance of the developability tends to be readily obtained.

As the photopolymerizable monomer in the negative-type photosensitive resin composition of the third embodiment, the photopolymerizable monomers listed as examples in the negative-type photosensitive resin composition of the first embodiment may be mentioned.

The content of the photopolymerizable monomer is preferably 5 to 100 parts by mass with respect to 100 parts by mass of the photosensitive polyimide precursor, more preferably 5 to 40 parts by mass. With the above range, a balance of the sensitivity, developability, and resolution tends to be readily obtained.

As the photopolymerization initiator in the negative-type photosensitive resin composition of the third embodiment, the photopolymerization initiators listed as examples in the negative-type photosensitive resin composition of the first embodiment may be mentioned.

The content of the photopolymerization initiator is preferably 0.01 to 40 parts by mass with respect to 100 parts by mass of the photosensitive polyimide precursor. With the above range, it is possible to obtain sufficient heat resistance and chemical resistance, while improving the coating film formation capability and suppressing curing defects.

The negative-type photosensitive resin composition of the third embodiment, as described above, comprises a compound represented by the formula (1). This compound has favorable solubility in an organic solvent, and further, when included in a negative-type photosensitive resin composition, can provide favorable micropatterning property.

The content of the compound represented by the formula (1) is preferably 0.5 to 50 mass % of the above solid content, and more preferably 1 to 20 mass %. With the above range, it is possible to obtain favorable developability, while also obtaining favorable micropatterning property.

As the organic solvent in the negative-type photosensitive resin composition of the third embodiment, the organic solvents listed as examples in the negative-type photosensitive resin composition of the first embodiment may be mentioned. Among these, polar solvents which completely dissolve the generated polyimide are preferable. As such polar solvents, N-methyl-2-pyrrolidone, N,N-dimethyl acetoamide, N,N-dimethyl formamide, dimethyl sulfoxide, tetramethyl urea, hexamethylphosphoric triamide, γ-butyl lactone and the like may be mentioned.

The content of the organic solvent is preferably an amount such that the solid content concentration of the negative-type photosensitive resin composition of the third embodiment is 1 to 50 mass %, and more preferably an amount such that the solid content concentration is 5 to 30 mass %.

(4) Negative-Type Photosensitive Resin Composition of the Fourth Embodiment

The negative-type photosensitive resin composition of the fourth embodiment comprises a polyimide precursor, a compound represented by the formula (1), and an organic solvent.

As the polyimide precursor in the negative-type photosensitive resin composition of the fourth embodiment, for example, a polyamic acid having the constituent units represented by the following formula (e-1) may be used.

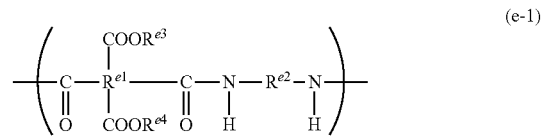
(e-1)

In the formula (e-1), $R^{e1}$ indicates a tetravalent organic group, $R^{e2}$ indicates a divalent organic group, and $R^{e3}$ and $R^{e4}$ indicate a hydrogen atom or a monovalent organic group.

In the case that $R^{e3}$ and $R^{e4}$ are a monovalent organic groups, for example, an alkyl group, alkenyl group, alkynyl group, aryl group, or structure where an ester bond is included with these groups represented by $C_xH_{2x}OC_yH_{2y+1}$ and the like, and the like may be mentioned.

As the polyimide precursor, a polyamic acid such that $R^{e3}$ and $R^{e4}$ are hydrogen atoms is suitable from the point of alkali developability.

Further, the tetravalence of $R^{e1}$ indicates only a valence number for bonding with acids, but it may have further functional groups. In the same way, the divalence of $R^{e2}$ indicates only a valence number for bonding with amines, but it may have further functional groups.

The polyamic acid can be obtained by reacting an acid dianhydride and a diamine, but from the viewpoint of imparting excellent heat resistance and dimensional stability to the finally obtained polyimide, in the formula (e-1), it is preferable for $R^{e1}$ or $R^{e2}$ to be an aromatic group, and more preferable for $R^{e1}$ and $R^{e2}$ to be aromatic groups. In this case, in $R^{e1}$ of the formula (e-1), the four groups ((—CO—)$_2$(—COOH)$_2$) bonded to this $R^{e1}$ may be bonded to the same aromatic ring, or may be bonded to different aromatic rings. In the same way, in $R^{e2}$ of the formula (e-1), the two groups ((—NH—)$_2$) bonded to this $R^{e2}$ may be bonded to the same aromatic ring, or may be bonded to different aromatic rings.

The polyamic acid indicated by the formula (e-1) may consist of a single constituent unit, or may consist of 2 or more repeating units.

As the method of producing the polyimide precursor, a conventionally known process may be applied. For example, (1) a process of synthesizing a polyamic acid which is a precursor from an acid dianhydride and a diamine; (2) a process of synthesizing a polyamide precursor by reacting a diamino compound or its derivative at a carboxylic acid of an ester acid or amic acid monomer which are synthesized by reacting a primary alcohol, amino compound, epoxy compound or the like with an acid dianyhydride; and the like may be mentioned.

As the acid dianhydride applicable to the reaction for obtaining the polyimide precursor, aliphatic tetracarboxylic acid dianhydrides such as ethylenetetracarboxylic acid dianhydride, butanetetracarboxylic acid dianhydride, cyclobutanetetracarboxylic acid dianhydride, methylcyclobutanetetracarboxylic acid dianhydride, and cyclopentanetetracarboxylic acid dianhydride; aromatic tetracarboxylic acid dianhydrides such as pyromellitic dianhydride, 3,3',4,4'-benzophenonetetracarboxylic acid dianhydride, 2,2',3,3'-benzophenonetetracarboxylic acid dianhydride, 2,3',3,4'-benzophenonetetracarboxylic acid dianhydride, 3,3',4,4'-biphenyltetracarboxylic acid dianhydride, 2,2',3,3'-biphenyltetracarboxylic acid dianhydride, 2,3',3,4'-biphenyltetracarboxylic acid dianhydride, 2,2',6,6'-biphenyltetracarboxylic acid dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulphone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoroproane dianhydride, 2,2-bis(2,3-dicarboxyphenyl)-1,1,1,3,3,3-hexafluoroproane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexafluoroproane dianhydride, 2,2-bis{4-[3-(1,2-dicarboxy)phenoxy]phenyl}-1,1,1,3,3,3-hexafluoroproane dianhydride, 2,3,6,7-naphthalenetetracarboxylic dianhydride, 1,1,1,3,3,3-hexafluoro-2,2-bis(2,3- or 3,4-dicarboxyphenyl)propane dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, pyridinetetracarboxylic dianhydride, sulfonyldiphthalic acid anhydride, m-terphenyl-3,3',4,4'-tetracarboxylic dianhydride, and p-terphenyl-3,3',4,4'-tetracarboxylic dianhydride may be mentioned.

These acid dianhydrides may be used alone or in combinations of two or more kinds.

As the diamine applicable to the reaction for obtaining the polyimide precursor, for example, aromatic amines such as p-phenyline diamine, m-phenyline diamine, o-phenyline diamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoro propane, 2,2-bis[4-(4-aminophenoxy)phenyl]-1,1,1,3,3,3-hexafluoro propane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)

benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, 4,4'-bis[4-(4-aminophenoxy)phenoxy]diphenyl sulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindan, and 6,6'-bis(4-aminophenoxy)-3,3,3',3'-tetramethyl-1,1'-spirobiindan; aliphatic amines such as 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3-aminopropoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethyleneglycolbis(3-aminopropyl)ether, diethyleneglycolbis(3-aminopropyl)ether, triethyleneglycolbis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane; alicyclic amines such as 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocylohexyl)methane, 2,6-bis(aminomethyl)bicyclo[2.2.1]heptane, and 2,5-bis(aminomethyl)bicyclo[2.2.1]heptane; and the like may be mentioned. Further, it is also possible to use a diamine where part or all of the hydrogen atoms on the aromatic rings of the above diamines are substituted with a substituent group selected from the group consisting of a fluoro group, methyl group, methoxy group, trifluoromethyl group, and trifluoromethoxy group.

These diamines may be used alone or in combinations of two or more kinds.

The content of the polyimide precursor is preferably 50 to 99 mass % with respect to the solid content of the negative-type photosensitive resin composition of the fourth embodiment, and more preferably 70 to 95 mass %. With the above range, it is possible to improve the coating film formation capability.

The negative-type photosensitive resin composition of the fourth embodiment, as described above, comprises a compound represented by the formula (1). This compound has favorable solubility in an organic solvent, and further, when included in a negative-type photosensitive resin composition, can provide favorable micropatterning property.

The content of the compound represented by the formula (1) is preferably 0.01 to 40 parts by mass with respect to 100 parts by mass of the polyimide precursor. With the above range, it is possible to obtain favorable developability, while also obtaining favorable micropatterning property.

As the organic solvent in the negative-type photosensitive resin composition of the fourth embodiment, the organic solvents listed as examples in the negative-type photosensitive resin composition of the first embodiment may be mentioned. Among these, polar solvents such as propylene glycol monomethyl ether, methyl ethyl ketone, cyclopentanone, cyclohexanone, ethyl acetate, propylene glycol monomethyl ether acetate, N,N-dimethylacetoamide, N-methyl-2-pyrrolidone, γ-butyrolactone and the like, and aromatic hydrocarbons such as toluene and the like, and mixtures thereof, are preferable.

The content of the organic solvent is preferably an amount such that the solid content concentration of the negative-type photosensitive resin composition of the fourth embodiment is 1 to 50 mass %, and more preferably an amount such that the solid content concentration is 5 to 30 mass %.

(5) Negative-Type Photosensitive Resin Composition of the Fifth Embodiment

The negative-type photosensitive resin composition of the fifth embodiment comprises an epoxy resin, a compound represented by the formula (1), and an organic solvent.

As the epoxy resin in the negative-type photosensitive resin composition of the fifth embodiment, for example, a bisphenol A-type epoxy resin derived from bisphenol A and epichlorohydrin, a bisphenol F-type epoxy resin derived from bisphenol F and epichlorohydrin, a bisphenol S-type epoxy resin, a phenol novolak-type epoxy resin, a cresol novoloak-type epoxy resin, a bisphenol A novolak-type epoxy resin, a bisphenol F novolak-type epoxy resin, an alicyclic epoxy resin, a diphenyl ether-type epoxy resin, a hydroquinone-type epoxy resin, a naphthalene-type epoxy resin, a biphenyl-type epoxy resin, a fluorene-type epoxy resin, a polyfunctional-type epoxy resin such as a trifunctional-type epoxy resin or tetrafunctional-type epoxy resin, a glycidyl ester-type epoxy resin, a glycidyl amine-type epoxy resin, a hydantoin-type epoxy resin, an isocyanurate-type epoxy resin, an aliphatic chain epoxy resin and the like may be mentioned. These epoxy resins may be halogenated, and may be hydrogenated.

As commercially available epoxy resin products, for example JER Coat 828, 1001, 801N, 806, 807, 152, 604, 630, 871, YX8000, YX8034, and YX4000 by Japan Epoxy Resin Co., Epiclon 830, EXA835LV, HP4032D, and HP820 by DIC Corporation, the EP4100 series, EP4000 series, and EPU series by ADEKA Corporation, the Celloxide series (2021, 2021P, 2083, 2085, 3000 and the like), the EPOLEAD series, and the EHPE series by Daicel Corporation, the YD series, YDF series, YDCN series, YDB series, and phenoxy resins (polyhydroxy polyethers synthesized from bisphenols and epichlorohydrin, and containing epoxy groups at both terminals; YP series and the like) by New Nippon Steel Chemical Co., Ltd., the Denacol series by Nagase Chemtex Corporation, the EPO LIGHT series by Kyoeisha Chemical Co., Ltd., and the like may be mentioned, without being limited to these.

These epoxy resins may be used alone or in combinations of two or more kinds.

The content of the epoxy resin is preferably 55 to 99 mass % with respect to the solid content of the negative-type photosensitive resin composition of the fifth embodiment, more preferably 70 to 95 mass %. With the above range, it is possible to improve the coating film formation capability.

The negative-type photosensitive resin composition of the fifth embodiment, as described above, comprises the compound represented by the formula (1). This compound has favorable solubility in an organic solvent, and further, when included in a negative-type photosensitive resin composition, can provide favorable micropatterning property.

The content of the compound represented by the formula (5) is preferably 1 to 30 parts by mass with respect to 100 parts by mass of the epoxy resin. With the above range, it is possible to obtain favorable developability, while also obtaining favorable micropatterning property.

As the organic solvent of the negative-type photosensitive resin composition of the fifth embodiment, the organic solvents listed as examples in the negative-type photosensitive resin composition of the first embodiment may be mentioned.

Among these, polar solvents such as propylene glycol monomethyl ether, methylethyl ketone, cyclopentanone, cyclohexanone, ethyl acetate, propylene glycol monomethyl ether acetate, N,N-dimethylacetoamide, N-methyl-2-pyrrolidone, γ-butyrolactone and the like, and aromatic hydrocarbons such as toluene and the like, and mixtures thereof are preferable.

The content of the organic solvent is preferably an amount such that the solid content concentration of the negative-type photosensitive resin composition of the fifth embodiment is 1 to 50 mass %, and more preferably an amount such that the solid content concentration is 5 to 30 mass %.

(6) Negative-Type Photosensitive Resin Composition of the Sixth Embodiment

The negative-type photosensitive resin composition of the sixth embodiment comprises an epoxy group-containing polycarbonate resin, a photoacid generator, a compound represented by the formula (1), and an organic solvent.

As the epoxy group-containing polycarbonate resin in the negative-type photosensitive resin composition of the sixth embodiment, for example, it is possible to use one obtained by reacting an epoxy compound having two or more epoxy groups per molecule with a monocarboxylic acid having one or more alcoholic hydroxyl groups per molecule, and further reacting the reaction product thereof with a polybasic acid anhydride.

As the epoxy compound having two or more epoxy groups per molecule, for example, a novolak-type epoxy resin, a bisphenol-type epoxy resin, a trisphenolmethane-type epoxy resin, tris(2,3-epoxypropyl)isocyanurate, biphenyl diglycidyl ether, an alicyclic epoxy resin, and copolymer-type epoxy resins may be mentioned.

As the novolak-type epoxy resin, for example, one obtained by reacting epichlorohydrin or methylepichlorohydrin with a novolak obtained by reacting a phenol such as phenol, cresol, halogenated phenol, alkylphenol and the like with formaldehyde under the presence of an acid catalyst, and the like may be mentioned. As commercially available products, EOCN-102S, EOCN-103S, EOCN-104S, EOCN-1027, EPPN-201, and BREN-S (all by Nippon Kayaku Co., Ltd.); DEN-431, DEN-439 (both by the Dow Chemical Company); N-730, N-770, N-865, N-665, N-673, and VH-4150 (all by Dainippon Ink and Chemicals Co.), and the like may be mentioned.

As the bisphenol-type epoxy resin, for example, one obtained by reacting an epichlorohydrin or methylepichlorohydrin with a bisphenol such as bisphenol A, bisphenol F, bisphenol S, tetrabromobisphenol A and the like; or those obtained by reacting an epichlorohydrin or methylepichlorohydrin with a diglycidyl ether of bisphenol A or bisphenol F and a condensate of the above bisphenol; and the like may be mentioned. As commercially available products, Epicoat 1004, Epicoat 1002, Epicoat 4002, and Epicoat 4004 (all by Yuka Shell Epoxy Co.) and the like may be mentioned.

As the trisphenolmethane-type epoxy resin, for example, one obtained by reacting an epichlorohydrin or methylepichlorohydrin with trisphenolmethane or triscresolmethane may be mentioned. As commercially available products, EPPN-501 and EPPN-502 (both by Nippon Kayaku Co., Ltd.) and the like may be mentioned.

As the alicyclic epoxy resin, Celloxide 2021 by Daicel Corporation, Epomic VG-3101 by Mitsui Chemicals, Inc., E-10315 by Yuka Shell Epoxy Co., and EPB-13 and EPB-27 by Nippon Soda Co., Ltd and the like may be mentioned. Further, as the copolymer-type epoxy resin, CP-50M and CP-50S by NOF Corporation, which are copolymers of glycidyl methacrylate and styrene and α-methylstyrene, or copolymers of glycidyl methacrylate and cyclohexy maleide and the like may be mentioned.

As being especially preferable among these epoxy resins having two or more epoxy groups per molecule, for example cresol novolak-type epoxy resin, phenol novolak-type epoxy resin, bisphenol-type epoxy resin, trisphenolmethane-type epoxy resin and the like may be mentioned. In particular, a condensation polymer of α-hydroxyphenyl-ω-hydropoly(biphenyldimethylene-hydroxyphenylene) and 1-chloro-2,3-epoxypropane; and α-2,3-epoxypropoxyphenyl-ω-hydropoly{2-(2,3-epoxypropoxy)-benzylidine-2,3-epoxypropoxyphenylene} are preferable.

As the monocarboxylic acid having one or more alcoholic hydroxyl groups per molecule, for example, hydroxymonocarboxylic acids such as dimethylolpropionic acid, dimethylol acetate, dimethylol butyrate, dimethylol valerate, dimethylol caproic acetate, hydroxypivulic acid and the like may be mentioned. Among these, monocarboxylic acids having 1 to 5 alcoholic hydroxyl groups per molecule are preferable.

As the polybasic acid anhydride, for example, succinic anhydride, maleic anhydride, phthalic anhydride, tetrahydro phthalic anhydride, hexahydro phthalic anhydride, methylendomethylene tetrahydro phthalic anhydride, trimellitic anhydride, mellitic anhydride and the like.

The reaction of the above described epoxy compound and the above described monocarboxylic acid is preferably of 0.1 to 0.7 mol of the monocarboxylic acid with respect to 1 equivalent of epoxy of the epoxy compound, more preferably 0.2 to 0.5 mol. In this reaction, it is preferable to use an organic solvent which dos not react with the epoxy compound or the polybasic acid anhydride, and which does not have hydroxyl groups or carboxyl groups. Further, a catalyst for promoting the reaction (for example, triphenylphosphine, benzyldimethylamine, trialkylammonium chloride, triphenyl stibine and the like) may be used. In the case of using a catalyst, particularly after the reaction is finished, deactivating the catalyst using an organic peroxide or the like stably maintains the shelf life which is preferable. The content of the catalyst is preferably 0.1 to 10 wt % with respect to the reaction mixture, and the reaction temperature is preferably 60 to 150° C. In this way, it is possible to obtain a reactant from the above described epoxy compound and the above described monocarboxylic acid.

In the reaction between this reactant and a polybasic acid anhydride, the polybasic acid anhydride is preferably reacted in such an amount that the acid value of the finally obtained epoxy group-containing polycarboxylic acid resin is 50 to 150 mgKOH/g. The reaction temperature is preferably 60 to 150° C. In this way, it is possible to obtain an epoxy group-containing polycarboxylic acid.

These epoxy group-containing polycarboxylic acids may be used alone or in combinations of two or more kinds.

The content of the epoxy group-containing polycarboxylic acid is preferably 30 to 80 mass % with respect to the solid content of the negative-type photosensitive resin composition of the sixth embodiment, and more preferably 40 to 70 mass %. With the above range, it is possible to improve the coating film formation capability.

As the photoacid generator in the negative-type photosensitive resin composition of the sixth embodiment, the photoacid generators listed as examples in the negative-type photosensitive resin composition of the second embodiment may be mentioned.

The content of the photoacid generator is preferably 0.5 to 30 mass % with respect to the solid content of the negative-type photosensitive resin composition of the sixth embodiment, more preferably 1 to 20 mass %. With the above range, the curing properties of the negative-type photosensitive resin composition become favorable.

The negative-type photosensitive resin composition of the sixth embodiment, as described above, comprises the compound represented by the formula (1). This compound has favorable solubility in an organic solvent, and further, when included in a negative-type photosensitive resin composition, can provide favorable micropatterning property.

The content of the compound represented by the formula (1) is preferably 1 to 500 parts by mass with respect to 100 parts by mass of the above described photoacid generator, more preferably 50 to 300 parts by mass. With the above range, it is possible to obtain favorable developability, while also obtaining favorable micropatterning property.

The negative-type photosensitive resin composition of the sixth embodiment may further comprise a sensitizer. As the sensitizer, for example, an anthracene compound having an alkoxy group at the 9-position and 10-position (9,10-dialkoxy-anthracene derivative) is preferable. As the alkoxy group, an alkoxy group with a carbon number of 1 to 4 may be mentioned. The 9,10-dialkoxy-anthracene derivative may have a further substituent group. As the substituent group, a halogen atom, alkyl group with a carbon number of 1 to 4, sulfonic acid alkyl ester group, carboxylic acid alkyl ester group and the like may be mentioned. As the alkyl group in the sulfonic acid alkyl ester group or carboxylic acid alkyl ester group, an alkyl group with a carbon number of 1 to 4 may be mentioned. The substitution position of these substituent groups is preferably the 2-position.

As the 9,10-dialkoxy-anthracene derivative, for example, 9,10-dimethoxy-anthracene, 9,10-diethoxy-anthracene, 9,10-dipropoxy-anthracene, 9,10-dimethoxy-2-ethyl-anthracene, 9,10-diethoxy-2-ethyl-anthracene, 9,10-dipropoxy-2-ethyl-anthracene, 9,10-dimethoxy-2-chloro-anthracene, 9,10-dimethoxyanthracene-2-sulfonic acid methyl ester, 9,10-diethoxyanthracene-2-sulfonic acid methyl ester, 9,10-dimethoxyanthracene-2-carboxylic acid methyl ester, and the like may be mentioned.

These compounds may be obtained by treating an anthraquinone derivative with a reducing agent such as zinc dust, hydrosulfite, palladium-carbon, sodium borohydride and the like in an alkali aqueous solution, to make a 9,10-dihdroxyanthracene derivative, and then alkoxylating the 9,10-position with a sulfuric acid ester such as dimethyl sulfate, diethyl sulfate and the like; a toluenesulfonate ester such as methyl toluenesulfonate, ethyl toluenesulfonate, propyl toluenesulfonate, monoethylene glycol toluenesulfonate and the like; or a benzenesulfonate ester such as methyl benzenesulfonate, ethyl benzenesulfonate, propyl benzenesulfonate and the like.

These sensitizing agents may be used alone or in combinations of two or more kinds.

The content of the sensitizing agent is preferably a molar ratio of 0.1 to 6 with respect to the above described photoacid generator, more preferably 0.2 to 4. With the above described range, the sensitivity and curing properties of the negative-type photosensitive resin composition become favorable.

The negative-type photosensitive resin composition of the sixth embodiment may further comprise a modifying component for adjusting the moisture resistance, heat resistance, adhesiveness and the like. These modifying components may be ones which are themselves cured by heat or ultraviolet radiation, or may be one which react with a residual hydroxyl group or carboxyl group or the like of an epoxy group-containing polycarboxylic acid resin by heat or ultraviolet radiation. Specifically, an epoxy compound having one or more epoxy groups per molecule, a melamine derivative (for example, hexamethoxy melamine, hexabutoxylated melamine, condensed hexamethoxy melamine and the like), bisphenol A-type compounds (for example, tetramethyloyl bisphenol A and the like), oxazoline compounds and the like may be mentioned.

As the epoxy compound having one or more epoxy group per molecule, bisphenol A-type epoxy resins such as Epikote 1009 and 1031 (both manufactured by Yuka Shell Co.), Epiclon N-3050 and N-7050 (both manufactured by Dainippon Ink and Chemicals Co.), and DER-642U and DER-673MF (both manufactured by the Dow Chemical Company); hydrogenated bisphenol A-type epoxy resins such as ST-2004 and ST-2007 (both manufactured by Tohto Chemical Industry Co., Ltd.); hydrogenated bisphenol F-type epoxy resins such as YDF-2004 and YDF 2007 (both manufactured by Tohto Chemical Industry Co., Ltd.); brominated bisphenol A-type expoxy resins such as SR-BBS and SR-TBA-400 (both manufactured by Sakamoto Yakuhin Kogyo Co., Ltd.), and YDB-600 and YDB-715 (both manufactured by Tohto Chemical Industry Co., Ltd.); novolak-type epoxy resins such as EPPN-201, EOCN-103, EOCN-1020, and BREN (all manufactured by Nippon Kayaku Co., Ltd.); novolak-type epoxy resins of bisphenol A such as Epiclon N-880 manufactured by Dainippon Ink and Chemicals Co.; rubber-modified epoxy resins such as Epiclon TSR-601 manufactured by Dainippon Ink and Chemicals Co. and R-1415-1 manufactured by A.C.R. Co.; bisphenyl S-type epoxy resins such as EBPS-200 manufactured by Nippon Kayaku Co., Ltd. and Epiclon EXA-1514 manufactured by Dainippon Ink and Chemicals Co.; diglycidyl terephthalates such as Purenmer DGT manufactured by NOF Corporation; triglycidyl isocyanurates such as TEPIC manufactured by Nissan Chemical Industries Ltd.; bixylenol-type epoxy resins such as YX-4000 manufactured by Yuka Shell Co.; bisphenol-type epoxy resins such as YL-6056 manufactured by Yuka Shell Co.; alicyclic epoxy resins such as Celloxide 2021 manufactured by Daicel Corporation; and the like may be mentioned.

The content of the modifying components is preferably 50 mass % or less with respect to the solid content of the negative-type photosensitive resin composition of the sixth embodiment, more preferably 30 mass % or less.

The negative-type photosensitive resin composition of the sixth embodiment, in order to further improve the characteristics such as the adhesiveness, hardness and the like, may further comprise a well-known filler such as barium sulfate, barium titanate, silica, talc, clay, magnesium carbonate, calcium carbonate, aluminum oxide, mica and the like.

The content of the filler is preferably 60 mass % or less with respect to the solid content of the negative-type photosensitive resin composition of the sixth embodiment, more preferably 5 to 40 mass %.

The negative-type photosensitive resin composition of the sixth embodiment may further comprise a coloring agent such as phthalocyanine blue, phthalocyanine green, disazo yellow, crystal violet, titanium oxide, carbon black and the like; a thickener such as ultrafine powdered silica, montmorillonite and the like, an anti-foaming agent and/or leveling agent such as a silicone high polymer, a fluorinated high polymer and the like; an adhesiveness imparting agent such as a silane coupling agent and the like.

As the organic solvent of the negative-type photosensitive resin composition of the sixth embodiment, the organic solvents listed as examples in the negative-type photosensitive resin composition of the first embodiment may be mentioned.

The content of the organic solvent is preferably an amount such that the solid content concentration of the negative-type photosensitive resin composition of the sixth embodiment is 1 to 50 mass %, and more preferably an amount such that the solid content concentration is 5 to 30 mass %.

Method of Preparation of the Negative-Type Photosensitive Resin Composition

The negative-type photosensitive resin composition of the present invention is prepared by mixing each of the above-described components with a stirring machine. In order that the prepared negative-type photosensitive resin composition becomes homogenous, the negative-type photosensitive resin composition may be filtered using a membrane filter or the like.

Pattern Forming Method

The pattern forming method according to the present invention is one comprising forming a coating film or molded body using the negative-type photosensitive resin composition according to the present invention, irradiating an electromagnetic wave in a predetermined pattern shape onto the coating film or molded body, and performing development.

More specifically, first, a coating film or molded body is formed by a suitable coating method or molding method. For example, the negative-type photosensitive resin composition may be coated with a contact transfer-type coating applicator such as a roll coater, reverse coater, bar coater and the like, or a non-contact type coating applicator such as a spinner (rotary coating applicator), curtain flow coater and the like, and dried to form the coating film. The drying method is not particularly limited, and for example, (1) a method of carrying out pre-baking for 60 to 120 seconds on a hot plate at a temperature of 80 to 120° C., preferably 90 to 100° C., (2) a method of leaving at room temperature for several hours to several days, or (3) a method of inserting into a warm air heater or infrared ray heater for several tens of minutes to several hours and removing the solvent, and the like may be mentioned.

Next, an electromagnetic wave is irradiated in a predetermined pattern shape onto the coating film or molded body to perform exposure. The electromagnetic wave may be irradiated via a negative-type mask, or may be directly irradiated. The light exposure differs depending on the composition of the negative-type photosensitive resin composition, but for example, about 5 to 500 mJ/cm$^2$ is preferable.

Next, the coating film or molded body after the exposure is developed with a developing solution to pattern it into the desired shape. The developing method is not particularly limited, and for example, it is possible to use an immersion method or a spray method or the like. Examples of the developing solution include an organic one such as monoethanol amine, diethanol amine, triethanol amine; and an aqueous solution of a sodium hydroxide, potassium hydroxide, sodium carbonate, ammonia, quaternary ammonium salts, or the like.

For the pattern after the development, it is preferable to carry out post-baking at about 200 to 250° C.

Cured Film, Insulating Film, Color Filter, and Display Device

The cured film, insulating film, and color filter according to the present invention are formed using the negative-type photosensitive resin composition according to the present invention.

For example, it is possible to obtain a transparent cured film or insulating film by forming a coating film using a negative-type photosensitive resin composition which does not include a coloring agent, and subjecting the coating film to heating and/or irradiation with an electromagnetic wave. Such a cured film or insulating film is used, for example, as a planarized film of a liquid crystal display device or an organic EL device or the like, or as an interlayer insulating film.

Further, this cured film or insulating film may be patterned. A patterned cured film or insulating film can be obtained by irradiating an electromagnetic wave in a predetermined pattern shape onto the coating film, and performing development, as described above. The patterned cured film is used, for example, as a spacer or partition of a liquid crystal display device or organic EL display or the like.

Further, it is also possible to form, for example, a pixel of a color filter or a black matrix of a liquid crystal display, by forming a coating film using a negative-type photosensitive resin composition including a coloring agent (in particular, the negative-type photosensitive resin composition of the first embodiment), irradiating an electromagnetic wave in a predetermined pattern shape onto the coating film, and performing development.

The display device according to the present invention is one provided with such a cured film, insulating film, or color filter. Examples of the display device include a liquid crystal display device or an organic EL display device.

EXAMPLES

Hereinafter, the present invention will be described more specifically with examples, but the scope of the present invention is not limited to these examples.

Compounds represented by the Formula (1) and Comparative Compounds

Compounds 1 to 20 represented by the following formulas were prepared as the compounds represented by the formula (1). Synthesis methods of the compounds 1 to 20 are described below. Also, for the purpose of comparison, Comparative Compounds 1 to 11 represented by the following formulas were prepared.

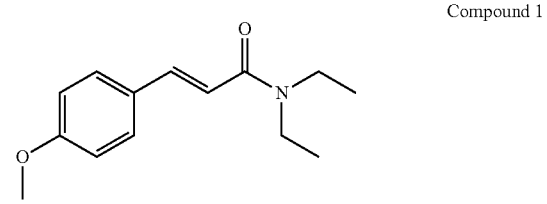

Compound 1

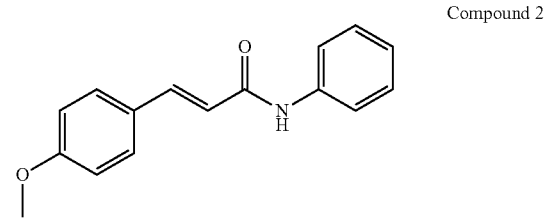

Compound 2

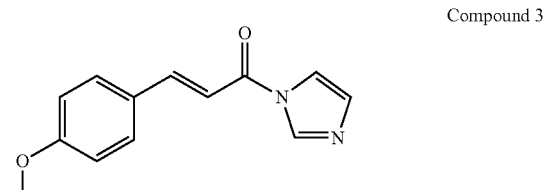

Compound 3

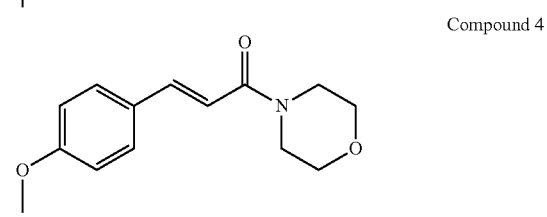

Compound 4

-continued
Compound 5
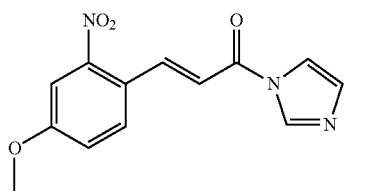
Compound 6
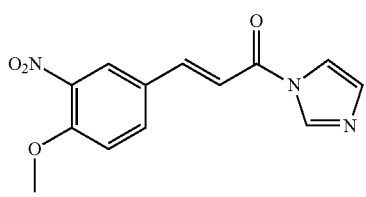
Compound 7
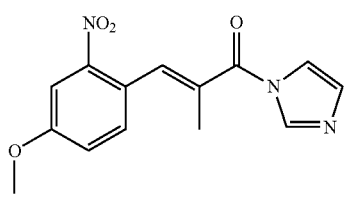
Compound 8
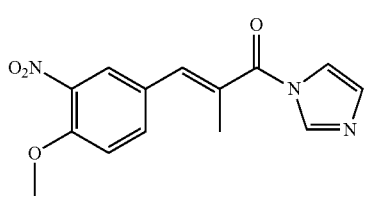
Compound 9
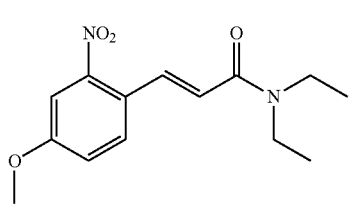
Compound 10
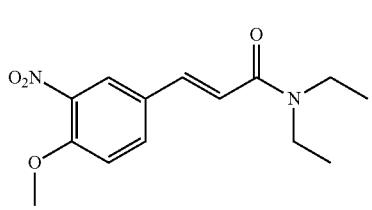
Compound 11
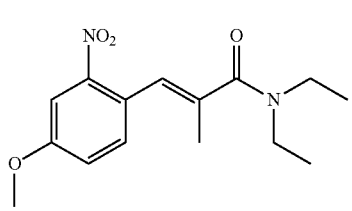
Compound 12
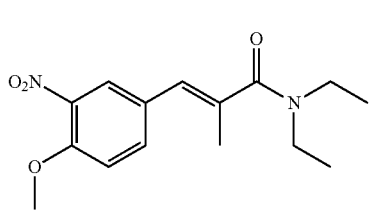
Compound 13
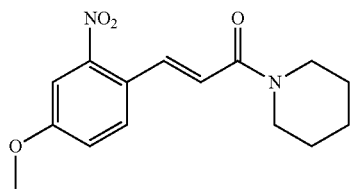
Compound 14
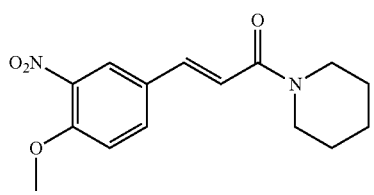
Compound 15
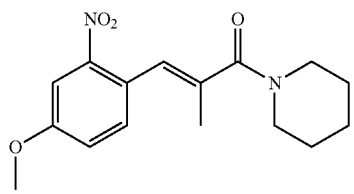
Compound 16
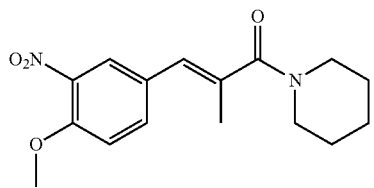
Compound 17
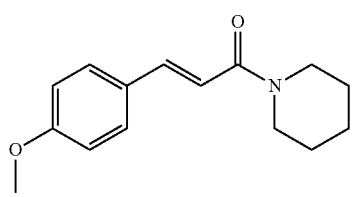
Compound 18
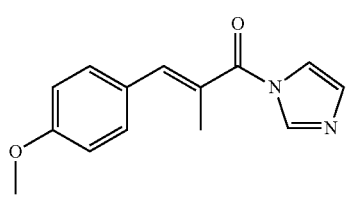
Compound 19
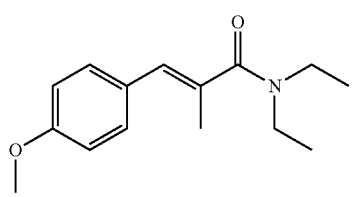
Compound 20
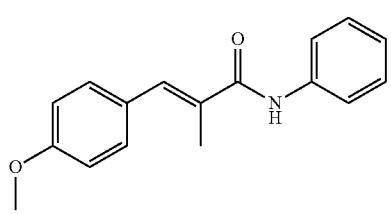

-continued

Comparative Compound 1

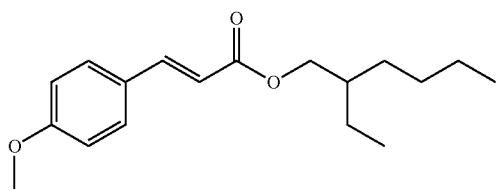

Comparative Compound 2

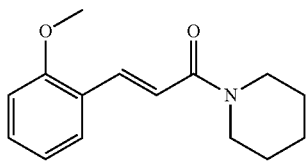

Comparative Compound 3

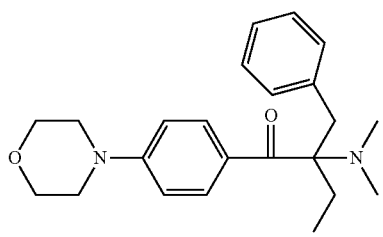

Comparative Compound 4

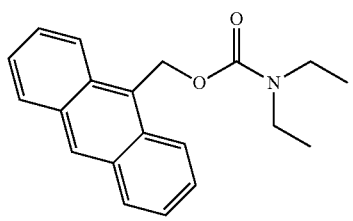

Comparative Compound 5

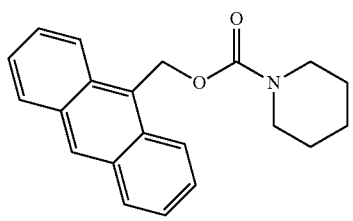

Comparative Compound 6

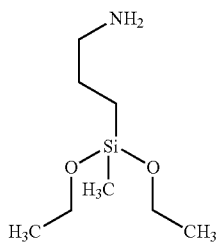

Comparative Compound 7

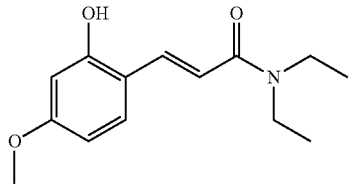

-continued

Comparative Compound 8

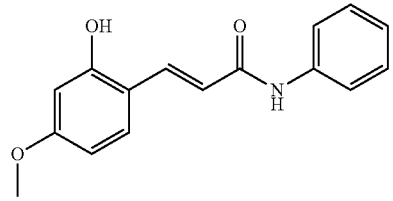

Comparative Compound 9

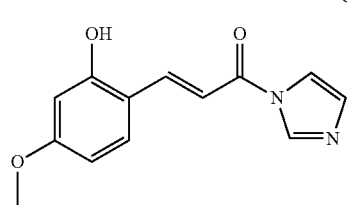

Comparative Compound 10

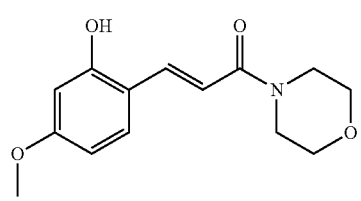

Comparative Compound 11

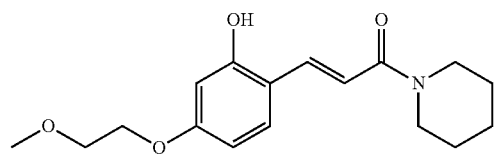

[Synthesis Method of Compound 1]

5.90 g (30 mmol) of 3-(4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated $NaHCO_3$ aqueous solution, and 1N hydrochloric acid, drying with magnesium sulfate was performed, followed by concentration under a reduced pressure. Corresponding Compound 1 (4.65 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 2]

5.90 g (30 mmol) of 3-(4-methoxyphenyl)acrylic acid chloride was dissolved in 50 ml of dry ether, and then 4.59 ml (equivalence ratio: 1.1) of triethylamine and 3.07 ml (equivalence ratio: 1.1) of aniline were added, followed by stirring for 1 hour at room temperature. After washing with 50 ml of water, 50 ml of a saturated $NaHCO_3$ aqueous solution, and 1N hydrochloric acid, drying with magnesium sulfate was performed, followed by concentration under a reduced pressure. Corresponding Compound 2 (6.31 g, 25 mmol) was obtained by performing purification by column chromatography using hexane-ethyl acetate as a developing solvent and silica gel as a supporting carrier. Yield based on acrylic acid chloride was 83%.

[Synthesis Method of Compound 3]

5.90 g (30 mmol) of 3-(4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 3 (3.41 g, 15 mmol) was obtained by performing purification by column chromatography using hexane-ethyl acetate as a developing solvent and silica gel as a supporting carrier. Yield based on acrylic acid chloride was 50%.

[Synthesis Method 1 of Compound 4]

5.90 g (30 mmol) of 3-(4-methoxyphenyl)acrylic acid chloride was dissolved in 50 ml of dry ether, and then 4.59 ml (equivalence ratio: 1.1) of triethylamine and 2.25 ml (equivalence ratio: 1.1) of morpholine were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 4 (3.41 g, 15 mmol) was obtained by performing purification by column chromatography using hexane-ethyl acetate as a developing solvent and silica gel as a supporting carrier. Yield based on acrylic acid chloride was 50%.

[Synthesis Method 2 of Compound 4]

10.78 g (30 mmol) of 4-methoxycinnamic acid p-nitrophenyl ester was dissolved in 50 ml of dry ether, and then 2.25 ml (equivalence ratio: 1.1) of morpholine was added, followed by stirring for 4 hours at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 4 (6.62 g, 15 mmol) was obtained by performing purification by column chromatography using hexane-ethyl acetate as a developing solvent and silica gel as a supporting carrier. Yield based on cinnamic acid phenyl ester was 97%.

[Synthesis Method of Compound 5]

7.25 g (30 mmol) of 3-(2-nitro-4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 5 (4.08 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 6]

7.25 g (30 mmol) of 3-(3-nitro-4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 6 (4.08 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 7]

7.67 g (30 mmol) of 2-methyl-3-(2-nitro-4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 7 (4.29 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 8]

7.67 g (30 mmol) of 2-methyl-3-(3-nitro-4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 8 (3.41 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 9]

7.25 g (30 mmol) of 3-(2-nitro-4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 9 (5.55 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 10]

7.25 g (30 mmol) of 3-(3-nitro-4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 10 (5.55 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 11]

7.67 g (30 mmol) of 2-methyl-3-(2-nitro-4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated NaHCO₃ aqueous solution, and 1N hydrochloric acid, drying with magnesium sulfate was performed, followed by concentration under a reduced pressure. Corresponding Compound 11 (5.83 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 12]

7.67 g (30 mmol) of 2-methyl-3-(3-nitro-4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 12 (5.83 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 13]

7.25 g (30 mmol) of 3-(2-nitro-4-methoxyphenyl)acrylic acid chloride was dissolved in 50 ml of dry ether, and then 4.59 ml (equivalence ratio: 1.1) of triethylamine and 2.81 ml (equivalence ratio: 1.1) of piperidine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 13 (5.62 g, 23 mmol) was obtained by performing purification by column chromatography using hexane-ethyl acetate as a developing solvent and silica gel as a supporting carrier. Yield based on acrylic acid chloride was 77%.

[Synthesis Method of Compound 14]

7.25 g (30 mmol) of 3-(3-nitro-4-methoxyphenyl)acrylic acid chloride was dissolved in 50 ml of dry ether, and then 4.59 ml (equivalence ratio: 1.1) of triethylamine and 2.81 ml (equivalence ratio: 1.1) of piperidine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 14 (5.62 g, 23 mmol) was obtained by performing purification by column chromatography using hexane-ethyl acetate as a developing solvent and silica gel as a supporting carrier. Yield based on acrylic acid chloride was 67%.

[Synthesis Method of Compound 15]

7.67 g (30 mmol) of 2-methyl-3-(2-nitro-4-methoxyphenyl)acrylic acid chloride was dissolved in 50 ml of dry ether, and then 4.59 ml (equivalence ratio: 1.1) of triethylamine and 2.81 ml (equivalence ratio: 1.1) of piperidine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 15 (5.83 g, 23 mmol) was obtained by performing purification by column chromatography using hexane-ethyl acetate as a developing solvent and silica gel as a supporting carrier. Yield based on acrylic acid chloride was 67%.

[Synthesis Method of Compound 16]

7.67 g (30 mmol) of 2-methyl-3-(3-nitro-4-methoxyphenyl)acrylic acid chloride was dissolved in 50 ml of dry ether, and then 4.59 ml (equivalence ratio: 1.1) of triethylamine and 2.81 ml (equivalence ratio: 1.1) of piperidine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 16 (5.83 g, 23 mmol) was obtained by performing purification by column chromatography using hexane-ethyl acetate as a developing solvent and silica gel as a supporting carrier. Yield based on acrylic acid chloride was 67%.

[Synthesis Method of Compound 17]

5.90 g (30 mmol) of 3-(4-methoxyphenyl)acrylic acid chloride was dissolved in 50 ml of dry ether, and then 4.59 ml (equivalence ratio: 1.1) of triethylamine and 2.81 ml (equivalence ratio: 1.1) of piperidine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 17 (3.41 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 18]

6.32 g (30 mmol) of 2-methyl-3-(4-methoxyphenyl)acrylic acid chloride was dissolved in 50 ml of dry ether, and then 4.59 ml (equivalence ratio: 1.1) of triethylamine and 2.25 ml (equivalence ratio: 1.1) of imidazole were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 18 (3.62 g, 15 mmol) was obtained by performing purification by column chromatography using hexane-ethyl acetate as a developing solvent and silica gel as a supporting carrier. Yield based on acrylic acid chloride was 50%.

[Synthesis Method of Compound 19]

6.32 g (30 mmol) of 2-methyl-3-(4-methoxyphenyl)acrylic acid chloride was dissolved in 50 ml of dry ether, and then 4.59 ml (equivalence ratio: 1.1) of triethylamine and 2.41 ml (equivalence ratio: 1.1) of diethylamine were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 19 (4.93 g, 20 mmol) was obtained by performing purification by column chromatography using hexane-ethyl acetate as a developing solvent and silica gel as a supporting carrier. Yield based on acrylic acid chloride was 67%.

[Synthesis Method of Compound 20]

6.32 g (30 mmol) of 2-methyl-3-(4-methoxyphenyl)acrylic acid chloride was dissolved in 50 ml of dry ether, and then 4.59 ml (equivalence ratio: 1.1) of triethylamine and 3.07 ml (equivalence ratio: 1.1) of aniline were added, followed by stirring for 1 hour at room temperature. After washing with 50 ml of water, 50 ml of a saturated NaHCO$_3$ aqueous solution, and 1N hydrochloric acid, drying with magnesium sulfate was performed, followed by concentration under a reduced pressure. Corresponding Compound 20 (4.29 g, 25 mmol) was obtained by performing purification by column chromatography using hexane-ethyl acetate as a developing solvent and silica gel as a supporting carrier. Yield based on acrylic acid chloride was 83%.

[Evaluation]

For each of Compounds 1 to 20 and Comparative Compounds 1 to 10, a wavelength (λmax) at an absorption spectrum peak and a gram absorption coefficient at λmax were measured. Also, solubility of Compounds 1 to 20 and Comparative Compounds 1 to 10 to propylene glycol monomethyl ether acetate (PM) and cyclohexanone (AN) were confirmed. The results are shown in Table 1 below.

TABLE 1

| | $\lambda_{max}$ (nm) | Gram Absorption Coefficient at $\lambda_{max}$ | Solubility to Solvent | |
|---|---|---|---|---|
| | | | PM | AN |
| Compound 1 | 309 | 90 | >50 mass % | >50 mass % |
| Compound 2 | 317 | 117 | >50 mass % | >50 mass % |
| Compound 3 | 293 | 81 | >50 mass % | >50 mass % |
| Compound 4 | 310 | 79 | >50 mass % | >50 mass % |
| Compound 5 | 332 | 121 | >50 mass % | >50 mass % |
| Compound 6 | 344 | 86 | >50 mass % | >50 mass % |
| Compound 7 | 339 | 137 | >50 mass % | >50 mass % |
| Compound 8 | 351 | 98 | >50 mass % | >50 mass % |
| Compound 9 | 342 | 102 | >50 mass % | >50 mass % |
| Compound 10 | 354 | 119 | >50 mass % | >50 mass % |
| Compound 11 | 349 | 107 | >50 mass % | >50 mass % |
| Compound 12 | 361 | 127 | >50 mass % | >50 mass % |
| Compound 13 | 313 | 87 | >50 mass % | >50 mass % |
| Compound 14 | 322 | 94 | >50 mass % | >50 mass % |
| Compound 15 | 313 | 92 | >50 mass % | >50 mass % |
| Compound 16 | 323 | 105 | >50 mass % | >50 mass % |
| Compound 17 | 281 | 74 | >50 mass % | >50 mass % |
| Compound 18 | 301 | 84 | >50 mass % | >50 mass % |
| Compound 19 | 318 | 86 | >50 mass % | >50 mass % |
| Compound 20 | 323 | 79 | >50 mass % | >50 mass % |
| Comparative Compound 1 | 309 | 78 | >50 mass % | >50 mass % |
| Comparative Compound 2 | 275 | 76 | <1 mass % | <1 mass % |
| Comparative Compound 3 | 321 | 53 | >30 mass % | >50 mass % |
| Comparative Compound 4 | 255 | 477 | >50 mass % | >50 mass % |
| Comparative Compound 5 | 255 | 464 | >50 mass % | >50 mass % |
| Comparative Compound 6 | 212 | 143 | >50 mass % | >50 mass % |
| Comparative Compound 7 | 304 | 72 | >50 mass % | >50 mass % |
| Comparative Compound 8 | 315 | 96 | >50 mass % | >50 mass % |
| Comparative Compound 9 | 290 | 65 | >50 mass % | >50 mass % |
| Comparative Compound 10 | 305 | 58 | >50 mass % | >50 mass % |

As is apparent from Table 1, each of Compounds 1 to 20 had a favorable solubility to propylene glycol monomethyl ether acetate (PM) and cyclohexanone (AN).

Preparation of Negative-Type Photosensitive Resin Composition

Example 1

All of the following components were mixed and then dissolved in a mixed solvent with a mass ratio of 3-methoxybutyl acetate (MA)/propylene glycol monomethyl ether acetate (PM)/cyclohexanone (AN)=60/20/20 to prepare a negative-type photosensitive resin composition having a solid content concentration of 15 mass %.

Alkali-Soluble Resin

Resin (A-1) (solid content: 55%; solvent: 3-methoxybutyl acetate): 310 parts by mass Photopolymerizable Monomer Dipentaerythritol hexaacrylate (DPHA): 65 parts by mass Photopolymerization Initiator "OXE-02" (trade name; manufactured by BASF Corporation): 15 parts by mass Compound Represented by the Formula (1)

Compound 1 described above: 5 parts by mass

Coloring Agent

A carbon dispersion "CF Black" (trade name; manufactured by Mikuni Color Ltd.; solid content: 25%; solvent: 3-methoxybutyl acetate): 1200 parts by mass Synthesis method of the resin (A-1) is as follows. A 500-ml 4-necked flask was charged with 235 g of a bisphenol fluorine-type epoxy resin (epoxy equivalent: 235), 110 mg of tetramethylammonium chloride, 100 mg of 2,6-di-tert-butyl-4-methylphenol, and 72.0 g of acrylic acid, and the components were heated and dissolved at 90° C. to 100° C. while blowing the air into the flask at a rate of 25 ml/min. Next, the solution in the state of white turbidity was gradually heated to 120° C. so as to achieve complete dissolution. In this step, the solution gradually became transparent and viscous, but stirring was performed continually as before. An acid value was measured during the stirring, and the heating with stirring was continued until the acid value fell below 1.0 mgKOH/g. It took 12 hours to reach the target acid value. After that, cooling to room temperature was performed to obtain bisphenol fluorine-type epoxy acrylate represented by the following formula (a-4) which was in the form of a colorless and transparent solid.

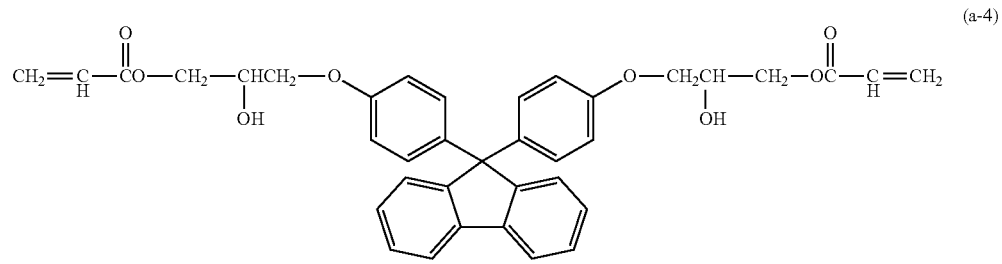

(a-4)

Subsequently, after dissolving 307.0 g of the thus-obtained bisphenol fluorine-type epoxy acrylate by adding thereto 600 g of 3-methoxybutyl acetate, 80.5 g of benzophenonetetracarboxylic acid dianhydride and 1 g of tetraethyl ammonium bromide were mixed, followed by gradually heating to allow a reaction to take place at 110° C. to 115° C. for 4 hours. After confirming disappearance of the acid anhydride group, 38.0 g of 1,2,3,6-tetrahydrophthalic acid anhydride was mixed, and a reaction was allowed to take place at 90° C. for 6 hours to obtain the resin (A-1). The disappearance of the acid anhydride group was confirmed by IR spectrum.

The resin (A-1) is equivalent to the compound represented by the formula (a-1).

Examples 2 to 20 and Comparative Examples 1 to 10

Negative-type photosensitive resin compositions were prepared in the same manner as Example 1, except that Compounds 2 to 20 and Comparative Compounds 1 to 10 described above, respectively, were used instead of Compound 1.

Evaluation

The negative-type photosensitive resin compositions of Examples 1 to 20 and Comparative Examples 1 to 10 were coated onto a glass substrate (100 mm×100 mm) by using a spin coater, and pre-baking was performed at 90° C. for 120 seconds to form coating films having a film thickness of 1.0 µm. Next, the coating film was irradiated with ultraviolet rays via a negative mask in which a 20-µm line pattern was formed, by using a mirror projection aligner (product name: TME-150RTO, manufactured by Topcon Corporation) with an exposure gap of 50 µm. The light exposures were set to four levels of 20, 40, 60, and 120 J/cm². The coating film after the exposure was developed in a 0.04-mass % KOH aqueous solution at 26° C. for 40 seconds and then was post-baked at 230° C. for 30 minutes, thereby forming a line pattern.

Likewise, the coating film was irradiated with ultraviolet rays via negative masks in each of which a 2-, 5-, 10-, or 20-µm line pattern was formed, at an exposure gap of 50 µm. The light exposure was set to 10 mJ/cm². The coating film after the exposure was developed in a 0.04-mass % KOH aqueous solution at 26° C. for 40 seconds and then was post-baked at 230° C. for 30 minutes, thereby forming a line pattern.

An OD value per 1 µm of the film thickness of each of the formed line patterns was measured by using an OD measurement device, D-200II (product of GretagMacbeth LLC).

Also, the line pattern was observed with an optical microscope to evaluate the pattern straightness. The pattern straightness was evaluated as "good" if there were no curves or irregularities on the line edges, and as "poor" if there were curves or irregularities.

Further, pattern adhesion was evaluated by observing the line pattern with an optical microscope. The pattern adhesion was evaluated as "good" if the line pattern was formed without detachment from the substrate, and as "none" if the line pattern was not formed due to detachment from the substrate.

Further, the existence of residues in the unexposed portions after the development was evaluated.

The results are shown in Tables 2 to 5 below.

TABLE 2

| | Compound of Formula (1) | OD Value | Pattern Straightness | | | |
|---|---|---|---|---|---|---|
| | | | 20 mJ | 40 mJ | 60 mJ | 120 mJ |
| Example 1 | Compound 1 | 4.5 | Good | Good | Good | Good |
| Example 2 | Compound 2 | 4.5 | Good | Good | Good | Good |
| Example 3 | Compound 3 | 4.5 | Good | Good | Good | Good |
| Example 4 | Compound 4 | 4.5 | Good | Good | Good | Good |
| Example 5 | Compound 5 | 4.5 | Good | Good | Good | Good |
| Example 6 | Compound 6 | 4.5 | Good | Good | Good | Good |
| Example 7 | Compound 7 | 4.5 | Good | Good | Good | Good |
| Example 8 | Compound 8 | 4.5 | Good | Good | Good | Good |
| Example 9 | Compound 9 | 4.5 | Good | Good | Good | Good |
| Example 10 | Compound 10 | 4.5 | Good | Good | Good | Good |
| Example 11 | Compound 11 | 4.5 | Good | Good | Good | Good |
| Example 12 | Compound 12 | 4.5 | Good | Good | Good | Good |
| Example 13 | Compound 13 | 4.5 | Good | Good | Good | Good |
| Example 14 | Compound 14 | 4.5 | Good | Good | Good | Good |
| Example 15 | Compound 15 | 4.5 | Good | Good | Good | Good |
| Example 16 | Compound 16 | 4.5 | Good | Good | Good | Good |
| Example 17 | Compound 17 | 4.5 | Good | Good | Good | Good |
| Example 18 | Compound 18 | 4.5 | Good | Good | Good | Good |
| Example 19 | Compound 19 | 4.5 | Good | Good | Good | Good |
| Example 20 | Compound 20 | 4.5 | Good | Good | Good | Good |

TABLE 3

| | Compound of Formula (1) | Pattern Adhesion | | | | |
|---|---|---|---|---|---|---|
| | | 2 µm | 5 µm | 10 µm | 20 µm | Residue |
| Example 1 | Compound 1 | Good | Good | Good | Good | None |
| Example 2 | Compound 2 | Good | Good | Good | Good | None |
| Example 3 | Compound 3 | Good | Good | Good | Good | None |
| Example 4 | Compound 4 | Good | Good | Good | Good | None |
| Example 5 | Compound 5 | Good | Good | Good | Good | None |
| Example 6 | Compound 6 | Good | Good | Good | Good | None |
| Example 7 | Compound 7 | Good | Good | Good | Good | None |
| Example 8 | Compound 8 | Good | Good | Good | Good | None |
| Example 9 | Compound 9 | Good | Good | Good | Good | None |
| Example 10 | Compound 10 | Good | Good | Good | Good | None |
| Example 11 | Compound 11 | Good | Good | Good | Good | None |
| Example 12 | Compound 12 | Good | Good | Good | Good | None |
| Example 13 | Compound 13 | Good | Good | Good | Good | None |
| Example 14 | Compound 14 | Good | Good | Good | Good | None |
| Example 15 | Compound 15 | Good | Good | Good | Good | None |
| Example 16 | Compound 16 | Good | Good | Good | Good | None |
| Example 17 | Compound 17 | Good | Good | Good | Good | None |
| Example 18 | Compound 18 | Good | Good | Good | Good | None |
| Example 19 | Compound 19 | Good | Good | Good | Good | None |
| Example 20 | Compound 20 | Good | Good | Good | Good | None |

TABLE 4

| | Comparative Compound | OD Value | Pattern Straightness | | | |
|---|---|---|---|---|---|---|
| | | | 20 mJ | 40 mJ | 60 mJ | 120 mJ |
| Comparative Example 1 | Comparative Compound 1 | 4.5 | Poor | Poor | Good | Good |
| Comparative Example 2 | Comparative Compound 2 | 4.5 | Poor | Poor | Good | Good |
| Comparative Example 3 | Comparative Compound 3 | 4.5 | Poor | Good | Good | Good |
| Comparative Example 4 | Comparative Compound 4 | 4.5 | Poor | Poor | Poor | Good |
| Comparative Example 5 | Comparative Compound 5 | 4.5 | Poor | Poor | Poor | Good |
| Comparative Example 6 | Comparative Compound 6 | 4.5 | Poor | Poor | Poor | Good |
| Comparative Example 7 | Comparative Compound 7 | 4.5 | Poor | Good | Good | Good |
| Comparative Example 8 | Comparative Compound 8 | 4.5 | Poor | Good | Good | Good |
| Comparative Example 9 | Comparative Compound 9 | 4.5 | Poor | Good | Good | Good |
| Comparative Example 10 | Comparative Compound 10 | 4.5 | Poor | Good | Good | Good |

TABLE 5

|  | Comparative Compound | Pattern Adhesion | | | | Residue |
|---|---|---|---|---|---|---|
|  |  | 2 μm | 5 μm | 10 μm | 20 μm |  |
| Comparative Example 1 | Comparative Compound 1 | None | None | None | Good | None |
| Comparative Example 2 | Comparative Compound 2 | None | None | None | Good | None |
| Comparative Example 3 | Comparative Compound 3 | None | None | Good | Good | Existing |
| Comparative Example 4 | Comparative Compound 4 | None | None | None | None | None |
| Comparative Example 5 | Comparative Compound 5 | None | None | None | None | None |
| Comparative Example 6 | Comparative Compound 6 | None | None | None | None | Existing |
| Comparative Example 7 | Comparative Compound 7 | None | None | Good | Good | None |
| Comparative Example 8 | Comparative Compound 8 | None | None | Good | Good | None |
| Comparative Example 9 | Comparative Compound 9 | None | None | Good | Good | None |
| Comparative Example 10 | Comparative Compound 10 | None | None | Good | Good | None |

As can be understood from Tables 2 and 3, in the case where the negative-type photosensitive resin compositions of Examples 1 to 20 containing Compounds 1 to 20 represented by the formula (1) were used, it was possible to form a line pattern excellent in straightness even at a low light exposure of 20 mJ/cm$^2$. Also, a 2-μm line pattern was in close contact with the substrate even at a low light exposure of 10 mJ/cm$^2$. Further, in the case where the negative-type photosensitive resin compositions of Examples 1 to 20 were used, no development residue was present.

In contrast, in the case where the negative-type photosensitive resin compositions of Comparative Examples 1 to 10 containing Comparative Compounds 1 to 10 were used, as can be understood from Tables 4 and 5, both of the pattern straightness and the pattern adhesion were inferior to Examples 1 to 20, and a favorable micropatterning property was not attained.

Particularly, Comparative Compound 6 contained in the negative-type photosensitive resin composition of Comparative Example 6 is an amine-based silane coupling agent, which is known as an adhesion enhancer, but even a 20-μm line pattern failed to be in close contact with the substrate at a low light exposure of 10 mJ/cm$^2$.

Also, Comparative Compounds 7 to 10 contained in the photosensitive resin compositions of Comparative Examples 7 to 10 are ones in which a hydroxyl group is bonded to the ortho position of the benzene ring of Compounds 1 to 4, and only a line pattern having an inferior straightness was formed at a low light exposure of 20 mJ/cm$^2$.

Also, only line patterns having the width of 10 μm or more were in close contact with the substrate at a low light exposure of 10 mJ/cm$^2$.

Example 21

All of the following components were mixed and then dissolved in a mixed solvent with a mass ratio of 3-methoxybutyl acetate (MA)/propylene glycol monomethyl ether acetate (PM)/cyclohexane (AN)=60/20/20 to prepare a negative-type photosensitive resin composition having a solid content concentration of 15 mass %.
Alkali-Soluble Resin
Resin (A-2) (glycidyl methacrylate/methacrylic acid/tricyclodecyl methacrylate=72/18/10 (mass ratio), mass average molecular weight 14000): 66 parts by mass.
Photopolymerizable Monomer
Dipentaerythritol hexaacrylate (DPHA): 33 parts by mass
Photopolymerization Initiator
"OXE-02" (trade name: manufactured by BASF Corporation): 2 parts by mass
Compound Represented by the Formula (1)
Compound 1 described above: 1 part by mass Examples 22 to 40 and Comparative Examples 11 to 20

Negative-type photosensitive resin compositions were prepared in the same manner as Example 21, except that Compounds 2 to 20 and Comparative Compounds 1 to 10 described above, respectively, were used instead of Compound 1.
Evaluation The negative-type photosensitive resin compositions of Examples 21 to 40 and Comparative Examples 11 to 20 were coated onto a glass plate (100 mm×100 mm) using a spin coater, pre-baking was carried out for 120 seconds at 90° C., and coating films with a film thickness of 1.0 μm were formed. Next, using a mirror projection aligner (product name: TME-150RTO, manufactured by Topcon Corporation), with an exposure gap of 50 μm, the coating film was irradiated with ultraviolet rays, via a negative mask in which a 20-μm line pattern was formed. The light exposures were set to four levels of 20, 40, 60 and 120 mJ/cm$^2$. The coating film after the exposure was developed in a 0.04-mass % KOH aqueous solution at 26° C. for 40 seconds and then was post-baked at 230° C. for 30 minutes, thereby forming a line pattern.

In the same way, the coating film was irradiated with ultraviolet rays via negative masks in each of which a 2-, 5-, 10-, or 20-μm line pattern was formed, at an exposure gap of 50 μm. The light exposure was set to 20 mJ/cm$^2$. The coating film after the exposure was developed in a 0.04-mass % KOH aqueous solution at 26° C. for 40 seconds and then was post-baked at 230° C. for 30 minutes, thereby forming a line pattern.

The formed line pattern was observed with an optical microscope to evaluate the pattern straightness. The pattern straightness was evaluated as "good" if there were no curves or irregularities on the line edges, and as "poor" if there were curves or irregularities.

Further, pattern adhesion was evaluated by observing the line pattern with an optical microscope. The pattern adhesion was evaluated as "good" if the line pattern was formed without detachment from the substrate, and as "none" if the line pattern was not formed due to detachment from the substrate.

Further, the existence of residues in the unexposed portions after the development was evaluated.

The results are shown in Tables 6 to 9 below.

TABLE 6

|  |  | Pattern Straightness | | | | |
|---|---|---|---|---|---|---|
|  | Compound of Formula (1) | 20 mJ | 40 mJ | 60 mJ | 120 mJ | Residue |
| Example 21 | Compound 1 | Good | Good | Good | Good | None |
| Example 22 | Compound 2 | Good | Good | Good | Good | None |
| Example 23 | Compound 3 | Good | Good | Good | Good | None |
| Example 24 | Compound 4 | Good | Good | Good | Good | None |
| Example 25 | Compound 5 | Good | Good | Good | Good | None |
| Example 26 | Compound 6 | Good | Good | Good | Good | None |
| Example 27 | Compound 7 | Good | Good | Good | Good | None |

TABLE 6-continued

|  | Compound of Formula (1) | Pattern Straightness | | | | Residue |
|---|---|---|---|---|---|---|
|  |  | 20 mJ | 40 mJ | 60 mJ | 120 mJ |  |
| Example 28 | Compound 8 | Good | Good | Good | Good | None |
| Example 29 | Compound 9 | Good | Good | Good | Good | None |
| Example 30 | Compound 10 | Good | Good | Good | Good | None |
| Example 31 | Compound 11 | Good | Good | Good | Good | None |
| Example 32 | Compound 12 | Good | Good | Good | Good | None |
| Example 33 | Compound 13 | Good | Good | Good | Good | None |
| Example 34 | Compound 14 | Good | Good | Good | Good | None |
| Example 35 | Compound 15 | Good | Good | Good | Good | None |
| Example 36 | Compound 16 | Good | Good | Good | Good | None |
| Example 37 | Compound 17 | Good | Good | Good | Good | None |
| Example 38 | Compound 18 | Good | Good | Good | Good | None |
| Example 39 | Compound 15 | Good | Good | Good | Good | None |
| Example 40 | Compound 20 | Good | Good | Good | Good | None |

TABLE 7

|  | Compound of Formula (1) | Pattern Adhesion | | | |
|---|---|---|---|---|---|
|  |  | 2 μm | 5 μm | 10 μm | 20 μm |
| Example 21 | Compound 1 | None | Good | Good | Good |
| Example 22 | Compound 2 | None | Good | Good | Good |
| Example 23 | Compound 3 | None | Good | Good | Good |
| Example 24 | Compound 4 | None | Good | Good | Good |
| Example 25 | Compound 5 | None | Good | Good | Good |
| Example 26 | Compound 6 | None | Good | Good | Good |
| Example 27 | Compound 7 | None | Good | Good | Good |
| Example 28 | Compound 8 | None | Good | Good | Good |
| Example 29 | Compound 9 | None | Good | Good | Good |
| Example 30 | Compound 10 | None | Good | Good | Good |
| Example 31 | Compound 11 | None | Good | Good | Good |
| Example 32 | Compound 12 | None | Good | Good | Good |
| Example 33 | Compound 13 | None | Good | Good | Good |
| Example 34 | Compound 14 | None | Good | Good | Good |
| Example 35 | Compound 15 | None | Good | Good | Good |
| Example 36 | Compound 16 | None | Good | Good | Good |
| Example 37 | Compound 17 | None | Good | Good | Good |
| Example 38 | Compound 18 | None | Good | Good | Good |
| Example 39 | Compound 19 | None | Good | Good | Good |
| Example 40 | Compound 20 | None | Good | Good | Good |

TABLE 8

|  | Comparative Compound | Pattern Straightness | | | | Residue |
|---|---|---|---|---|---|---|
|  |  | 20 mJ | 40 mJ | 60 mJ | 120 mJ |  |
| Comparative Example 11 | Comparative Compound 1 | Poor | Poor | Good | Good | None |
| Comparative Example 12 | Comparative Compound 2 | Poor | Poor | Good | Good | None |
| Comparative Example 13 | Comparative Compound 3 | Poor | Good | Good | Good | Exising |
| Comparative Example 14 | Comparative Compound 4 | Poor | Poor | Poor | Good | None |
| Comparative Example 15 | Comparative Compound 5 | Poor | Poor | Poor | Good | None |
| Comparative Example 16 | Comparative Compound 6 | Poor | Poor | Poor | Good | Exising |
| Comparative Example 17 | Comparative Compound 7 | Poor | Good | Good | Good | None |
| Comparative Example 18 | Comparative Compound 8 | Poor | Good | Good | Good | None |
| Comparative Example 19 | Comparative Compound 9 | Poor | Good | Good | Good | None |
| Comparative Example 20 | Comparative Compound 10 | Poor | Good | Good | Good | None |

TABLE 9

|  | Comparative Compound | Pattern Adhesion | | | |
|---|---|---|---|---|---|
|  |  | 2 μm | 5 μm | 10 μm | 20 μm |
| Comparative Example 11 | Comparative Compound 1 | None | None | None | None |
| Comparative Example 12 | Comparative Compound 2 | None | None | None | None |
| Comparative Example 13 | Comparative Compound 3 | None | None | None | Good |
| Comparative Example 14 | Comparative Compound 4 | None | None | None | None |
| Comparative Example 15 | Comparative Compound 5 | None | None | None | None |
| Comparative Example 16 | Comparative Compound 6 | None | None | None | None |
| Comparative Example 17 | Comparative Compound 7 | None | None | None | Good |
| Comparative Example 18 | Comparative Compound 8 | None | None | Good | Good |
| Comparative Example 19 | Comparative Compound 9 | None | None | Good | Good |
| Comparative Example 20 | Comparative Compound 10 | None | None | None | Good |

As can be understood from Tables 6 and 7, in the case where the negative-type photosensitive resin compositions of Examples 21 to 40 containing Compounds 1 to 20 represented by the formula (1) were used, it was possible to form a line pattern excellent in straightness even at a low light exposure of 20 mJ/cm². Further, a 5-μm line pattern was in close contact with the substrate even at a low light exposure of 20 mJ/cm². Furthermore, in the case where the negative-type photosensitive resin compositions of Examples 21 to 40 were used, no development residue was present.

In contrast, in the case where the negative-type photosensitive resin compositions of Comparative Examples 11 to 20 containing Comparative Compounds 1 to 10 were used, as can be understood from Tables 8 and 9, both of the pattern straightness and the pattern adhesion were inferior to Examples 21 to 40, and a favorable micropatterning property was not attained.

Particularly, Comparative Compound 6 contained in the negative-type photosensitive resin composition of Comparative Example 16 is an amine-based silane coupling agent, which is known as an adhesion enhancer, but even a 20-μm line pattern failed to be contact with at a low light exposure of 20 mJ/cm².

Further, Comparative Compounds 7 to 10 contained in the negative-type photosensitive resin compositions of Comparative Examples 17 to 20 are ones in which a hydroxyl group is bonded to the ortho position of the benzene ring of Compounds 1 to 4, and only a line pattern having an inferior straightness was formed at a low light exposure of 20 mJ/cm².

Further, only line patterns having 10 μm or 20 μm or more were in close contact with the substrate at a low light exposure of 20 mJ/cm².

Example 41

A negative-type photosensitive resin composition was prepared by dissolving 50 parts by mass of poly p-hydroxystyrene (mass average molecular weight 2500), 50 parts by mass of a copolymer (mass average molecular weight 2500) of p-hydroxystyrene/styrene=85/15 (molar ratio), and 15 parts by mass of Nikalac MW-100LM (manufactured by Sanwa Chemical Co., Ltd.) which is a melamine resin, in 247 parts by mass of propylene glycol monomethyl ethyl acetate, and dissolving therein 15 parts by mass of α-(methylsulfonyloxyimino)-1-phenyl acetonitrile as photoacid generators and 3.0 parts by mass of 2,3,3',4,4',5'-hexahydroxybenzophenone, and further adding Compound 1 described above such that the solid content was 3 mass %.

Example 42

A negative-type photosensitive resin composition was prepared in the same way as Example 41, except that Compound 1 described above was added such that the solid content was 8 mass %.

Example 43

A negative-type photosensitive resin composition was prepared in the same way as Example 41, except for using Compound 3 described above instead of Compound 1 described above.

Example 44

A negative-type photosensitive resin composition was prepared in the same way as Example 43, except that Compound 3 described above was added such that the solid content was 8 mass %.

Example 45

A negative-type photosensitive resin composition was prepared in the same way as Example 41, except for using Compound 7 described above instead of Compound 1 described above.

Example 46

A negative-type photosensitive resin composition was prepared in the same way as Example 45, except that Compound 7 described above was added such that the solid content was 8 mass %.

Comparative Example 21

A negative-type photosensitive resin composition was prepared in the same way as Example 41, except that Compound 1 described above was not added.

Evaluation

The negative-type photosensitive resin compositions of Examples 41 to 46 and Comparative Example 21 were coated onto a 6 inch silicon substrate using a spinner, and dried for 90 seconds on a hot plate at 110° C., and coating films with a film thickness of 3.0 μm were thereby formed. Next, using a reducing-type projection exposing device (product name: NSR-2005i10D, manufactured by Nikon Corporation) the coating film was selectively irradiated with i-rays via negative masks in each of which a line pattern of 0.50, 0.55, 0.60, 0.65, or 0.70 μm was formed. The light exposure was set to 100 mJ/cm². After the coating film after the exposure was heated for 90 seconds at 110° C., a 65-second developing treatment was performed in a 2.38 wt % tetramethylammonium hydroxide aqueous solution, then after rinsing for 30 seconds in water, drying was performed.

The formed line pattern was observed with a scanning electron microscope (SEM), and the pattern adhesion was evaluated. The pattern adhesion was evaluated as "good" if the line was completely reproduced, and as "poor" if there was complete separation or partial separation, or if chip occurred.

Further, the line pattern was observed with a scanning electron microscope (SEM), and the pattern shape was evaluated. The pattern shape was evaluated as "good" if rectangular patterns perpendicular to the substrate were formed, and as "poor" if a tapering phenomenon occurred at the upper portion of the pattern, or an undulation phenomenon occurred at the side face of the pattern.

Furthermore, the existence of residues in the unexposed portions after the development was evaluated.

The results are shown in Tables 10 and 11 below.

TABLE 10

| | Compound of Formula (1)/ Comparative Compound | Pattern Adhesion | | | | | |
|---|---|---|---|---|---|---|---|
| | | 0.50 μm | 0.55 μm | 0.60 μm | 0.65 μm | 0.70 μm | Residue |
| Example 41 | Compound 1 (3 wt %) | Poor | Good | Good | Good | Good | None |
| Example 42 | Compound 1 (8 wt %) | Good | Good | Good | Good | Good | None |
| Example 43 | Compound 3 (3 wt %) | Poor | Good | Good | Good | Good | None |
| Example 44 | Compound 3 (8 wt %) | Good | Good | Good | Good | Good | None |
| Example 45 | Compound 7 (3 wt %) | Poor | Good | Good | Good | Good | None |
| Example 46 | Compound 7 (8 wt %) | Good | Good | Good | Good | Good | None |
| Comparative Example 21 | — | Poor | Poor | Good | Good | Good | None |

TABLE 11

| | Compound of Formula (1)/ Comparative Compound | Pattern Shape | | | | |
|---|---|---|---|---|---|---|
| | | 0.50 μm | 0.55 μm | 0.60 μm | 0.65 μm | 0.70 μm |
| Example 41 | Compound 1 (3 wt %) | Poor | Good | Good | Good | Good |
| Example 42 | Compound 1 (8 wt %) | Good | Good | Good | Good | Good |
| Example 43 | Compound 3 (3 wt %) | Poor | Good | Good | Good | Good |
| Example 44 | Compound 3 (8 wt %) | Good | Good | Good | Good | Good |
| Example 45 | Compound 7 (3 wt %) | Poor | Good | Good | Good | Good |
| Example 46 | Compound 7 (8 wt %) | Good | Good | Good | Good | Good |
| Comparative Example 21 | — | Poor | Poor | Good | Good | Good |

As can be understood from Tables 10 and 11, when using the negative-type photosensitive resin composition of Examples 41 to 46, where Compounds 1, 3, and 7 represented by the formula (1) were added, even at a low light exposure of 100 mJ/cm², a line pattern of 0.50 μm (for the case of an added amount of 8 mass %) or 0.55 μm (for the case of an added amount of 3 mass %) was in close contact with the substrate and moreover, had excellent pattern shape. Further, when using the negative-type photosensitive resin composition of Examples 41 to 46, no development residue was present.

In contrast, when using the negative-type photosensitive resin composition of Comparative Example 21 where the compound represented by the formula (1) was not added, both of the pattern adhesion and the pattern shape were inferior to Examples 41 to 46, and a favorable micropatterning property was not attained.

Example 47

In a three neck flask provided with a stirring device, a thermometer, and a nitrogen introduction tube, 35.0 g of photosensitive polyimide precursor, 50.0 g of N-methylpyrrolidone, and 0.1 g (0.08 mmol) of p-methoxyphenol were mixed with stirring and dissolved. Next, a photosensitive agent of 2.0 g (0.03 mmol) of 2,2'-bis(o-chlorophenyl)-4,4',5,5'-tetraphenylbiimidazole, 1.0 g (0.66 mmol) of 2-mercaptobenzooxazole, and 0.2 g (0.06 mmol) of ethyl Michler's ketone, and 7.0 g (3.1 mmol) of 1,6-hexanediol diacrylate as an addition polymerizable compound were added, and further Compound 1 described above was added such that the solid content was 3 mass %, and after stirring and dissolving for one whole day and night at room temperature, by passing through a filter, the negative-type photosensitive resin composition was prepared.

The synthesis method of the above photosensitive polyimide precursor is as follows.

1.30 g (0.010 mol) of 2-hydroxyethyl methacrylate was added to a stirred solution of 15.27 g (0.070 mol) of pyromellitic acid dianhydride in 100 ml of dehydrated N-methylpyrrolidone under dehydrated nitrogen. After stirring the solution at room temperature for 1 hr, and at 35° C. for 1 hr, it was cooled to room temperature. This reaction solution was added by dropping over 1 hour to a stirred solution of 8.49 g (0.040 mol) of 3,3'-dimethyl-4,4'-diaminobiphenyl and 0.25 g (0.001 mol) of 1,3-bis(3-aminopropyl)tetramethyldisiloxane in 100 ml of dehydrated N-methylpyrrolidone. After this, 26.82 g (0.130 mol) of an N,N-dicyclohexylcarbodiimide solution in 100 ml of dehydrated N-methylpyrrolidone was added by dropping over 30 minutes to the reaction solution while stirring. To this reaction solution, 45.55 g (0.35 mol) of 2-hydroxyethyl methacrylate was added, and stirring was performed for 5 hours at 50° C. and overnight at room temperature. This reaction mixture was diluted with 50 ml of acetone, undesired substances were eliminated by suction filtration, and the filtrate was processed by intense stirring in 2.0 l of ion exchanged water. The deposited solid was washed with ion exchanged water, further washed with methanol, suction dried on a filter, and dried under reduced pressure at room temperature until its moisture content ratio was less than 1.0 mass %, to obtain the photosenstive polyimide precursor.

Example 48

A negative-type photosensitive resin composition was prepared in the same way as in Example 47, except that Compound 1 described above was added such that the solid content was 8 mass %.

Example 49

A negative-type photosensitive resin composition was prepared in the same way as in Example 47, except that Compound 3 described above was used instead of Compound 1 described above.

Example 50

A negative-type photosensitive resin composition was prepared in the same way as in Example 49, except that Compound 3 described above was added such that the solid content was 8 mass %.

Example 51

A negative-type photosensitive resin composition was prepared in the same way as in Example 47, except that Compound 7 described above was used instead of Compound 1 described above.

Example 52

A negative-type photosensitive resin composition was prepared in the same way as in Example 51, except that Compound 7 described above was added such that the solid content was 8 mass %.

Comparative Example 22

A negative-type photosensitive resin composition was prepared in the same way as in Example 47, except that Compound 1 described above was not added.

Evaluation

The negative-type photosensitive resin compositions of Examples 47 to 52 and Comparative Example 22 were spin coated onto a 6 inch silicon substrate and then dried, to form 5.0±1.0 μm coating films. Next, using a mirror projection aligner (product name: MPA-600FA, manufactured by Canon Inc.), ultraviolet rays were irradiated onto the coating films via negative masks in each of which a line pattern of 5.5, 6.0, 6.5, 7.0, and 8.0 μm was formed. The light exposure was set to 500 mJ/cm². Next, after leaving for 1 hr in a light-shielding box, heating was carried out for 60 seconds on a hot plate at 120° C. After this, using a 2.38 mass % tetramethylammonium hydroxide aqueous solution, puddle developing was carried out for 1.2 times the developing time necessary for eliminating the unexposed portions, and after rinsing with water, drying was performed.

The formed line pattern was observed with a scanning electron microscope (SEM), and the pattern adhesion was evaluated. The pattern adhesion was evaluated as "good" if the line was completely reproduced, and as "poor" if there was complete separation or partial separation, or if chip occurred.

Further, the line pattern was observed with a scanning electron microscope (SEM), and the pattern shape was evaluated. The pattern shape was evaluated as "good" if rectangular patterns perpendicular to the substrate were formed, and as "poor" if a tapering phenomenon occurred at the upper portion of the pattern, or an undulation phenomenon occurred at the side face of the pattern.

Furthermore, the existence of residues in the unexposed portions after the development was evaluated.

The results are shown in Tables 12 and 13 below.

TABLE 12

| | Compound of Formula (1)/ | Pattern Adhesion | | | | | |
|---|---|---|---|---|---|---|---|
| | Comparative Compound | 5.5 μm | 6.0 μm | 6.5 μm | 7.0 μm | 8.0 μm | Residue |
| Example 47 | Compound 1 (3 wt %) | Poor | Good | Good | Good | Good | None |
| Example 48 | Compound 1 (8 wt %) | Good | Good | Good | Good | Good | None |
| Example 49 | Compound 3 (3 wt %) | Poor | Good | Good | Good | Good | None |
| Example 50 | Compound 3 (8 wt %) | Good | Good | Good | Good | Good | None |

TABLE 12-continued

|  | Compound of Formula (1)/ | Pattern Adhesion | | | | | |
|---|---|---|---|---|---|---|---|
|  | Comparative Compound | 5.5 μm | 6.0 μm | 6.5 μm | 7.0 μm | 8.0 μm | Residue |
| Example 51 | Compound 7 (3 wt %) | Good | Good | Good | Good | Good | None |
| Example 52 | Compound 7 (8 wt %) | Good | Good | Good | Good | Good | None |
| Comparative Example 22 | — | Poor | Poor | Good | Good | Good | None |

TABLE 13

|  | Compound of Formula (1)/ | Pattern Shape | | | | |
|---|---|---|---|---|---|---|
|  | Comparative Compound | 5.5 μm | 6.0 μm | 6.5 μm | 7.0 μm | 8.0 μm |
| Example 47 | Compound 1 (3 wt %) | Poor | Good | Good | Good | Good |
| Example 48 | Compound 1 (8 wt %) | Good | Good | Good | Good | Good |
| Example 49 | Compound 3 (3 wt %) | Poor | Good | Good | Good | Good |
| Example 50 | Compound 3 (8 wt %) | Good | Good | Good | Good | Good |
| Example 51 | Compound 7 (3 wt %) | Good | Good | Good | Good | Good |
| Example 52 | Compound 7 (8 wt %) | Good | Good | Good | Good | Good |
| Comparative Example 22 | — | Poor | Poor | Good | Good | Good |

As can be understood from Tables 12 and 13, when using the negative-type photosensitive resin compositions of Examples 47 to 52, where Compounds 1, 3, and 7 represented by the formula (1) were added, a line pattern of 5.5 μm or a line pattern of 6.0 μm was in close contact with the substrate and moreover, had excellent pattern shape. Further, when using the negative-type photosensitive resin composition of Examples 47 to 52, no development residue was present.

In contrast, when using the negative-type photosensitive resin composition of Comparative Example 22 where the compound represented by the formula (1) was not added, both of the pattern adhesion and the pattern shape were inferior to Examples 47 to 52, and a favorable micropatterning property was not attained.

Example 53

100 parts by mass of polyimide precursor, 15 parts by mass of Compound 1 described above, and 843 parts by mass of N-methyl-2-pyrrolidone were mixed, to prepare a negative-type photosensitive resin composition.

The synthesis method of the above polyimide precursor is as follows.

10.0 g (50 mmol) of di(4-aminophenyl)ether was introduced into a 300-mL three neck flask and dissolved in 105.4 mL of dehydrated N,N-dimethylacetoamide (DMAc), under a nitrogen gas flow, and stirred while cooling in an ice bath. To this, 14.7 g (50 mmol) of 3,3',4,4'-biphenyltetracarboxylic acid dianhydride were gradually added, and after the addition was completed, stirring for 5 hours in an ice bath was performed, then this solution was subjected to reprecipitation with dehydrated ethyl ether, and the precipitate was dried for 17 hr under reduced pressure at room temperature, and a polyamic acid (polyimide precursor) with a mass average molecular weight of 10000 was quantitatively obtained as a white solid.

Examples 54 to 56 and Comparative Examples 23 to 25

Negative-type photosensitive resin compositions were prepared in the same way as in Example 53, except that Compounds 3, 7 and 13 and Comparative Compounds 11, 2, and 7 described above, respectively, were used instead of Compound 1 described above.

Evaluation

The negative-type photosensitive resin compositions of Examples 53 to 56 and Comparative Examples 23 to 25 were spin coated onto a chrome-plated glass substrate to a final film thickness of 4 μm, and dried for 10 minutes on a hot plate at 80° C. to obtain coating films. Next, using a mirror projection aligner (product name: MPA-600FA, manufactured by Canon Inc.), ultraviolet rays were irradiated onto the coating films via a negative mask in which a line pattern of 20 μm was formed. The light exposures were set to five levels of 100, 200, 300, 400, and 500 mJ/cm$^2$. After the coating films after the exposure were heated for 10 minutes on a hot plate at 140° C. (post-exposure heating), development was performed by immersing them in a mixed developing solution of a 9:1 volume ratio of a 2.38 mass % tetramethyl ammonium hydroxide aqueous solution and isopropanol, and by imidizing by post-baking for 1 hr at 350° C., a line pattern was formed.

The formed line pattern was observed with a scanning electron microscope (SEM), and the pattern forming property was evaluated. The pattern forming property was evaluated as "good" if the line was completely reproduced, and as "poor" if there was complete separation or partial separation, or if chip occurred.

Further, the line pattern was observed with an optical microscope, and the pattern straightness was evaluated. The pattern straightness was evaluated as "good" if there were no curves or irregularities on the line edges, and as "poor" if there were curves or irregularities.

Further, the existence of residues in the unexposed portions after the development was evaluated.

The results are shown in Tables 14 and 15 below.

TABLE 14

|  | Compound of Formula (1)/ | Pattern Forming Property | | | | | |
|---|---|---|---|---|---|---|---|
|  | Comparative Compound | 100 mJ | 200 mJ | 300 mJ | 400 mJ | 500 mJ | Residue |
| Example 53 | Compound 1 | Poor | Good | Good | Good | Good | None |
| Example 54 | Compound 3 | Good | Good | Good | Good | Good | None |
| Example 55 | Compound 7 | Good | Good | Good | Good | Good | None |
| Example 56 | Compound 13 | Good | Good | Good | Good | Good | None |
| Comparative Example 23 | Comparative Compound 11 | Poor | Poor | Poor | Good | Good | None |
| Comparative Example 24 | Comparative Compound 2 | Poor | Poor | Poor | Good | Good | None |
| Comparative Example 25 | Comparative Compound 7 | Poor | Poor | Poor | Good | Good | None |

TABLE 15

| Example | Compound of Formula (1)/ Comparative Compound | Pattern Straightness | | | | |
|---|---|---|---|---|---|---|
| | | 100 mJ | 200 mJ | 300 mJ | 400 mJ | 500 mJ |
| Example 53 | Compound 1 | Poor | Poor | Good | Good | Good |
| Example 54 | Compound 3 | Poor | Good | Good | Good | Good |
| Example 55 | Compound 7 | Good | Good | Good | Good | Good |
| Example 56 | Compound 13 | Poor | Good | Good | Good | Good |
| Comparative Example 23 | Comparative Compound 11 | Poor | Poor | Poor | Poor | Good |
| Comparative Example 24 | Comparative Compound 2 | Poor | Poor | Poor | Poor | Good |
| Comparative Example 25 | Comparative Compound 7 | Poor | Poor | Poor | Good | Good |

As can be understood from Tables 14 and 15, when using the negative-type photosensitive resin compositions of Examples 53 to 56 containing Compounds 1, 3, 7, and 13 represented by the formula (1), at a low light exposure of 200 mJ/cm² (for the case of Compounds 3, 7, and 13) or 300 mJ/cm² (for the case of Compound 1), a line pattern of 20 μm having excellent straightness could be formed. Further, when using the negative-type photosensitive resin compositions of Examples 53 to 57, no development residue was present.

In contrast, when using the negative-type photosensitive resin compositions of Comparative Example 23 to 25 not including the compound represented by the formula (1), both of the pattern forming property and the pattern straightness were inferior to Examples 53 to 56, and a favorable micro-patterning property was not attained.

For reference, a line pattern was formed in the same way as described above, except that the heating for 10 minutes on a hot plate at 140° C. (post-exposure heating) was not carried out, and the pattern forming property, pattern straightness, and existence of residues were evaluated. The results are shown in Tables 16 and 17 below.

TABLE 16

| Example | Compound of Formula (1)/ Comparative Compound | Pattern Forming Property | | | | | |
|---|---|---|---|---|---|---|---|
| | | 100 mJ | 200 mJ | 300 mJ | 400 mJ | 500 mJ | Residue |
| Example 53 | Compound 1 | Poor | Poor | Poor | Poor | Good | None |
| Example 54 | Compound 3 | Poor | Poor | Poor | Good | Good | None |
| Example 55 | Compound 7 | Poor | Poor | Good | Good | Good | None |
| Example 56 | Compound 13 | Poor | Poor | Poor | Good | Good | None |
| Comparative Example 23 | Comparative Compound 11 | Poor | Poor | Poor | Poor | Poor | None |
| Comparative Example 24 | Comparative Compound 2 | Poor | Poor | Poor | Poor | Poor | None |
| Comparative Example 25 | Comparative Compound 7 | Poor | Poor | Poor | Poor | Poor | None |

TABLE 17

| Example | Compound of Formula (1)/ Comparative Compound | Pattern Straightness | | | | |
|---|---|---|---|---|---|---|
| | | 100 mJ | 200 mJ | 300 mJ | 400 mJ | 500 mJ |
| Example 53 | Compound 1 | Poor | Poor | Poor | Poor | Good |
| Example 54 | Compound 3 | Poor | Poor | Poor | Good | Good |
| Example 55 | Compound 7 | Poor | Poor | Good | Good | Good |
| Example 56 | Compound 13 | Poor | Poor | Poor | Poor | Good |
| Comparative Example 23 | Comparative Compound 11 | Poor | Poor | Poor | Poor | Good |
| Comparative Example 24 | Comparative Compound 2 | Poor | Poor | Poor | Poor | Good |
| Comparative Example 25 | Comparative Compound 7 | Poor | Poor | Poor | Good | Good |

As can be understood from Tables 16 and 17, when using the negative-type photosensitive resin compositions of Examples 53 to 56 containing Compounds 1, 3, 7, and 13 represented by the formula (1), at a light exposure of 500 mJ/cm², even without post-exposure heating, a line pattern of 20 μm having excellent straightness could be formed. Further, when using the negative-type photosensitive resin composition of Examples 53 to 56, no development residue was present.

In contrast, when using the negative-type photosensitive resin compositions of Comparative Examples 23 to 25 not including the compound represented by the formula (1), both of the pattern forming property and the pattern straightness were inferior to Examples 53 to 56, and a favorable micro-patterning property was not attained.

Example 57

A negative-type photosensitive resin composition was prepared by mixing 100 parts by mass of epoxy resin (YP50EK35 (phenoxy resin), 35 mass % methyl ethyl ketone solution, manufactured by Nippon Steel Chemical Co., Ltd.), and 10 parts by mass of Compound 1 described above.

Examples 58 to 60 and Comparative Examples 26 to 28

Negative-type photosensitive resin compositions were prepared in the same way as in Example 57, except that Compounds 3, 7 and 13 and Comparative Compounds 11, 2, and 7 described above, respectively, were used instead of Compound 1 described above.

Evaluation

The negative-type photosensitive resin compositions of Examples 57 to 60 and Comparative Examples 26 to 28 were spin coated onto a glass substrate to a final film thickness of 0.5 μm, and dried for 15 minutes on a hot plate at 80° C. to obtain coating films. Next, using a mirror projection aligner (product name: MPA-600FA, manufactured by Canon Inc.), ultraviolet rays were irradiated onto the coating films via a negative mask in which a line pattern of 20 μm was formed. The light exposures were set to five levels of 60, 70, 80, 90, and 100 mJ/cm². After the coating films after the exposure were heated for 30 minutes on a hot plate at 150° C. (post-exposure heating), development was performed by immersing them in a mixed developing solution of a 4:1 volume ratio of isopropanol and chloroform, and a line pattern was formed.

The formed line pattern was observed with a scanning electron microscope (SEM), and the pattern forming property was evaluated. The pattern forming property was evaluated as "good" if the line was completely reproduced, and as "poor" if there was complete separation or partial separation, or if chip occurred.

Further, the line pattern was observed with an optical microscope, and the pattern straightness was evaluated. The pattern straightness was evaluated as "good" if there were no curves or irregularities on the line edges, and as "poor" if there were curves or irregularities.

Further, the existence of residues in the unexposed portions after the development was evaluated.

The results are shown in Tables 18 and 19 below.

TABLE 18

| | Compound of Formula (1)/ Comparative Compound | Pattern Forming Property | | | | | |
|---|---|---|---|---|---|---|---|
| | | 60 mJ | 70 mJ | 80 mJ | 90 mJ | 100 mJ | Residue |
| Example 57 | Compound 1 | Poor | Good | Good | Good | Good | None |
| Example 58 | Compound 3 | Poor | Good | Good | Good | Good | None |
| Example 59 | Compound 7 | Good | Good | Good | Good | Good | None |
| Example 60 | Compound 13 | Poor | Good | Good | Good | Good | None |
| Comparative Example 26 | Comparative Compound 11 | Poor | Poor | Poor | Poor | Good | None |
| Comparative Example 27 | Comparative Compound 2 | Poor | Poor | Poor | Poor | Good | None |
| Comparative Example 28 | Comparative Compound 7 | Poor | Poor | Poor | Good | Good | None |

TABLE 19

| | Compound of Formula (1)/ Comparative Compound | Pattern Straightness | | | | |
|---|---|---|---|---|---|---|
| | | 60 mJ | 70 mJ | 80 mJ | 90 mJ | 100 mJ |
| Example 57 | Compound 1 | Poor | Poor | Good | Good | Good |
| Example 58 | Compound 3 | Poor | Good | Good | Good | Good |
| Example 59 | Compound 7 | Good | Good | Good | Good | Good |
| Example 60 | Compound 13 | Poor | Good | Good | Good | Good |
| Comparative Example 26 | Comparative Compound 11 | Poor | Poor | Poor | Poor | Good |
| Comparative Example 27 | Comparative Compound 2 | Poor | Poor | Poor | Poor | Good |
| Comparative Example 28 | Comparative Compound 7 | Poor | Poor | Poor | Good | Good |

As can be understood from Tables 18 and 19, when using the negative-type photosensitive resin composition of Examples 57 to 60 containing Compounds 1, 3, 7, and 13 represented by the formula (1), at a low light exposure of 60 mJ/cm$^2$ (for the case of Compound 7), 70 mJ/cm$^2$ (for the case of Compounds 3 and 13), or 80 mJ/cm$^2$ (for the case of Compound 1), a line pattern of 20 μm having excellent straightness could be formed. Further, when using the negative-type photosensitive resin composition of Examples 57 to 60, no development residue was present.

In contrast, when using the negative-type photosensitive resin compositions of Comparative Examples 26 to 28 not including the compound represented by the formula (1), both of the pattern forming property and the pattern straightness were inferior to Examples 57 to 60, and a favorable micro-patterning property was not attained.

Example 61

All of the following components (parts by mass, in terms of the solid content) were kneaded in a triple roll mill, and a negative-type photosensitive resin composition was prepared.

Epoxy Group-Containing Polycarboxylic Acid Resin
Resin (F-1): 58.3 parts by mass
Photoacid Generator
"PCI-220" (product name; manufactured by Nippon Kayaku Co., Ltd.): 4.2 parts by mass
Compound Represented by the Formula (1)
Compound 1 described above: 4 parts by mass
Sensitizers
2-ethyl-9,10-dimethoxyanthracene: 0.4 parts by mass
Modifying Components
"YX-4000" (product name; manufactured by Yuka Shell Epoxy Co., epoxy compound): 25.1 parts by mass
"Cymel 300" (product name; manufactured by Nihon Cytec Industries Inc., melamine resin): 11.7 parts by mass
Fillers
"Silbond 800 EST" (product name; manufactured by Shiraishi Calcium Co., Ltd., surface processed spherical silica): 25.0 parts by mass
"B-30" (product name; manufactured by Sakai Chemical Industry Co., Ltd., barium sulfate): 25.0 parts by mass●
"SG-2000" (product name; manufactured by Nippon Talc Co., Ltd., talc): 5.8 parts by mass
Additives
"Heliogen Green" (product name; manufactured by Yamamoto Trading Co., Ltd., pigment): 1.4 parts by mass
"BYK-354" (product name; manufactured by BYK Chemie, leveling agent): 1.6 parts by mass
"BYK-057" (product name; manufactured by BYK Chemie, anti-foaming agent): 1.6 parts by mass The synthesis method of the above resin (F-1) is as follows.

211.1 g of an epoxy resin (manufactured by Nippon Kayaku Co., Ltd., NC-3000PL, epoxy equivalent 274, softening point 57.3° C.) obtained from the reaction of biphenyl dimethylene-hydroxyphenylene and epichlorohydrin, 72.4 g of dimethylol propionic acid, 70.9 g of carbitol acetate, and 0.71 g of triphenylphosphine were charged, heated to 100° C., and reacted until the acid value of the reaction solution was 1 mg KOH/g or less. The reaction time was 24 hr. Next, 0.51 g of Percumyl H80 (manufactured by NOF, peroxide) was charged to this reaction solution, stirring was performed for about 2 hr, and the triphenylphosphine which is the reaction catalyst was oxidized and deactivated.

After this, 66.4 g of tetrahydro phthalic anhydride and 117.6 g of carbitol acetate were charged, reacted for 4 hr at 95° C., and the resin (F-1) was obtained.

The acid value of the resin (F-1) was 70 mg KOH/g.

Examples 62 to 64

Negative-type photosensitive resin compositions were prepared in the same way as in Example 61, except that Compounds 3, 7 and 13 described above, respectively, were used instead of Compound 1 described above.

Comparative Example 29

A negative-type photosensitive resin composition was prepared in the same way as in Example 61, except that Compound 1 described above was not included.

Comparative Example 30

A negative-type photosensitive resin composition was prepared in the same way as in Comparative Example 29, except that the content of the resin (F-1) was 57.9 parts by mass, the content of 2-ethyl-9,10-dimethoxyanthracene was 0.8 parts by mass, and the content of "Cymel 300" was 11.6 parts by mass.

Comparative Example 31

A negative-type photosensitive resin composition was prepared in the same way as in Comparative Example 29, except that the content of the resin (F-1) was 57.0 parts by mass, the content of "PCI-220" was 4.1 parts by mass, the content of 2-ethyl-9,10-dimethoxyanthracene was 2.1 parts by mass, and the content of "Cymel 300" was 11.4 parts by mass.

Evaluation

The negative-type photosensitive resin compositions of Examples 61 to 64 and Comparative Examples 29 to 31 were applied to the whole surface of a copper-clad laminate on which a pattern was formed, to a thickness of 25 μm, by a screen printing method using a 100 mesh stainless screen, and the coating film was dried for 30 minutes in a hot air dryer at 80° C. Next, quartz masks in each of which a line pattern of 35 μm, 40 μm, 45 μm, 50 μm, or 60 μm was formed were in close contact with the coating films, and the coating films were irradiated with ultraviolet rays using an ultraviolet exposure device (product name: EXM-1066, manufactured by ORC Manufacturing Co., Ltd.). The light exposure was set to 500 mJ/cm$^2$. Next, after post-exposure baking in a hot air dryer, development was performed for 60 seconds with a 1% sodium carbonate aqueous solution at 25° C., at a spray pressure of 2 kg/cm$^2$, and the unexposed portions were dissolved and removed. After this, heat curing was carried out for 60 minutes in a hot air dryer at 150° C.

The formed line pattern was observed with a scanning electron microscope (SEM), and the pattern adhesion was evaluated. The pattern adhesion was evaluated as "good" if the line was completely reproduced, and as "poor" if there was complete separation or partial separation, or if chip occurred.

Further, the line pattern was observed with a scanning electron microscope (SEM), and the pattern shape was evaluated. The pattern shape was evaluated as "good" if the pattern shape was a rectangular form, and if there was no tapering or erosion due to development, and as "poor" if there was tapering or erosion due to development.

Further, the existence of residues in the unexposed portions after the development was evaluated.

The results are shown in Tables 20 and 21 below.

TABLE 20

| | Compound of Formula (1)/ | Pattern Adhesion | | | | | |
|---|---|---|---|---|---|---|---|
| | Comparative Compound | 35 μm | 40 μm | 45 μm | 50 μm | 60 μm | Residue |
| Example 61 | Compound 1 | Poor | Good | Good | Good | Good | None |
| Example 62 | Compound 3 | Good | Good | Good | Good | Good | None |
| Example 63 | Compound 7 | Poor | Good | Good | Good | Good | None |
| Example 64 | Compound 13 | Good | Good | Good | Good | Good | None |
| Comparative Example 29 | — | Poor | Poor | Poor | Good | Good | None |
| Comparative Example 30 | — | Poor | Poor | Poor | Good | Good | None |
| Comparative Example 31 | — | Poor | Poor | Poor | Good | Good | None |

TABLE 21

| | Compound of Formula (1)/ | Pattern Shape | | | | |
|---|---|---|---|---|---|---|
| | Comparative Compound | 35 μm | 40 μm | 45 μm | 50 μm | 60 μm |
| Example 61 | Compound 1 | Poor | Good | Good | Good | Good |
| Example 62 | Compound 3 | Good | Good | Good | Good | Good |
| Example 63 | Compound 7 | Poor | Good | Good | Good | Good |
| Example 64 | Compound 13 | Poor | Good | Good | Good | Good |
| Comparative Example 29 | — | Poor | Poor | Poor | Good | Good |
| Comparative Example 30 | — | Poor | Poor | Poor | Good | Good |
| Comparative Example 31 | — | Poor | Poor | Poor | Good | Good |

As can be understood from Tables 20 and 21, when using the negative-type photosensitive resin compositions of Examples 61 to 64 including Compounds 1, 3, 7, and 13 represented by the formula (1), a line pattern of 35 μm or a line pattern of 40 μm was in close contact with the substrate and moreover, had excellent pattern shape. Further, when using the negative-type photosensitive resin compositions of Examples 61 to 64, no development residue was present.

In contrast, when using the negative-type photosensitive resin compositions of Comparative Examples 29 to 31 not including the compound represented by the formula (1), both of the pattern adhesion and the pattern shape were inferior to Examples 61 to 64, and a favorable micropatterning property was not attained.

Example 65

All of the following components were mixed and dissolved in a mixed solution of 3-methoxybutyl acetate (MA)/cyclohexanone (AN)/propylene glycol monomethyl ether acetate (PM)=20/70/10 (mass ratio), and a resin composition with a solid content concentration of 20 mass % was prepared.

Alkali-Soluble Resin
The above resin (A-1): 4.2 parts by mass
Compound Represented by the Formula (1)
Compound 3 described above: 0.57 parts by mass Example 66

The resin compositions were prepared in the same way as in Example 65, except that the content of Compound 3 described above was 0.285 parts by mass, and 1-[9-ethyl-6-(2-methylbenzoyl)-9.H.-carbazole-3-yl]-ethane-1-one oxime-β-acetate (product name: Irgacure OXE 02, BASF) was added as a photopolymerization initiator in an amount of 0.285 parts by mass.

Examples 67 and 68

The resin compositions were prepared in the same way as in Examples 65 and 66, except that resin (A-3) (mass average molecular weight 4000, dispersity 1.6) obtained by reacting a copolymer of benzylmethacrylate/acrylic acid=45/55 (mass ratio) with 15 mass % of 3,4-epoxycyclohexyl methacrylate was used instead of the above resin (A-1).

Comparative Examples 32 to 35

Resin compositions were prepared in the same way as in Examples 65 to 68 except that Compound 3 described above was not included.

Evaluation

Coating films were formed with a film thickness of 2.0 μm by coating the resin compositions of Examples 65 to 68 and Comparative Examples 32 to 35 onto a glass substrate (manufactured by Corning Inc., Eagle-XG) using a spin coater, and baking for 120 seconds at 100° C. or 130° C. on a hot plate. Next, the coating films were immersed in a 2.38 mass % tetramethylammonium hydroxyde aqueous solution, and the time until the coating films were dissolved and removed was measured.

The results are shown in Table 22 below.

TABLE 22

| | Compound of Formula (1)/ Comparative Compound | dissolution time at 100° C. baking (sec) | dissolution time at 130° C. baking (sec) |
|---|---|---|---|
| Example 65 | Compound 3 | 45 | 150 |
| Example 66 | Compound 3 | 48 | 160 |
| Example 67 | Compound 3 | 15 | 110 |
| Example 68 | Compound 3 | 17 | 125 |
| Comparative Example 32 | — | 40 | 40 |
| Comparative Example 33 | — | 43 | 44 |
| Comparative Example 34 | — | 13 | 13 |
| Comparative Example 35 | — | 15 | 15 |

As can be understood from Table 22, when using the resin compositions of Examples 65 to 68 including Compound 3 represented by the formula (1), by baking at 130° C. the solubility in the developing solution was reduced, and the dissolution time was greatly increased. Namely, the resin compositions of Examples 65 to 68 have negative-type properties.

In contrast, when using the resin compositions of Comparative Examples 32 to 35 not including the compound represented by the formula (1), it could not be deemed that there was a change in the dissolution time between the case of baking at 100° C. and the case of baking at 130° C.

The invention claimed is:

1. A negative-type photosensitive resin composition comprising a compound represented by the following formula (1),

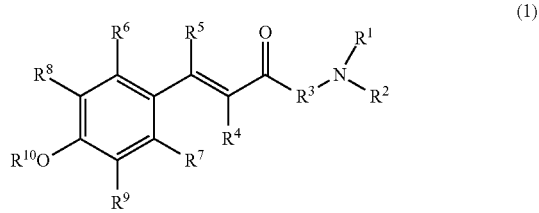

(1)

wherein $R^1$ and $R^2$ each independently represents a hydrogen atom or an organic group, provided that at least one of $R^1$ and $R^2$ represents an organic group;

$R^1$ and $R^2$ may be bonded to form a ring structure and may contain a hetero atom bond;

$R^3$ represents a single bond or an organic group;

$R^4$ and $R^5$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group;

$R^6$ and $R^7$ each independently represents a hydrogen atom, a halogen atom, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, an alkyl group, an alkenyl group, a cycloalkyl group, a cycloalkenyl group, an aryl group, or an aralkyl group, $R^8$ and $R^9$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group;

two or more of $R^6$, $R^7$, $R^8$, and $R^9$ may be bonded to form a ring structure and may contain a hetero atom bond; and $R^{10}$ represents an organic group.

2. The negative-type photosensitive resin composition according to claim 1, further comprising a resin selected from the group consisting of a resin having a cardo structure, a resin having a phenolic hydroxyl group, a polyimide resin, and an epoxy resin.

3. The negative-type photosensitive resin composition according to claim 1, further comprising an alkali-soluble resin, a photopolymerization initiator, and an organic solvent.

4. The negative-type photosensitive resin composition according to claim 3, further comprising a photopolymerizable monomer.

5. The negative-type photosensitive resin composition according to claim 3, further comprising a coloring agent.

6. A negative-type photosensitive resin composition according to claim 5, wherein the coloring agent is a light shielding agent.

7. A color filter formed using the negative-type photosensitive resin composition according to claim 5.

8. A display device provided with a color filter formed using the negative-type photosensitive resin composition according to claim 5.

9. A pattern forming method comprising forming a coating film or molded body using the negative-type photosensitive resin composition according claim 1, irradiating an electromagnetic wave in a predetermined pattern shape onto the coating film or molded body, and performing development.

10. A cured film formed using the negative-type photosensitive resin composition according to claim 1.

11. An insulating film formed using the negative-type photosensitive resin composition according to claim 1.

12. A display device provided with a cured or an insulating film formed using the negative-type photosensitive resin composition according to claim 1.

13. The negative-type photosensitive resin composition according to claim 1, wherein all of $R^6$, $R^7$, $R^8$ and $R^9$ are hydrogen atoms.

14. The negative-type photosensitive resin composition according to claim 1, wherein any one of $R^6$, $R^7$, $R^8$ and $R^9$ is a nitro group and the remaining three are each a hydrogen atom.

* * * * *